United States Patent
Yu et al.

(10) Patent No.: US 12,272,616 B2
(45) Date of Patent: Apr. 8, 2025

(54) HEAT-DISSIPATING STRUCTURES FOR SEMICONDUCTOR DEVICES AND METHODS OF MANUFACTURE

(71) Applicant: Taiwan Semiconductor Manufacturing Co., Ltd., Hsinchu (TW)

(72) Inventors: Chen-Hua Yu, Hsinchu (TW); Tung-Liang Shao, Hsinchu (TW); Yu-Sheng Huang, Hemei Township (TW); Shih-Chang Ku, Taipei (TW); Chuei-Tang Wang, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 386 days.

(21) Appl. No.: 17/701,468

(22) Filed: Mar. 22, 2022

(65) Prior Publication Data
US 2023/0187307 A1    Jun. 15, 2023

Related U.S. Application Data

(60) Provisional application No. 63/289,716, filed on Dec. 15, 2021.

(51) Int. Cl.
*H01L 23/373* (2006.01)
*H01L 23/00* (2006.01)
(Continued)

(52) U.S. Cl.
CPC ...... *H01L 23/3735* (2013.01); *H01L 23/3128* (2013.01); *H01L 23/367* (2013.01);
(Continued)

(58) Field of Classification Search
CPC ............ H01L 23/3735; H01L 23/3128; H01L 23/367; H01L 24/83; H01L 25/105;
(Continued)

(56) References Cited

U.S. PATENT DOCUMENTS

| 8,993,380 B2 | 3/2015 | Hou et al. |
| 9,281,254 B2 | 3/2016 | Yu et al. |

(Continued)

FOREIGN PATENT DOCUMENTS

| CN | 113517280 A | 10/2021 |
| CN | 113658944 A | 11/2021 |

(Continued)

*Primary Examiner* — Fernando L Toledo
*Assistant Examiner* — Neil R Prasad
(74) *Attorney, Agent, or Firm* — Slater Matsil, LLP

(57) ABSTRACT

Packaged semiconductor devices including heat-dissipating structures and methods of forming the same are disclosed. In an embodiment, a semiconductor package includes a semiconductor die including a substrate, a front-side interconnect structure on a front-side of the substrate, and a backside interconnect structure on a backside of the substrate opposite the front-side interconnect structure; a support die disposed on the front-side interconnect structure; a heat-dissipating structure on the support die, the heat-dissipating structure being thermally coupled to the semiconductor die and the support die; a redistribution structure on the backside interconnect structure opposite the substrate, the redistribution structure being electrically coupled to the semiconductor die; and an encapsulant on the redistribution structure and adjacent to side surfaces of the semiconductor die, the support die, and the heat-dissipating structure.

20 Claims, 86 Drawing Sheets

(51) Int. Cl.
*H01L 23/31* (2006.01)
*H01L 23/367* (2006.01)
*H01L 25/10* (2006.01)
*H01L 21/56* (2006.01)
*H01L 25/18* (2023.01)
*H01L 27/12* (2006.01)

(52) U.S. Cl.
CPC ............ *H01L 24/83* (2013.01); *H01L 25/105* (2013.01); *H01L 21/56* (2013.01); *H01L 24/20* (2013.01); *H01L 24/29* (2013.01); *H01L 24/32* (2013.01); *H01L 25/18* (2013.01); *H01L 27/12* (2013.01); *H01L 2224/2101* (2013.01); *H01L 2224/29186* (2013.01); *H01L 2224/32145* (2013.01); *H01L 2224/32225* (2013.01); *H01L 2224/83896* (2013.01); *H01L 2225/1035* (2013.01); *H01L 2225/1058* (2013.01); *H01L 2225/1094* (2013.01)

(58) Field of Classification Search
CPC ......... H01L 21/56; H01L 24/20; H01L 24/29; H01L 24/32; H01L 25/18; H01L 27/12; H01L 2224/2101; H01L 2224/29186; H01L 2224/32145; H01L 2224/32225; H01L 2224/83896; H01L 2225/1035; H01L 2225/1058; H01L 2225/1094
See application file for complete search history.

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 11,107,799 B1* | 8/2021 | Alapati ................. H01L 23/481 |
| 2014/0077394 A1* | 3/2014 | Chang ................. H01L 23/4334 257/782 |
| 2016/0379936 A1* | 12/2016 | Spitzlsperger .... H01L 29/41708 257/139 |
| 2017/0117254 A1 | 4/2017 | Hembree |
| 2017/0133351 A1* | 5/2017 | Su ....................... H01L 23/5389 |
| 2020/0203282 A1 | 6/2020 | Shih |
| 2021/0066154 A1 | 3/2021 | Kim et al. |
| 2021/0066242 A1 | 3/2021 | Yu et al. |
| 2021/0233851 A1 | 7/2021 | Chun |
| 2021/0408247 A1 | 12/2021 | Yu et al. |
| 2022/0028842 A1 | 1/2022 | Chang et al. |
| 2023/0005814 A1* | 1/2023 | Chung ............. H01L 23/49838 |

FOREIGN PATENT DOCUMENTS

| | | |
|---|---|---|
| KR | 102036762 B1 | 10/2019 |
| TW | I264096 B | 10/2006 |
| TW | 202025424 A | 7/2020 |
| TW | 202123397 A | 6/2021 |
| TW | 202139361 A | 10/2021 |

* cited by examiner

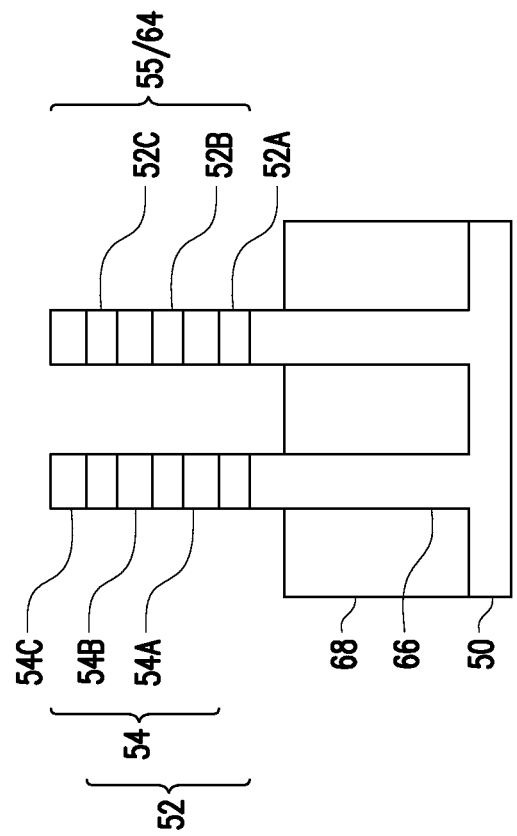
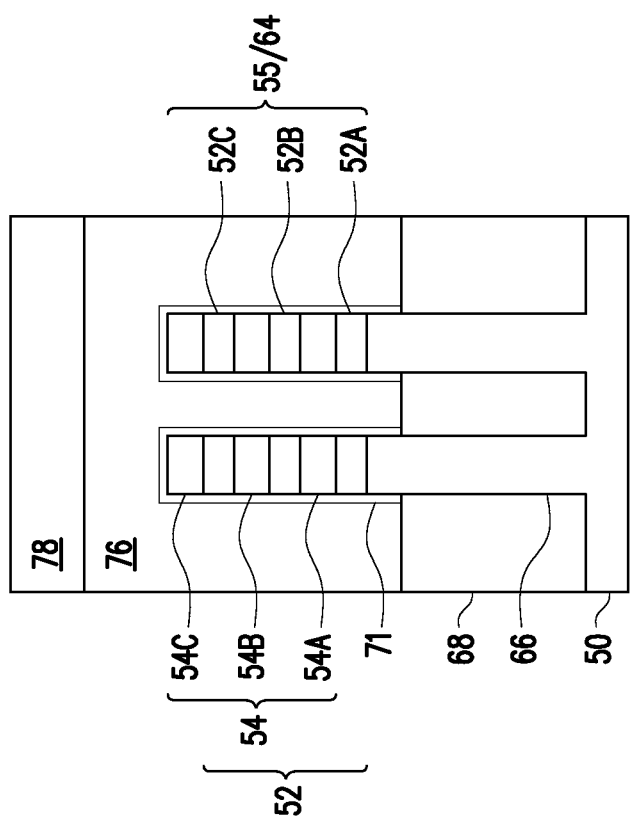
FIG. 6A
FIG. 6B

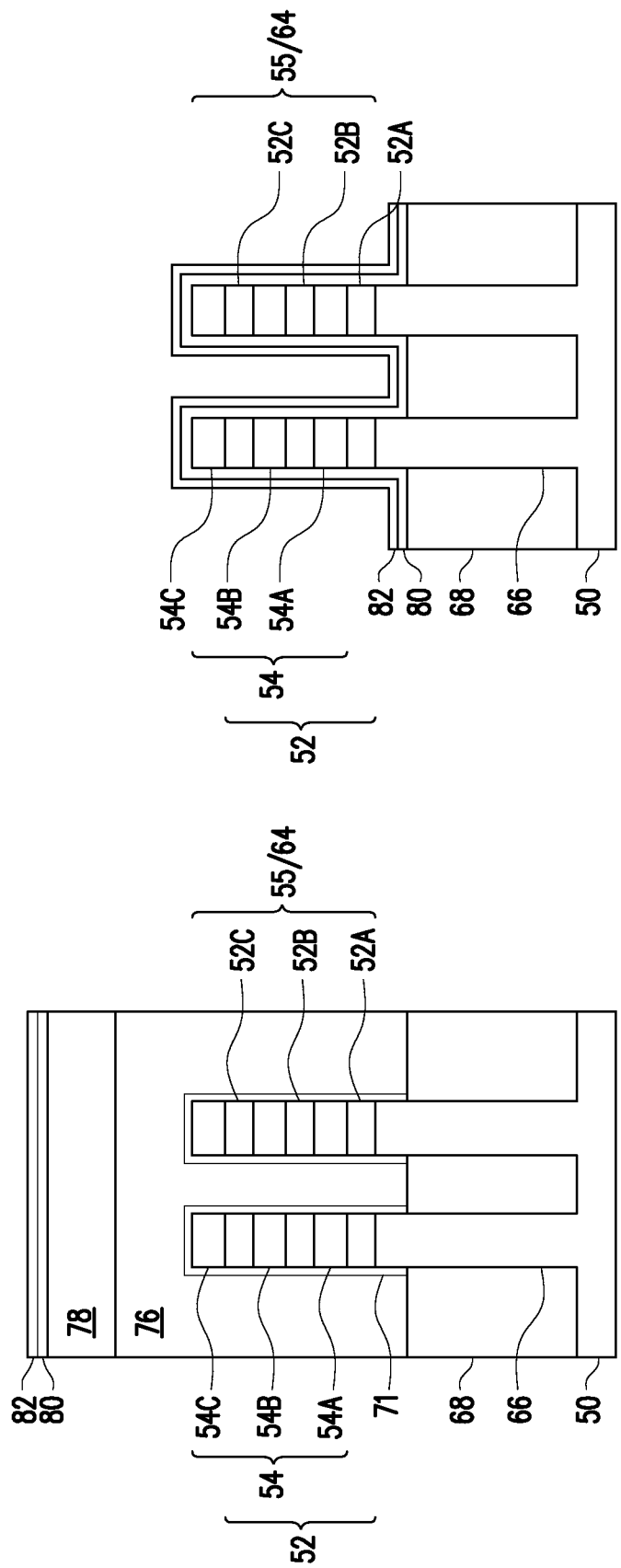

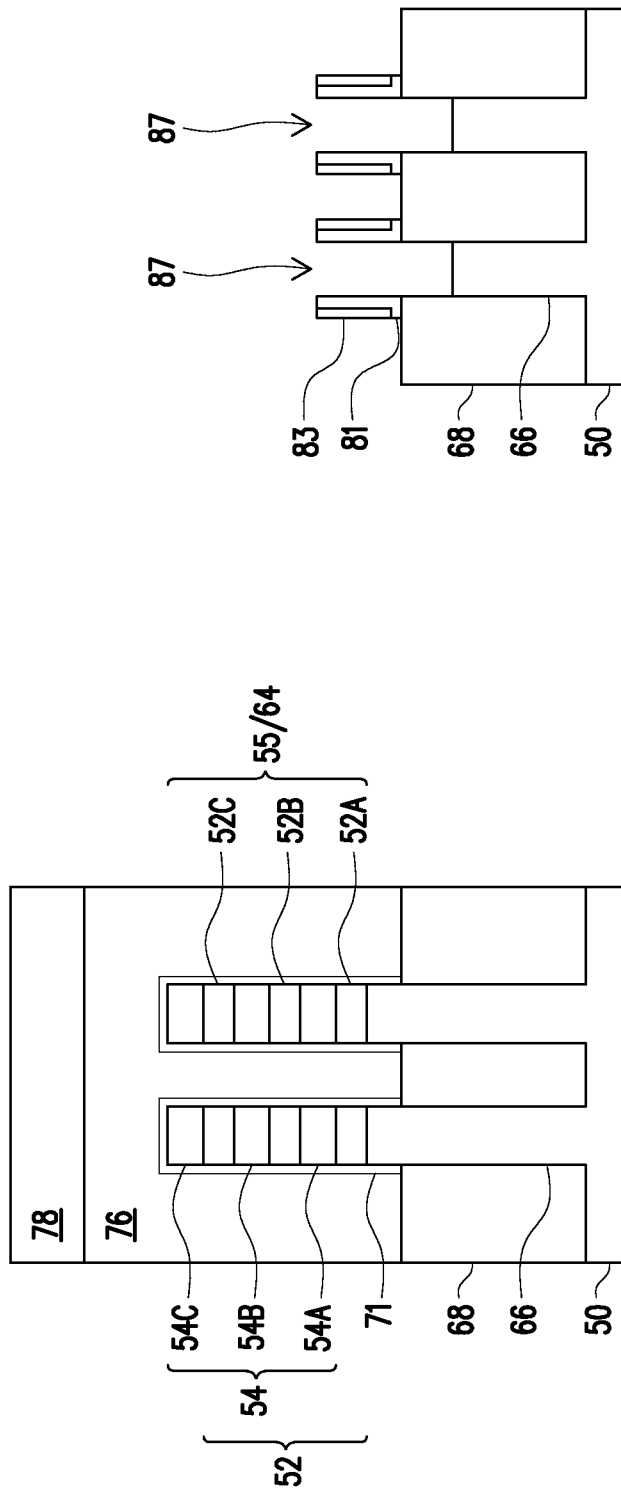

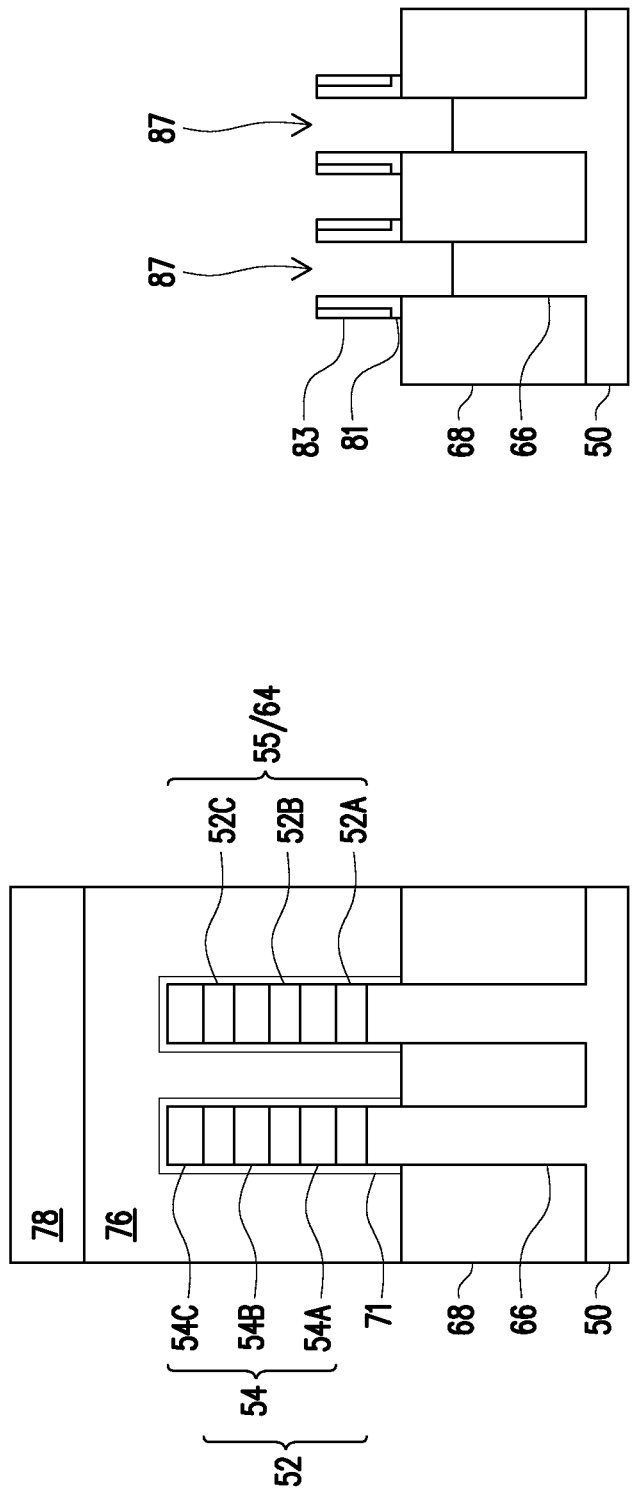

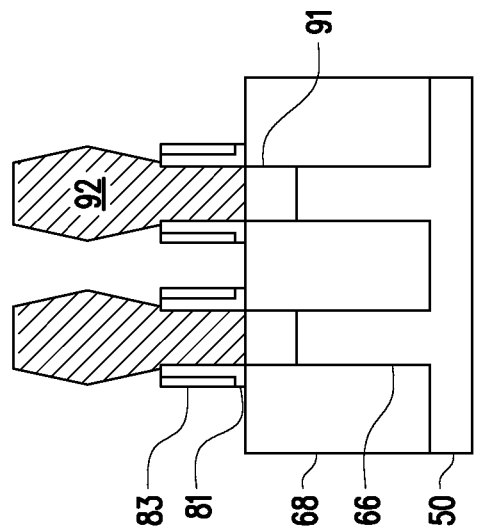
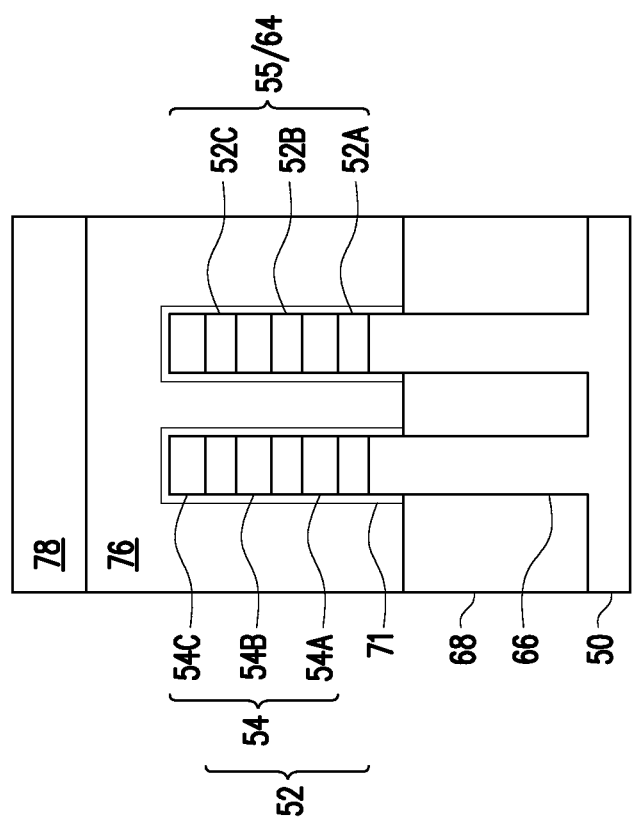
FIG. 12B
FIG. 12A

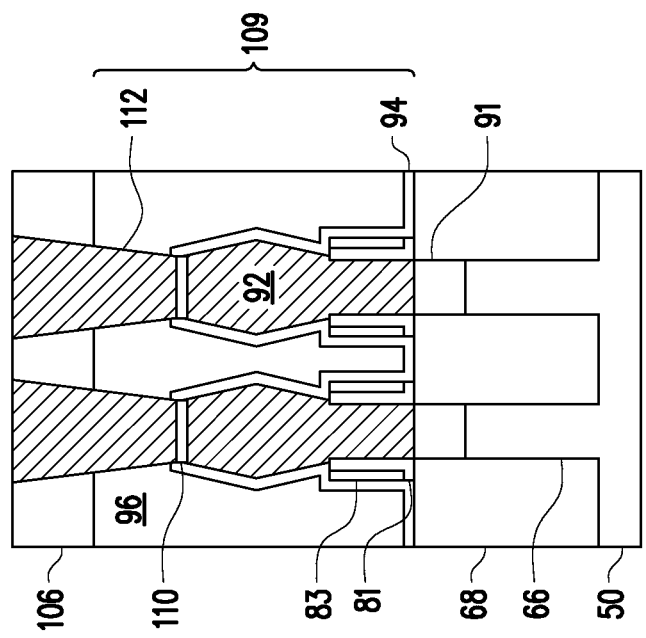
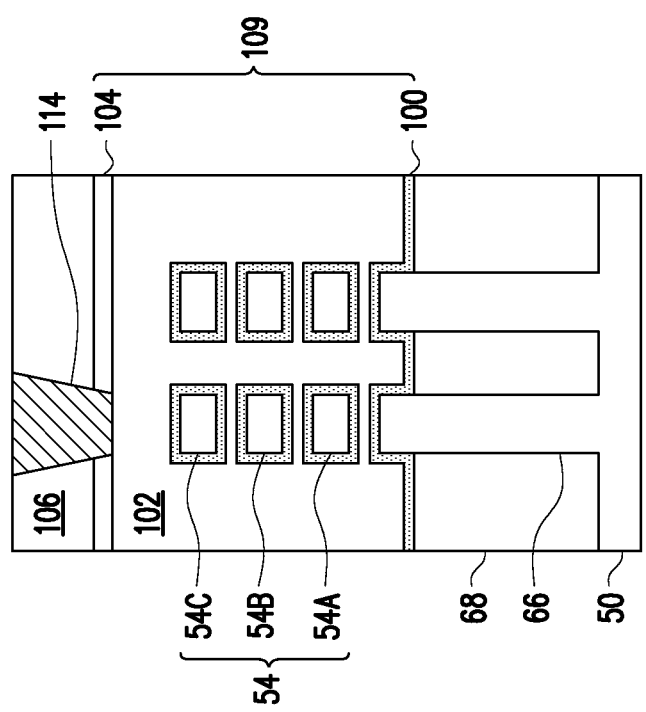
FIG. 20B
FIG. 20A

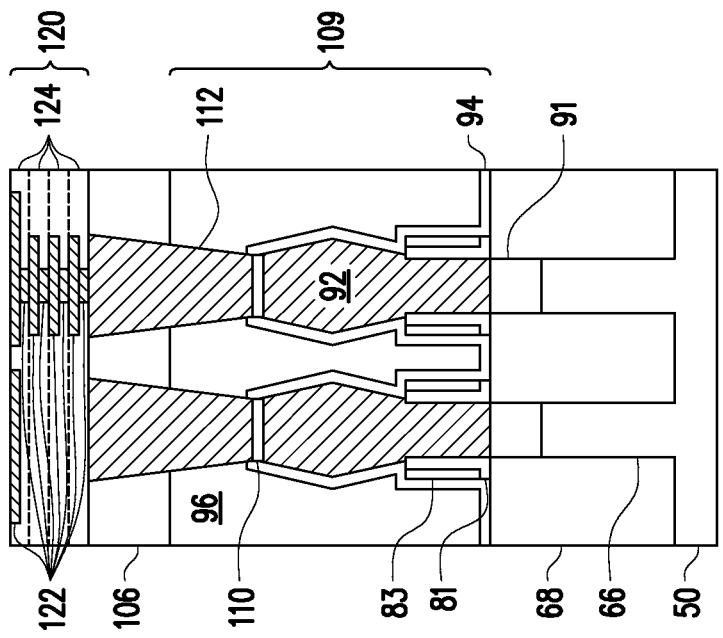
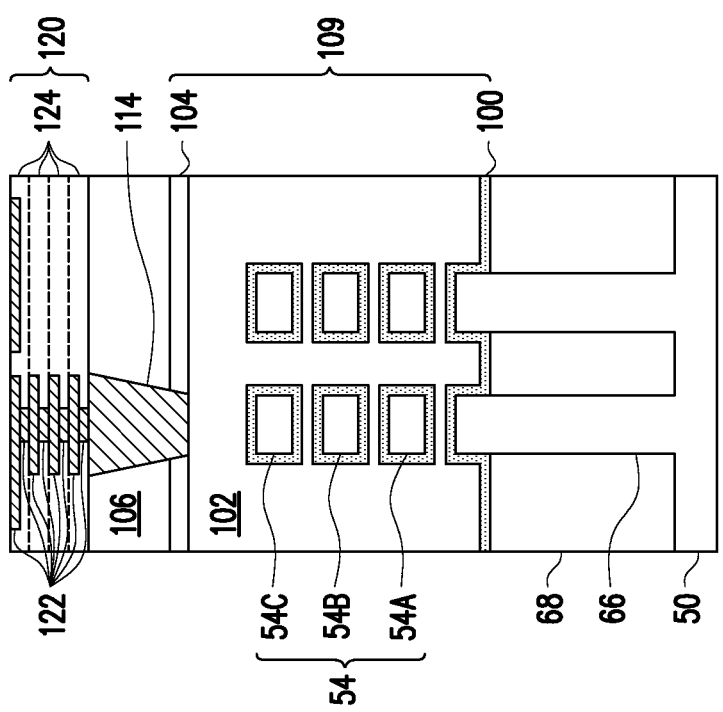
FIG. 21B
FIG. 21A

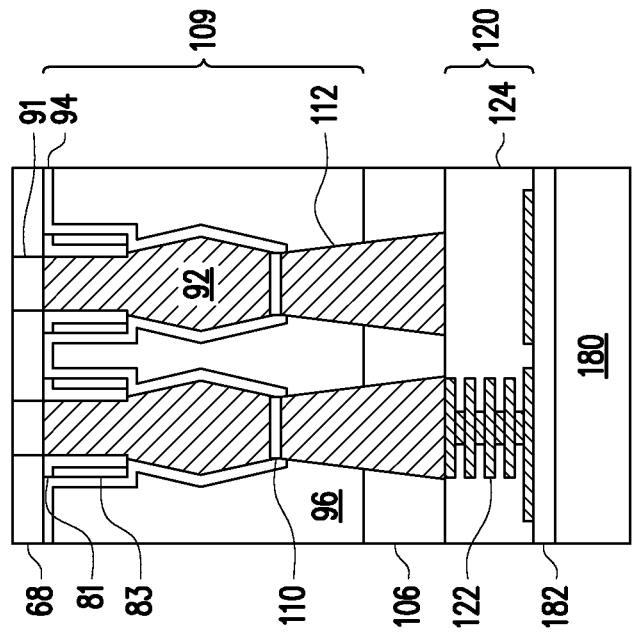
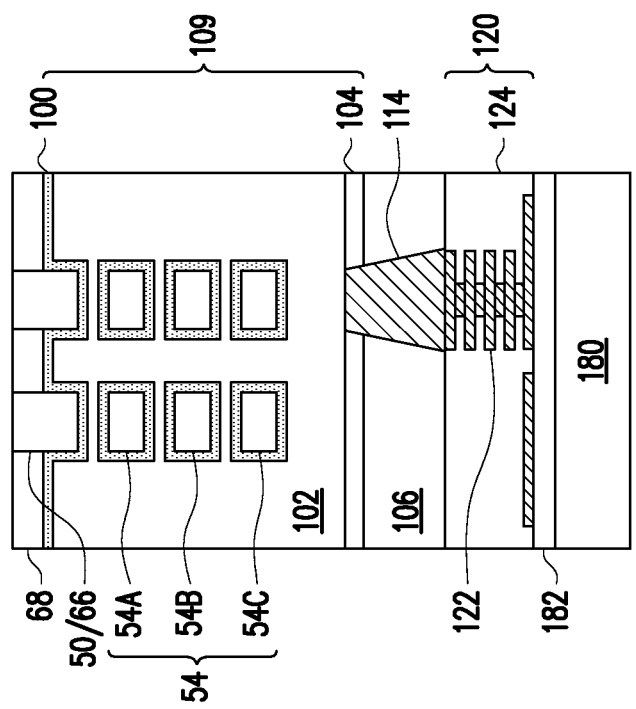
FIG. 23A
FIG. 23B

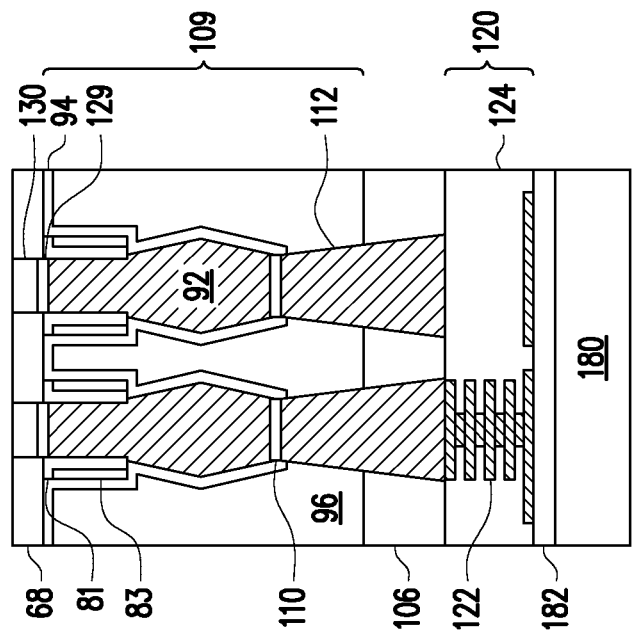
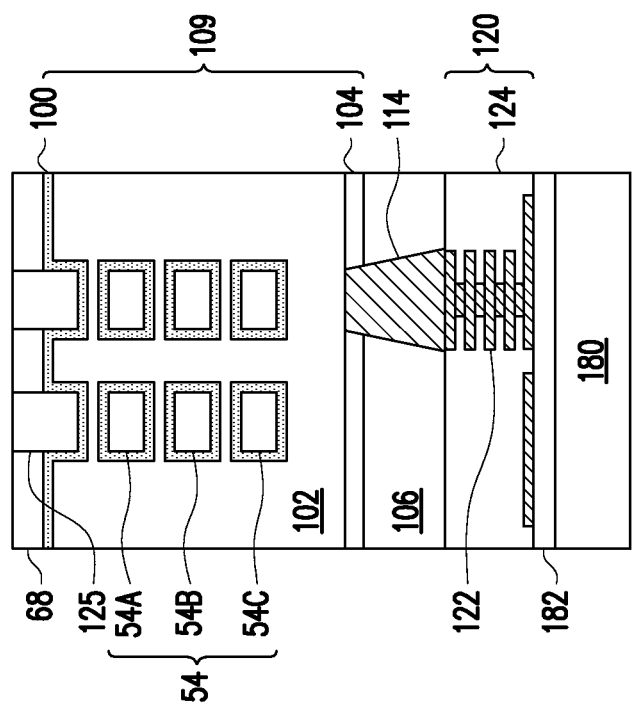
FIG. 26A
FIG. 26B

HEAT-DISSIPATING STRUCTURES FOR SEMICONDUCTOR DEVICES AND METHODS OF MANUFACTURE

CROSS-REFERENCE TO RELATED APPLICATIONS

This application claims the benefit of U.S. Provisional Application No. 63/289,716, filed on Dec. 15, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 6C, 7A, 7B, 7C, 8A, 8B, 8C, 9A, 9B, 9C, 10A, 10B, 10C, 11A, 11B, 11C, 11D, 12A, 12B, 12C, 12D, 12E, 13A, 13B, 13C, 14A, 14B, 14C, 15A, 15B, 15C, 16A, 16B, 16C, 17A, 17B, 17C, 18A, 18B, 18C, 19A, 19B, 19C, 20A, 20B, 20C, 21A, 21B, 21C, 22A, 22B, 22C, 23A, 23B, 23C, 24A, 24B, 24C, 25A, 25B, 25C, 26A, 26B, 26C, 27A, 27B, and 27C are cross-sectional views of intermediate stages in the manufacturing of nano-FETs, in accordance with some embodiments.

DETAILED DESCRIPTION

Figure 1:
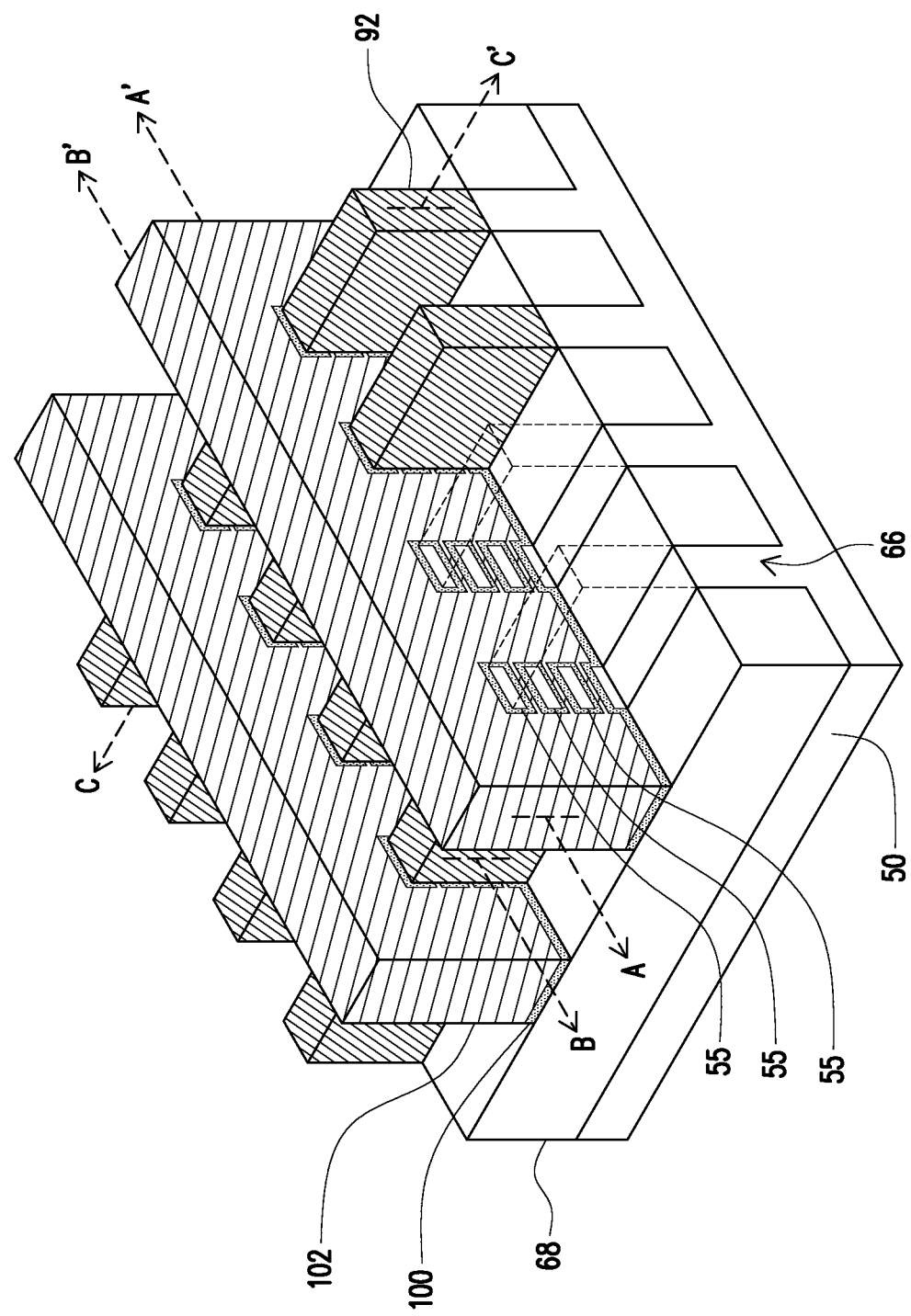
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide packaged semiconductor devices including heat-dissipating structures and methods of forming the same. The semiconductor devices to be packaged may include a front-side interconnect structure (also referred to as a back end of line (BEOL) interconnect structure) and a backside interconnect structure (also referred to as a buried power network (BPN)) on opposite sides of a device layer (such as a device layer including transistor structures). Providing the backside interconnect structure may reduce the number of layers required for the front-side interconnect structure, and the backside interconnect structure may have wider lines than the front-side interconnect structure, both of which provide improved speed performance and energy efficiency. In various embodiments, heat-dissipating structures may be formed in the front-side interconnect structure, the backside interconnect structure and/or the device layer; coupled to the front-side interconnect structure; coupled to the backside interconnect structure; coupled to side surfaces of the semiconductor devices; combinations thereof; or the like in order to dissipate heat generated in the semiconductor devices. The heat-dissipating structures may include thermally conductive dummy features, a front-side heat spreader, a backside heat spreader, a conductive cap heat spreader, a lateral heat spreader, or combinations thereof. Including the heat-dissipating structures improves heat dissipation (e.g., transient thermal performance), improves device performance, and reduces device defects.

Embodiments are described below in a particular context, namely, a die comprising nanostructure field-effect transistors (nano-FETs). Various embodiments may be applied, however, to dies comprising other types of transistors (e.g., fin field effect transistors (FinFETs), planar transistors, or the like) in lieu of or in combination with the nano-FETs.

FIG. 1 illustrates an example of nano-FETs (e.g., nanowire FETs, nanosheet FETs (Nano-FETs), or the like) in a three-dimensional view, in accordance with some embodiments. The nano-FETs comprise nanostructures 55 (e.g., nanosheets, nanowires, or the like) over fins 66 on a substrate 50 (e.g., a semiconductor substrate). The nanostructures 55 act as channel regions for the nano-FETs. The nanostructures 55 may include p-type nanostructures, n-type nanostructures, or a combination thereof. Isolation regions 68 are disposed between adjacent fins 66, which may protrude above and from between neighboring isolation regions 68. Although the isolation regions 68 are described and illustrated as being separate from the substrate 50, as used herein, the term "substrate" may refer to the semiconductor substrate alone or a combination of the semiconductor substrate and the isolation regions. Additionally, although bottom portions of the fins 66 are illustrated as being single, continuous materials with the substrate 50, the bottom portions of the fins 66 and/or the substrate 50 may comprise a single material or a plurality of materials. In this context, the fins 66 refer to the portion extending between the neighboring isolation regions 68.

Gate dielectric layers 100 are over top surfaces and sidewalls of the fins 66 and along top surfaces, sidewalls, and bottom surfaces of the nanostructures 55. Gate electrodes 102 are over the gate dielectric layers 100. Epitaxial source/drain regions 92 are disposed on the fins 66 on opposing sides of the gate dielectric layers 100 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between epitaxial source/drain regions 92 of a nano-FET. Cross-section B-B' is parallel to cross-section A-A' and extends through epitaxial source/drain regions 92 of multiple nano-FETs. Cross-section C-C' is perpendicular to cross-section A-A' and is parallel to a longitudinal axis of a fin 66 of the nano-FET and in a direction of, for example, a current flow between the epitaxial source/drain regions 92 of the nano-FET. Subsequent figures refer to these reference cross-sections for clarity.

Some embodiments discussed herein are discussed in the context of nano-FETs formed using a gate-last process. In some embodiments, a gate-first process may be used. Also, some embodiments contemplate aspects which may be used in planar devices, such as planar FETs, or in fin field-effect transistors (FinFETs).

FIGS. 2 through 27C are cross-sectional views of intermediate stages in the manufacturing of nano-FETs, in accordance with some embodiments. FIGS. 2 through 5, 6A, 7A, 8A, 9A, 10A, 11A, 12A, 13A, 14A, 15A, 16A, 17A, 18A, 19A, 20A, 21A, 22A, 23A, 24A, 25A, 26A, and 27A illustrate reference cross-section A-A' illustrated in FIG. 1. FIGS. 6B, 7B, 8B, 9B, 10B, 11B, 12B, 12D, 13B, 14B, 15B, 16B, 17B, 18B, 19B, 20B, 21B, 22B, 23B, 24B, 25B, 26B, and 27B illustrate reference cross-section B-B' illustrated in FIG. 1. FIGS. 6C, 7C, 8C, 9C, 10C, 11C, 11D, 12C, 12E, 13C, 14C, 15C, 16C, 17C, 18C, 19C, 20C, 21C, 22C, 23C, 24C, 25C, 26C, and 27C illustrate reference cross-section C-C' illustrated in FIG. 1. FIGS. 28 through 60 discuss heat-dissipating structures, which may be used to improve heat dissipation from nano-FETs manufactured according to the processes of FIGS. 2 through 27C. The heat-dissipating structures may alternatively be used for other semiconductor devices, such as FinFETs, planar transistors, and the like.

Figure 2:
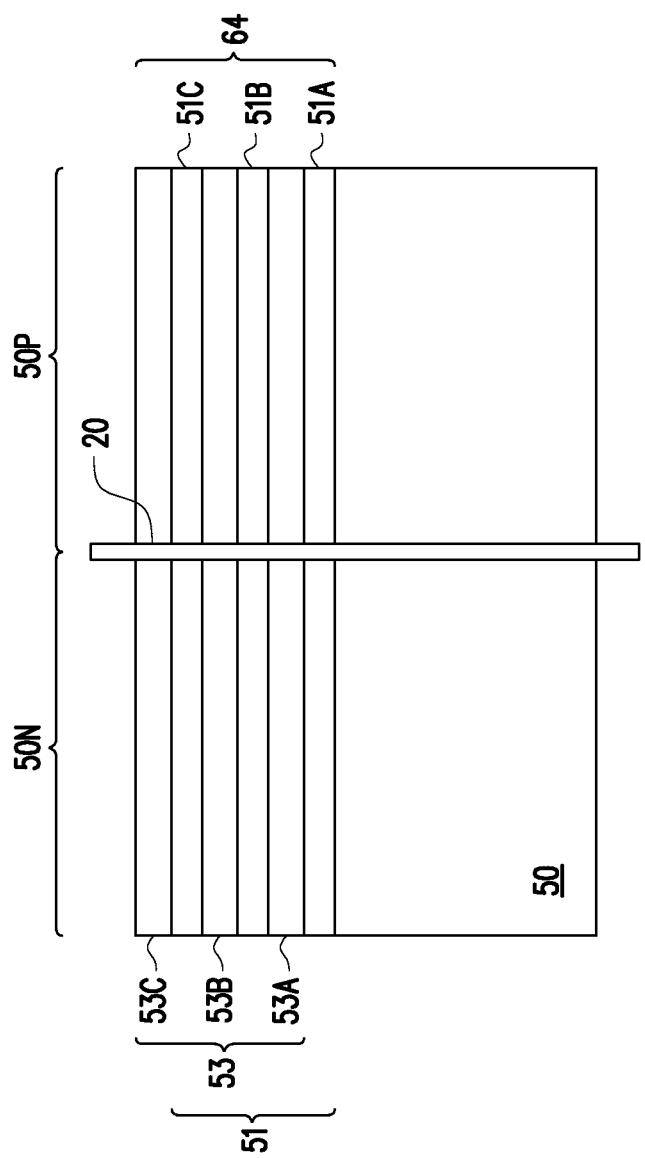

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or un-doped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs. The p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, or the like) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-C (collectively referred to as first semiconductor layers 51) and second semiconductor layers 53A-C (collectively referred to as second semiconductor layers 53). For purposes of illustration and as discussed in greater detail below, the second semiconductor layers 53 will be removed and the first semiconductor layers 51 will be patterned to form channel regions of nano-FETs in the n-type region 50N and the p-type region 50P. In such embodiments, the channel regions in both the n-type region 50N and the p-type region 50P may have a same material composition (e.g., silicon, or another semiconductor material) and may be formed simultaneously.

In some embodiments the second semiconductor layers 53 may be removed and the first semiconductor layers 51 may be patterned to form channel regions of nano-FETs in the n-type region 50N, and the first semiconductor layers 51 may be removed and the second semiconductor layers 53 may be patterned to form channel regions of nano-FETs in the p-type region 50P. In some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type region 50P. In some embodiments, the first semiconductor layers 51 may be removed and the second semiconductor layers 53 may be patterned to form channel regions of nano-FETs in both the n-type region 50N and the p-type region 50P.

The multi-layer stack 64 is illustrated as including three layers of the first semiconductor layers 51 and three layers of the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In some embodiments, the first semiconductor layers 51 may be formed of a first semiconductor material suitable for p-type nano-FETs, such as silicon germanium or the like. The second semiconductor layers 53 may be formed of a second semiconductor material suitable for n-type nano-FETs, such as silicon, silicon carbide, or the like. The multi-layer stack 64 is illustrated as having a bottommost first semiconductor layer 51 formed of the first semiconductor material for illustrative purposes. In some embodiments, the multi-layer stack 64 may be formed having a bottommost second semiconductor layer 53 formed of the second semiconductor material.

The first semiconductor material and the second semiconductor material may be materials having a high etch selectivity to one another. As such, the first semiconductor layers 51 of the first semiconductor material may be removed without significantly removing the second semiconductor layers 53 of the second semiconductor material. This allows the second semiconductor layers 53 to be patterned to form channel regions of nano-FETs. Similarly, in embodiments in which the second semiconductor layers 53 are removed and the first semiconductor layers 51 are patterned to form channel regions, the second semiconductor layers 53 of the second semiconductor material may be removed without significantly removing the first semiconductor layers 51 of the first semiconductor material. This allows the first semiconductor layers 51 to be patterned to form channel regions of nano-FETs.

Figure 3:
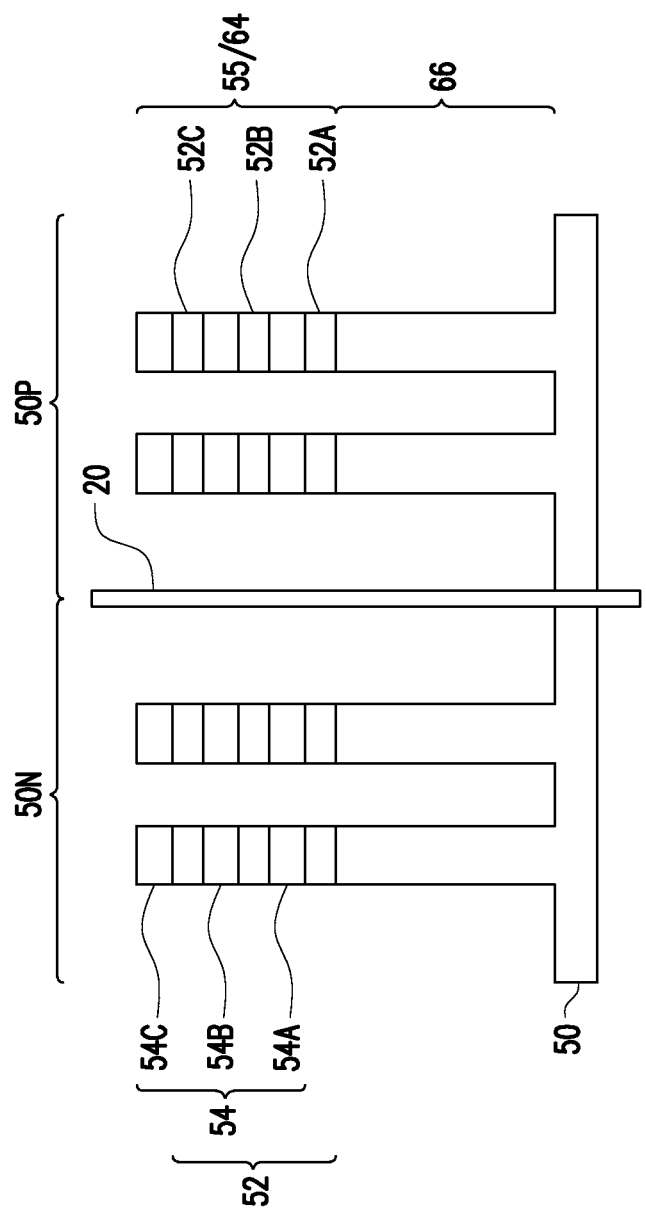

In FIG. 3, fins 66 are formed in the substrate 50 and nanostructures 55 are formed in the multi-layer stack 64. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etching (RIE), neutral beam etching (NBE), the like, or a combination thereof. The etching may be anisotropic. Forming the nanostructures 55 by etching the multi-layer stack 64 may further define first nanostructures 52A-C (collectively referred to as first nanostructures 52) from the first semiconductor layers 51 and define second nanostructures 54A-C (collectively referred to as second nanostructures 54) from the second semiconductor layers 53. The first nanostructures 52 and the second nanostructures 54 may be collectively referred to as the nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66 and the nanostructures 55.

FIG. 3 illustrates the fins 66 and the nanostructures 55 in the n-type region 50N and the p-type region 50P as having substantially equal widths for illustrative purposes. In some embodiments, widths of the fins 66 and the nanostructures 55 in the n-type region 50N may be greater than or less than widths of the fins 66 and the nanostructures 55 in the p-type region 50P. Further, while each of the fins 66 and the nanostructures 55 are illustrated as having consistent widths throughout, in some embodiments, the fins 66 and/or the nanostructures 55 may have different sidewalls, such as tapered sidewalls. As such, a width of each of the fins 66 and/or the nanostructures 55 may continuously increase in a direction towards the substrate 50. In such embodiments, each of the nanostructures 55 in a vertical stack may have a different width and may be trapezoidal in shape.

Figure 4:
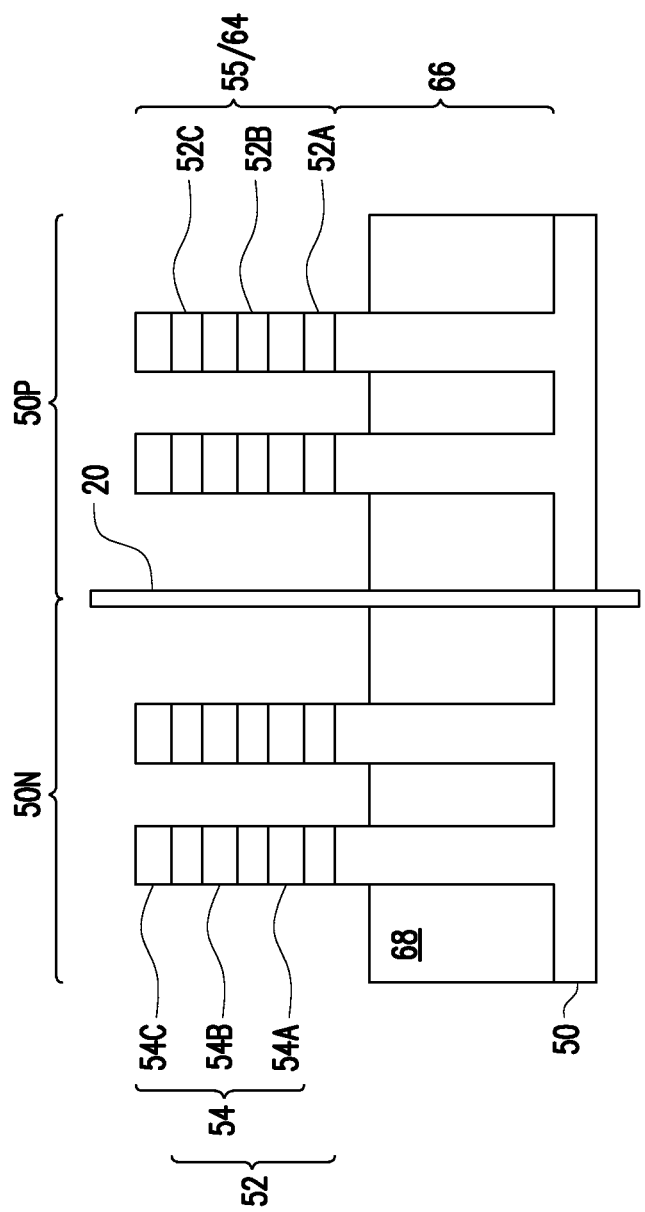

In FIG. 4, shallow trench isolation (STI) regions 68 are formed adjacent the fins 66. The STI regions 68 may be formed by depositing an insulation material over the substrate 50, the fins 66, and the nanostructures 55, and between adjacent ones of the fins 66 and the nanostructures 55. The insulation material may be an oxide (such as silicon oxide), a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In some embodiments, the insulation material is formed such that excess insulation material covers the nanostructures 55. Although the insulation material is illustrated as a single layer, some embodiments may utilize multiple layers. For example, in some embodiments a liner (not separately illustrated) may be formed along surfaces of the substrate 50, the fins 66, and the nanostructures 55. Thereafter, a fill material, such as those discussed above, may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55, such that top surfaces of the nanostructures 55 and the insulation material are level after the planarization process is complete.

The insulation material is then recessed to form the STI regions 68. The insulation material is recessed such that the nanostructures 55 and the fins 66 in the n-type region 50N and the p-type region 50P protrude from between neighboring ones of the STI regions 68. Top surfaces of the STI regions 68 may have flat surfaces as illustrated, convex surfaces, concave surfaces (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the nanostructures 55). As illustrated in FIG. 4, top surfaces of the STI regions 68 may be above top surfaces of the fins 66. However, in some embodiments, the top surfaces of the STI regions 68 may be disposed level with or below the top surfaces of the fins 66. In some embodiments, an oxide removal using dilute hydrofluoric (dHF) acid may be used to etch back the insulation material.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer may be formed over a top surface of the substrate 50, and trenches may be etched through the dielectric layer to expose the underlying substrate 50. Epitaxial structures may be epitaxially grown in the trenches, and the dielectric layer may be recessed such that the epitaxial structures protrude from the dielectric layer to form the fins 66 and/or the nanostructures 55. The epitaxial structures may comprise alternating layers of the semiconductor materials discussed above, such as the first semiconductor material and the second semiconductor material. In some embodiments where epitaxial structures are epitaxially grown, the epitaxially grown materials may be in situ doped during growth, which may obviate prior and/or subsequent implantations. In some embodiments, in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist may be formed by using a spin-on technique and may be patterned using acceptable photolithography techniques. Once the photoresist is patterned, an n-type impurity implant is performed in the p-type region 50P, and the photoresist may act as a mask to prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist may be formed by using a spin-on technique and may be patterned using acceptable photolithography techniques. Once the photoresist is patterned, a p-type impurity implant may be performed in the n-type region 50N, and the photoresist may act as a mask to prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations. In some embodiments, in situ and implantation doping may be used together.

Figure 5:
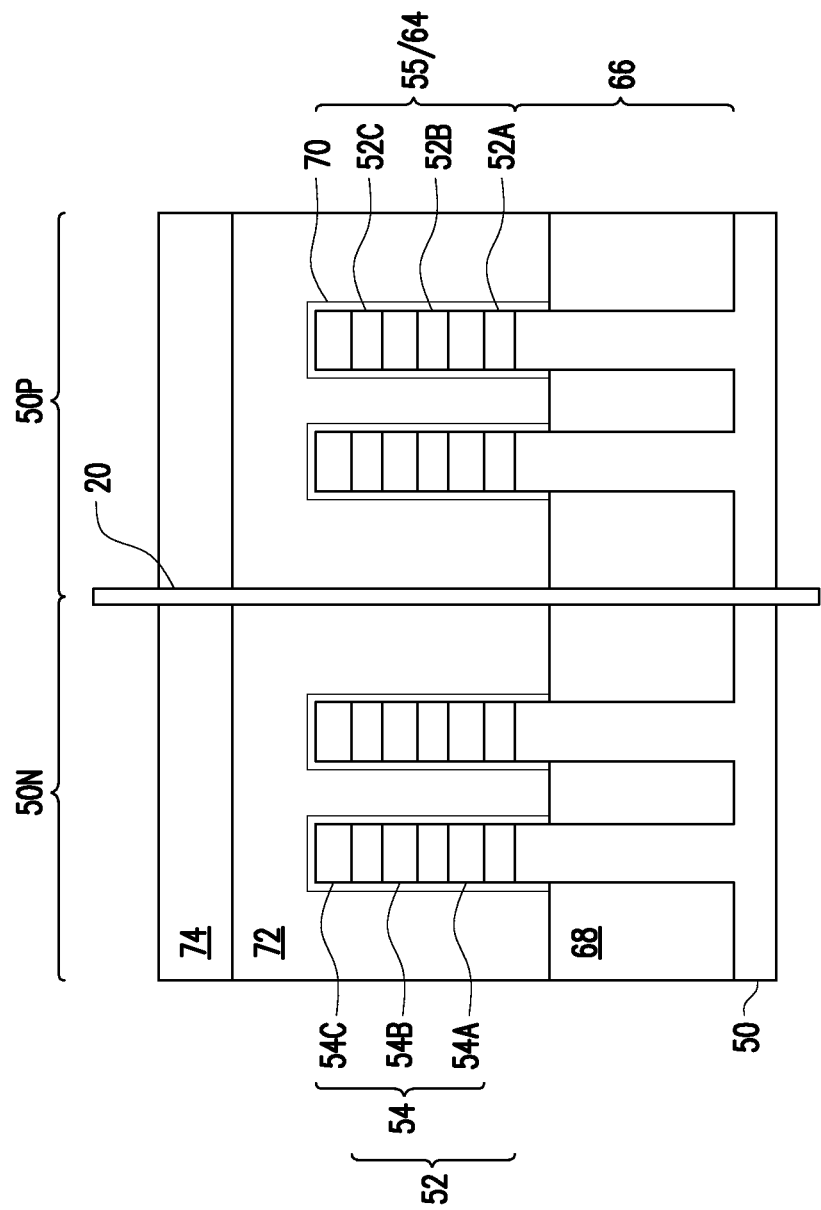

In FIG. 5, a dummy dielectric layer 70 is formed on the fins 66 and/or the nanostructures 55. The dummy dielectric layer 70 may be, for example, silicon oxide, silicon nitride, a combination thereof, or the like. The dummy dielectric layer 70 may be deposited or thermally grown according to acceptable techniques.

A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etch selectivity from the etching of the STI regions 68.

The mask layer 74 may be deposited over the dummy gate layer 72. The mask layer 74 may include, for example, silicon nitride, silicon oxynitride, or the like. In the illustrated embodiment, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68. As such, the dummy dielectric layer 70 may extend between the dummy gate layer 72 and the STI regions 68.

Figure 6C:
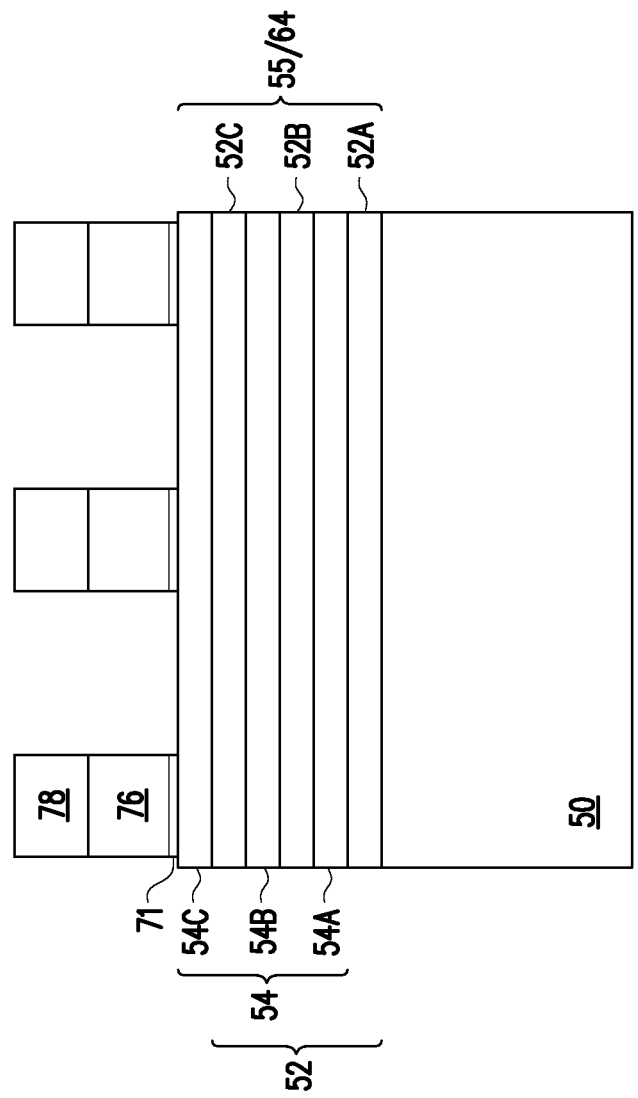

FIGS. 6A through 27C illustrate various additional steps in the manufacturing of embodiment devices. FIGS. 6A through 27C illustrate features in either the n-type region 50N or the p-type region 50P. In FIGS. 6A through 6C, the mask layer 74 (see FIG. 5) may be patterned using acceptable photolithography and etching techniques to form masks 78. The pattern of the masks 78 may be transferred to the dummy gate layer 72 and to the dummy dielectric layer 70 to form dummy gates 76 and dummy gate dielectrics 71, respectively. The dummy gates 76 cover respective channel regions of the nanostructures 55. The pattern of the masks 78 may be used to physically separate each of the dummy gates 76 from adjacent dummy gates 76. The dummy gates 76 may have a lengthwise direction perpendicular to the lengthwise direction of respective fins 66 and nanostructures 55.

Figure 7C:
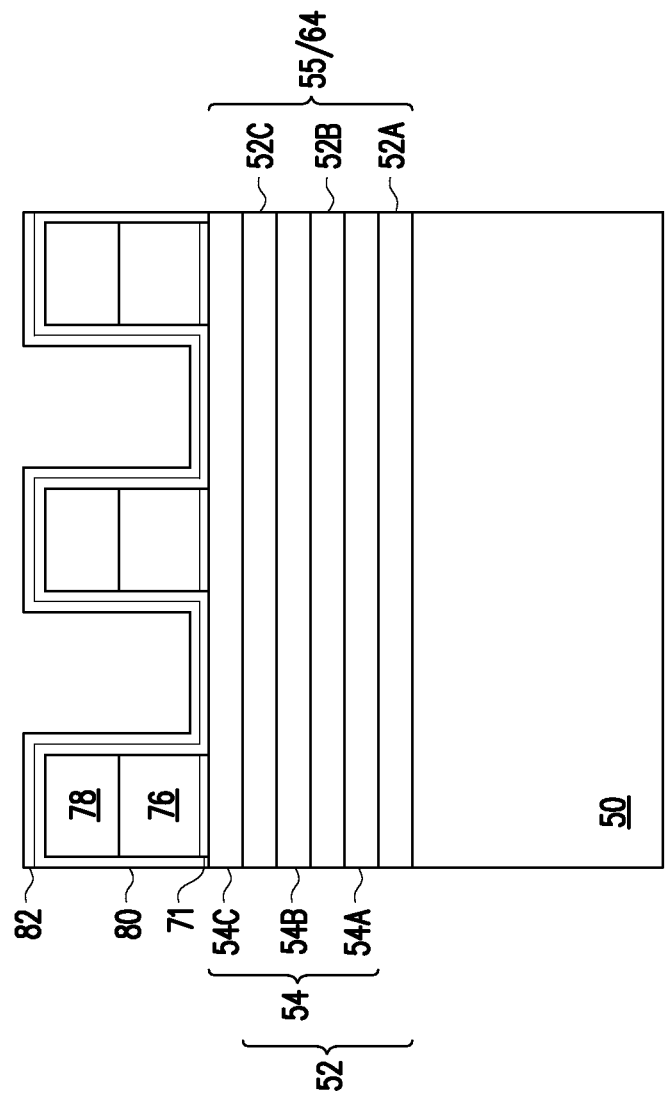

In FIGS. 7A through 7C, a first spacer layer 80 and a second spacer layer 82 are formed over the structures illustrated in FIGS. 6A through 6C, respectively. The first spacer layer 80 and the second spacer layer 82 will be subsequently patterned to act as spacers for forming self-aligned source/drain regions. In FIGS. 7A through 7C, the first spacer layer 80 is formed on top surfaces of the STI regions 68; top surfaces and sidewalls of the nanostructures 55 and the masks 78; and sidewalls of the dummy gates 76, the dummy gate dielectrics 71, and the fins 66. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and the nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and the nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm$^3$ to about $1\times10^{19}$ atoms/cm$^3$. An anneal may be used to repair implant damage and to activate the implanted impurities.

Figures 8A, 8B:
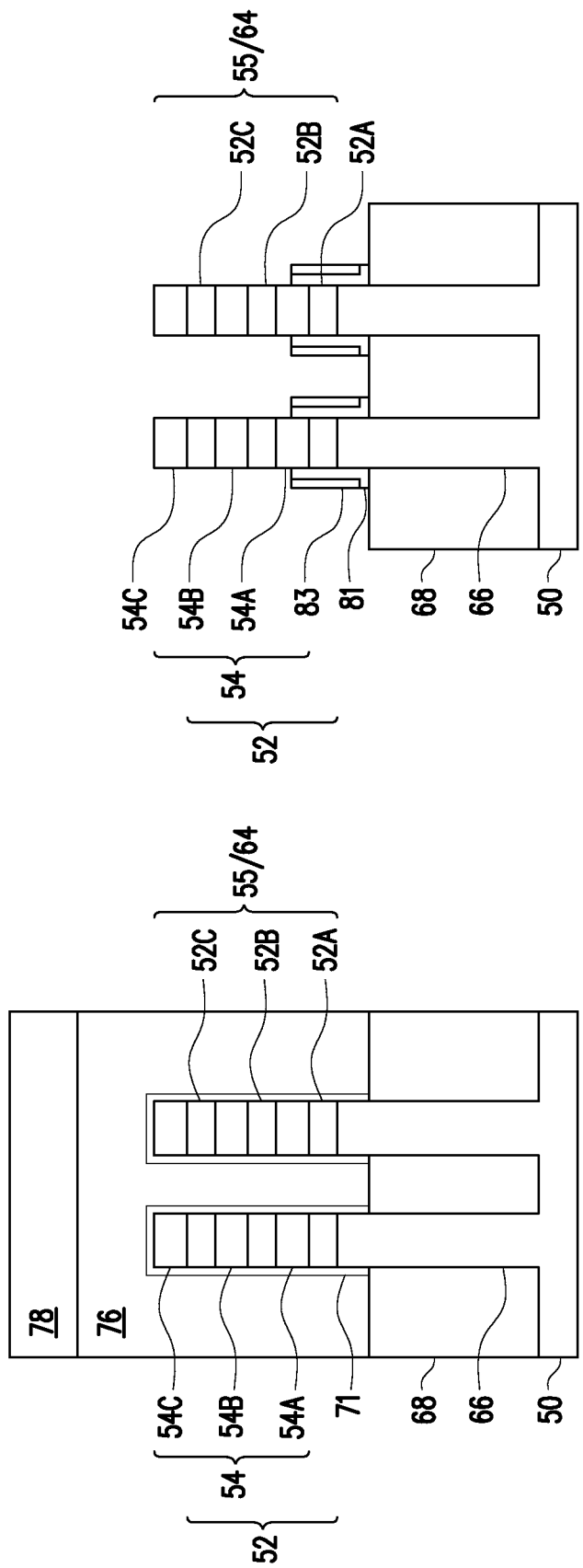
Figure 8C:
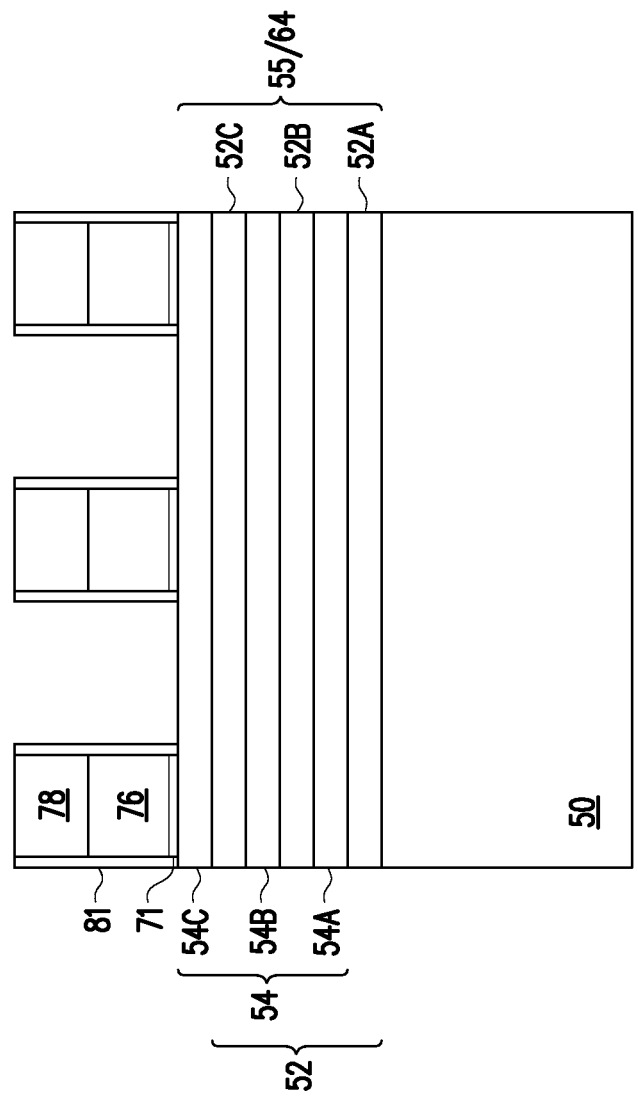

In FIGS. 8A through 8C, the first spacer layer 80 and the second spacer layer 82 are etched to form first spacers 81 and second spacers 83, respectively. As will be discussed in greater detail below, the first spacers 81 and the second spacers 83 act to self-align subsequently formed source/drain regions, as well as to protect sidewalls of the fins 66 and/or the nanostructures 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and the second spacer layer 82 may act as a mask when patterning the first spacer layer 80. For example, the second spacer layer 82 may be etched using an anisotropic etch process with the first spacer layer 80 acting as an etch stop layer. Remaining portions of the second spacer layer 82 form the second spacers 83 as illustrated in FIG. 8B. Thereafter, the second spacers 83 act as a mask while etching exposed portions of the first spacer layer 80, forming the first spacers 81, as illustrated in FIGS. 8B and 8C.

As illustrated in FIG. 8B, the first spacers 81 and the second spacers 83 are disposed on sidewalls of the nanostructures 55 and the fins 66. As illustrated in FIG. 8C, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 71. In some embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequences of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9C:
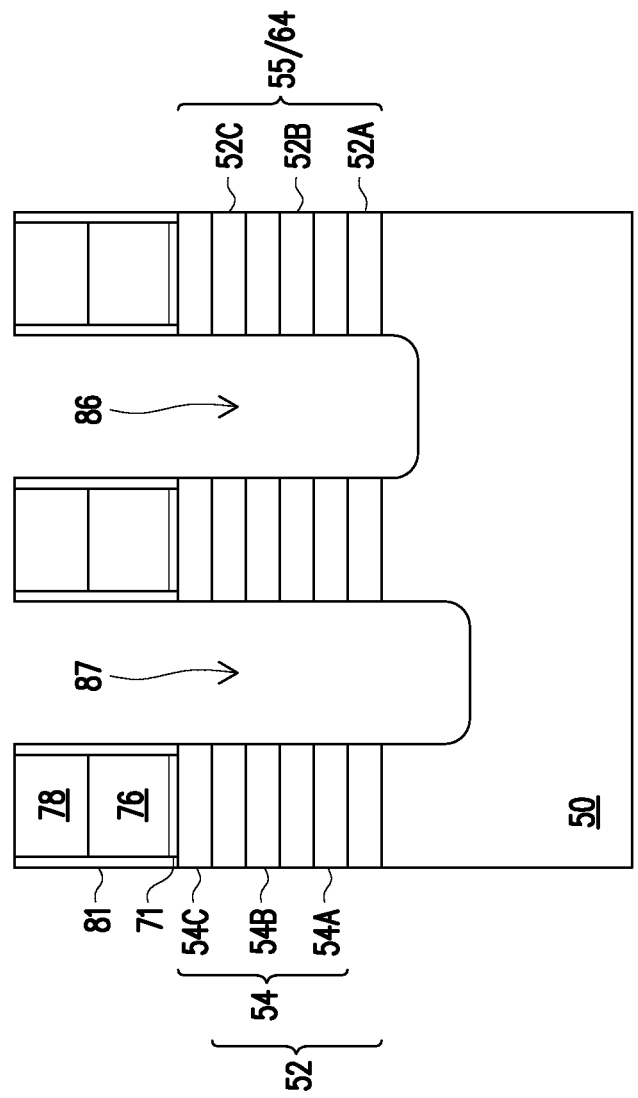

In FIGS. 9A through 9C, first recesses 86 and second recesses 87 are formed in the nanostructures 55, the fins 66, and the substrate 50. Epitaxial materials, which may be used as source/drain regions and/or dummy regions, will be subsequently formed in the first recesses 86 and the second recesses 87. The first recesses 86 may extend through the first nanostructures 52A-52C and the second nanostructures 54A-54C and into the fins 66 and the substrate 50. In some embodiments, top surfaces of the STI regions 68 may be level with bottom surfaces of the first recesses 86. In some embodiments, the top surfaces of the STI regions 68 may be above or below the bottom surfaces of the first recesses 86. The second recesses 87 may extend through the first nanostructures 52A-52C and the second nanostructures 54A-54C and into the fins 66 and the substrate 50 to a depth greater than the first recesses 86. Bottom surfaces of the second recesses 87 may be disposed below the bottom surfaces of the first recesses 86 and the top surfaces of the STI regions 68.

The first recesses 86 and the second recesses 87 may be formed by etching the nanostructures 55, the fins 66, and the substrate 50 using anisotropic etching processes, such as RIE, NBE, or the like. The first spacers 81, the second spacers 83, and the masks 78 mask portions of the nanostructures 55, the fins 66, and the substrate 50 during the etching processes used to form the first recesses 86 and the second recesses 87. A single etch process or multiple etch processes may be used to etch each layer of nanostructures 55, the fins 66, and the substrate 50. Timed etch processes may be used to stop the etching after the first recesses 86 and the second recesses 87 reach desired depths. The second recesses 87 may be etched by the same processes used to etch the first recesses 86 and an additional etch process before or after the first recesses 86 are etched. In some embodiments, regions corresponding to the first recesses 86 may be masked while the additional etch process for the second recesses 87 is performed.

Figure 10C:
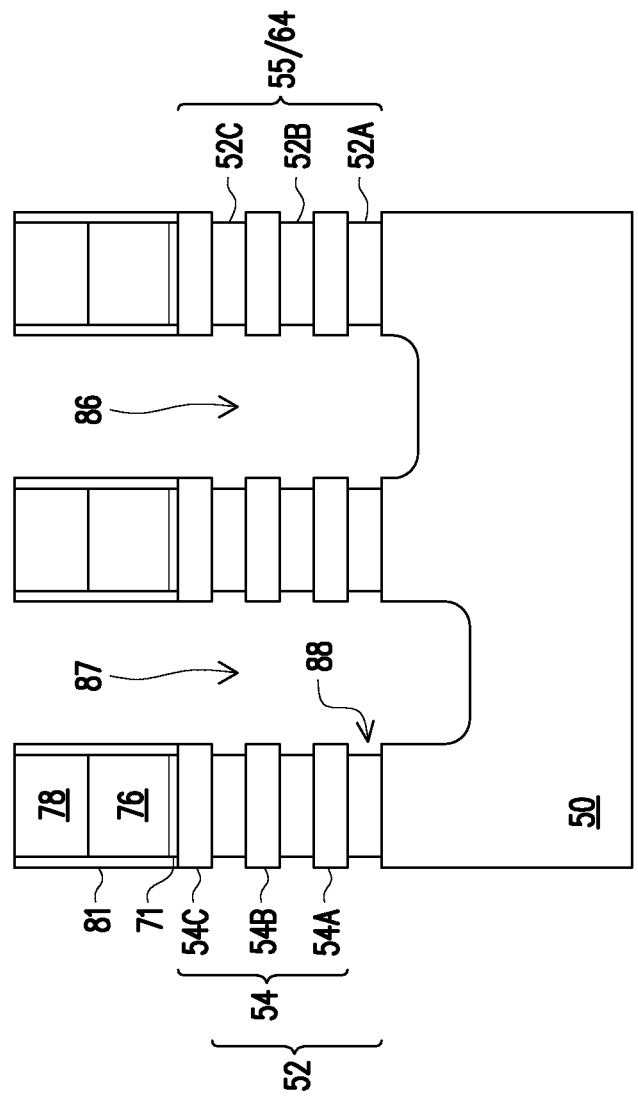

In FIGS. 10A through 10C, portions of sidewalls of the layers of the multi-layer stack 64 formed of the first semiconductor material (e.g., the first nanostructures 52) exposed by the first recesses 86 and the second recesses 87 are etched to form sidewall recesses 88 in the n-type region 50N and the p-type region 50P. Although sidewalls of the first nanostructures 52 adjacent the sidewall recesses 88 are illustrated as being straight in FIG. 10C, the sidewalls may be concave or convex. The sidewalls may be etched using isotropic etching processes, such as wet etching or the like. In an embodiment in which the second nanostructures 54 include, e.g., Si or SiC, and the first nanostructures 52 include, e.g., SiGe, a wet or dry etch process with hydrogen fluoride, another fluorine-based etchant, or the like may be used to etch sidewalls of the first nanostructures 52 in the n-type region 50N and the p-type region 50P.

In FIGS. 11A through 11D, first inner spacers 90 are formed in the sidewall recess 88. The first inner spacers 90 may be formed by depositing an inner spacer layer (not separately illustrated) over the structures illustrated in FIGS. 10A through 10C. The first inner spacers 90 act as isolation features between subsequently formed source/drain regions and gate structures. As will be discussed in greater detail below, the source/drain regions will be formed in the first recesses 86 and the second recesses 87, while first nanostructures 52 will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54, the outer sidewalls of the first inner spacers 90 may extend beyond or be recessed from the sidewalls of the second nanostructures 54.

Figures 11A, 11B:
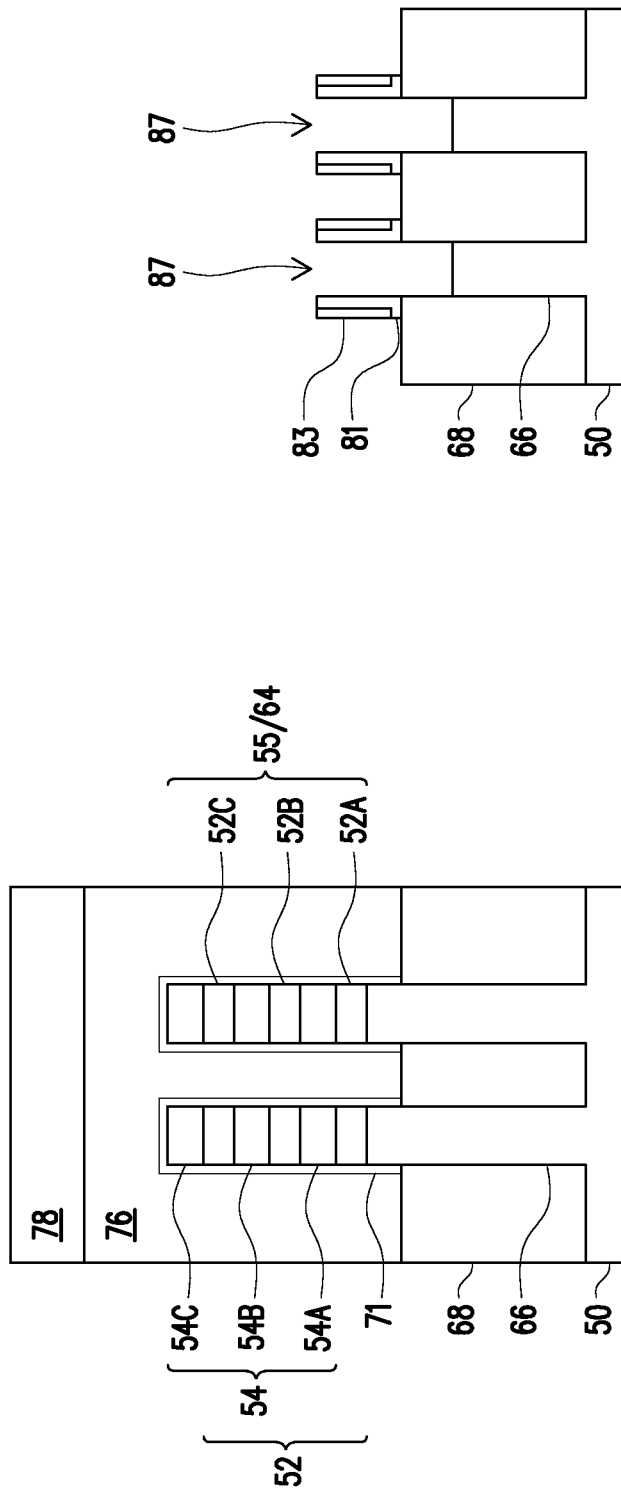
Figure 11C:
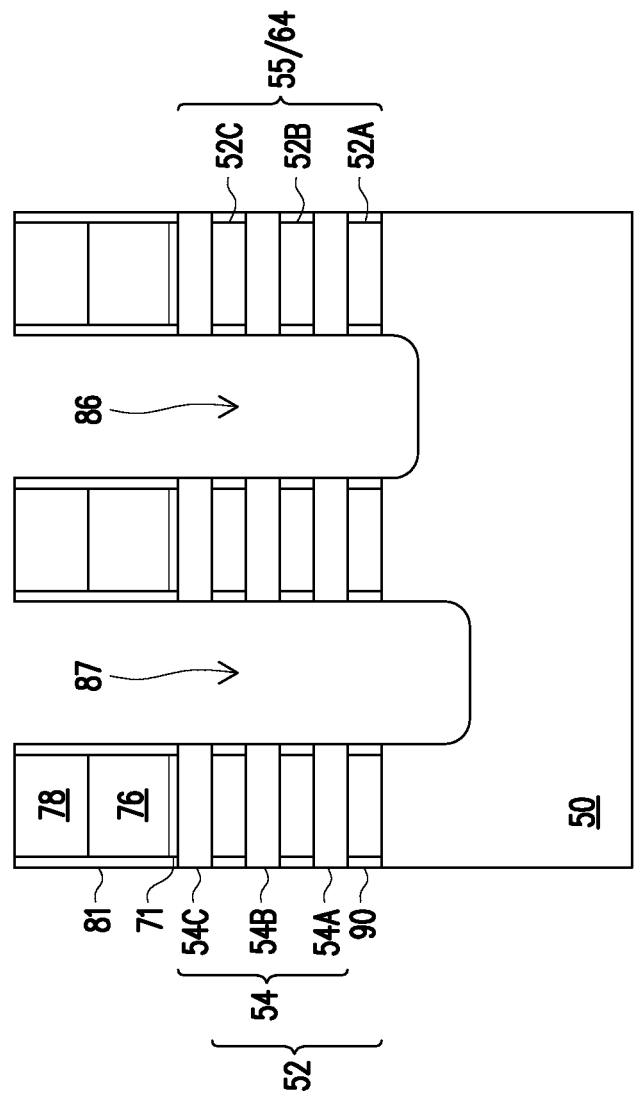
Figure 11D:
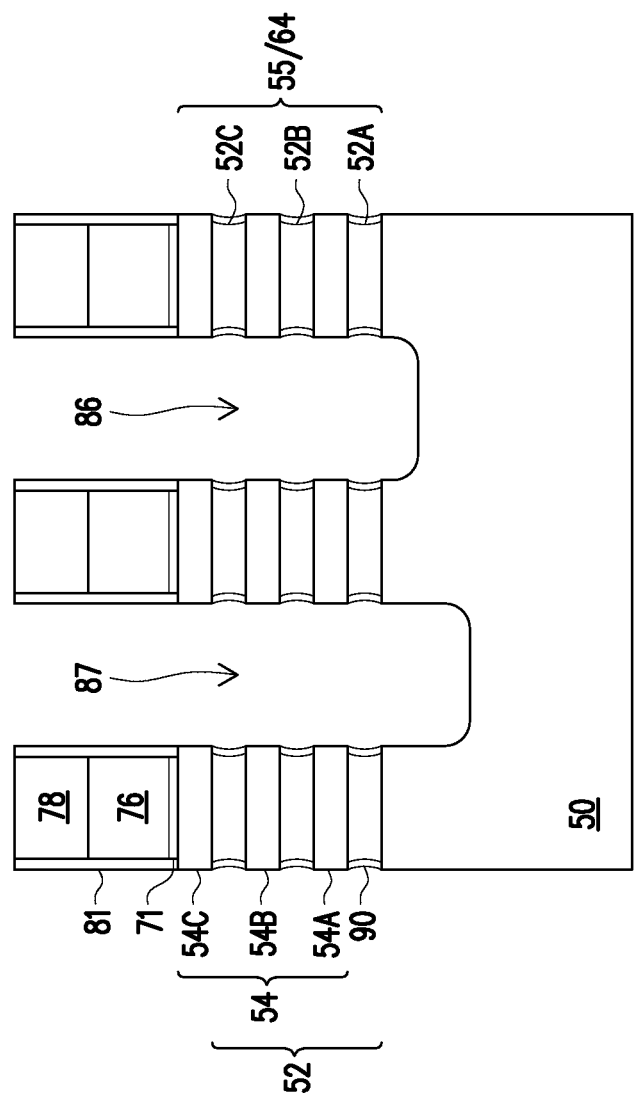

Moreover, although the outer sidewalls of the first inner spacers 90 are illustrated as being straight in FIG. 11C, the outer sidewalls of the first inner spacers 90 may be concave or convex. As an example, FIG. 11D illustrates an embodiment in which sidewalls of the first nanostructures 52 are concave, outer sidewalls of the first inner spacers 90 are concave, and the first inner spacers 90 are recessed from sidewalls of the second nanostructures 54. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 12A through 12E) by subsequent etching processes, such as etching processes used to form gate structures.

In FIGS. 12A through 12E, epitaxial materials 91 are formed in the second recesses 87 and epitaxial source/drain regions 92 are formed in the first recesses 86 and the second recesses 87. In some embodiments, the epitaxial materials 91 in the second recesses 87 may be sacrificial materials, which are subsequently removed to form backside vias (such as the backside vias 130, discussed below with respect to FIGS. 26A through 26C). In some embodiments, the epitaxial source/drain regions 92 may exert stress on the second nanostructures 54 thereby improving performance.

Figures 12C, 12D:
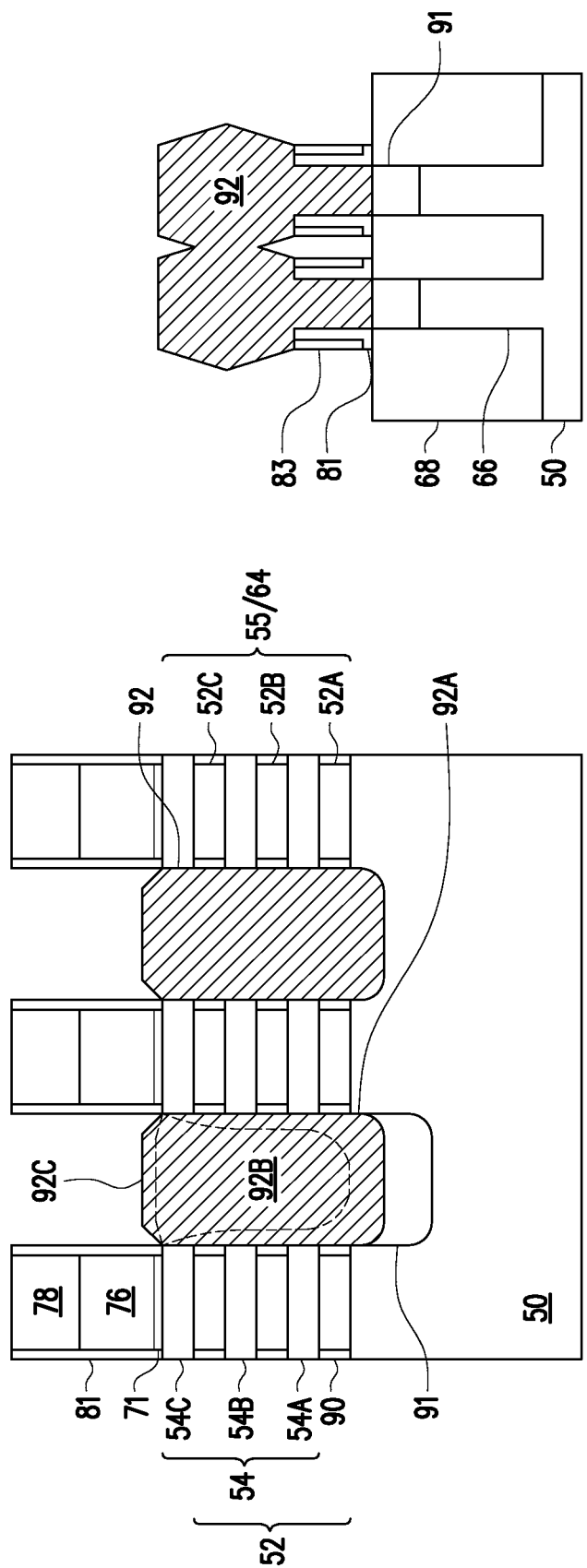

As illustrated in FIG. 12C, the epitaxial source/drain regions 92 are formed in the first recesses 86 and the second recesses 87 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the first nanostructures 52 by an appropriate lateral distance so that the epitaxial source/drain regions 92 do not short out with subsequently formed gates of the resulting nano-FETs.

The epitaxial materials 91 may be grown such that top surfaces of the epitaxial materials 91 are level with bottom surfaces of the first recesses 86 (see FIGS. 11A through 11D) and top surfaces of the STI regions 68. However, in some embodiments, the top surfaces of the epitaxial materials 91 may be disposed above or below the top surfaces of the STI regions 68. The epitaxial materials 91 may be epitaxially grown in the second recesses 87 using a process such as CVD, ALD, VPE, MBE, or the like. The epitaxial materials 91 may include any acceptable materials, such as silicon germanium or the like. The epitaxial materials 91 may be formed of materials having a high etch selectivity to materials of the substrate 50, the epitaxial source/drain regions 92, and dielectric layers (such as the STI regions 68 and a dielectric layer 125, discussed below with respect to FIGS. 24A through 24C). As such, the epitaxial materials 91 may be removed and replaced with backside vias without significantly removing the epitaxial source/drain regions 92, the substrate 50, or the STI regions 68.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 and the second recesses 87 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 and the second recesses 87 in the p-type region 50P. The epitaxial source/drain regions 92 may include any acceptable material appropriate for p-type nano-FETs. For example, if the second nanostructures 54 are silicon, the epitaxial source/drain regions 92 may comprise materials exerting a compressive strain on the second nanostructures 54, such as silicon-germanium, boron doped silicon-germanium, germanium, germanium tin, or the like. The epitaxial source/drain regions 92 may also have surfaces raised from respective surfaces of the nanostructures 55 and may have facets.

The epitaxial source/drain regions 92, the first nanostructures 52, the second nanostructures 54, the fins 66 and/or the substrate 50 may be implanted with dopants to form source/drain regions, similar to the process previously discussed for forming lightly-doped source/drain regions, followed by an anneal. The source/drain regions may have an impurity concentration of between about $1 \times 10^{19}$ atoms/cm$^3$ and about $1 \times 10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same nano-FET to merge, as illustrated by FIG. 12D. In some embodiments, adjacent epitaxial source/drain regions 92 remain separated after the epitaxy process is completed, as illustrated by FIG. 12B. In the embodiments illustrated in FIGS. 12B and 12D, the first spacers 81 may be formed extending to top surfaces of the STI regions 68, thereby blocking the epitaxial growth. In some embodiments, the spacer etch used to form the first spacers 81 may be adjusted to remove the spacer material and allow the epitaxially grown region to extend to the surface of the STI region 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 12E:
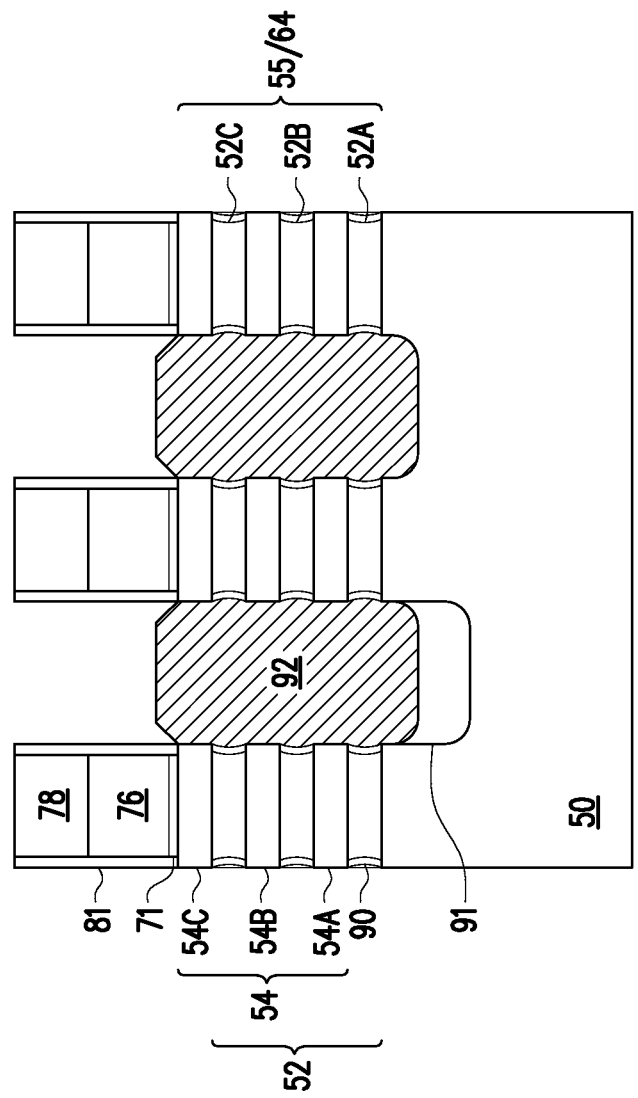

FIG. 12E illustrates an embodiment in which sidewalls of the first nanostructures 52 are concave, outer sidewalls of the first inner spacers 90 are concave, and the first inner spacers 90 are recessed from sidewalls of the second nanostructures 54. As illustrated in FIG. 12E, the epitaxial source/drain regions 92 may be formed in contact with the first inner spacers 90 and may extend past sidewalls of the second nanostructures 54.

Figure 13B:
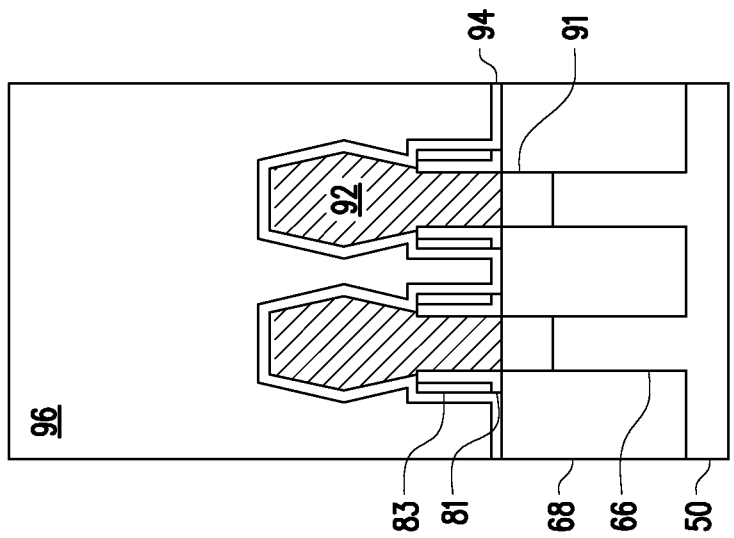
Figure 13A:
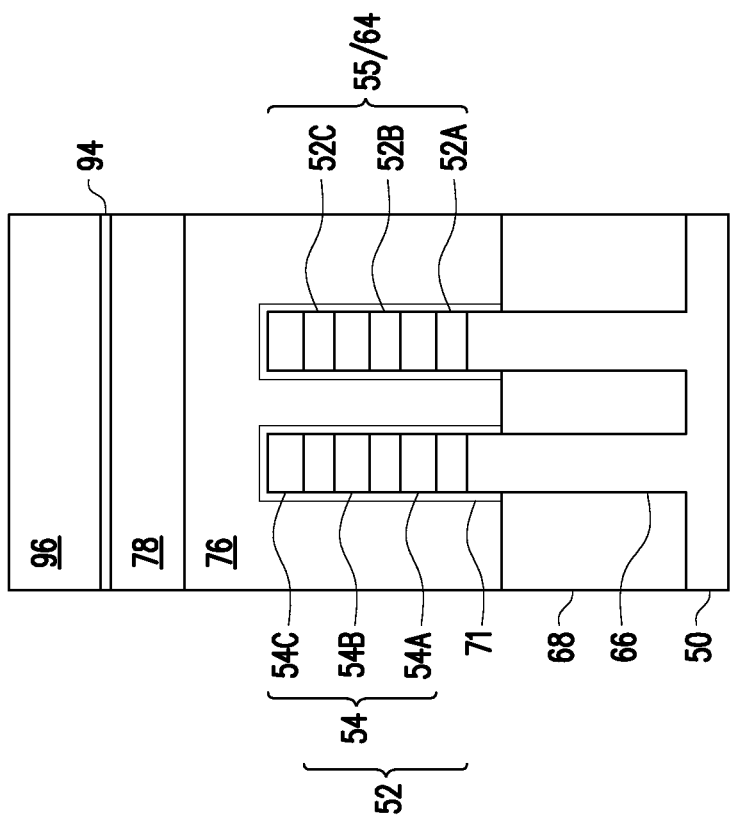
Figure 13C:
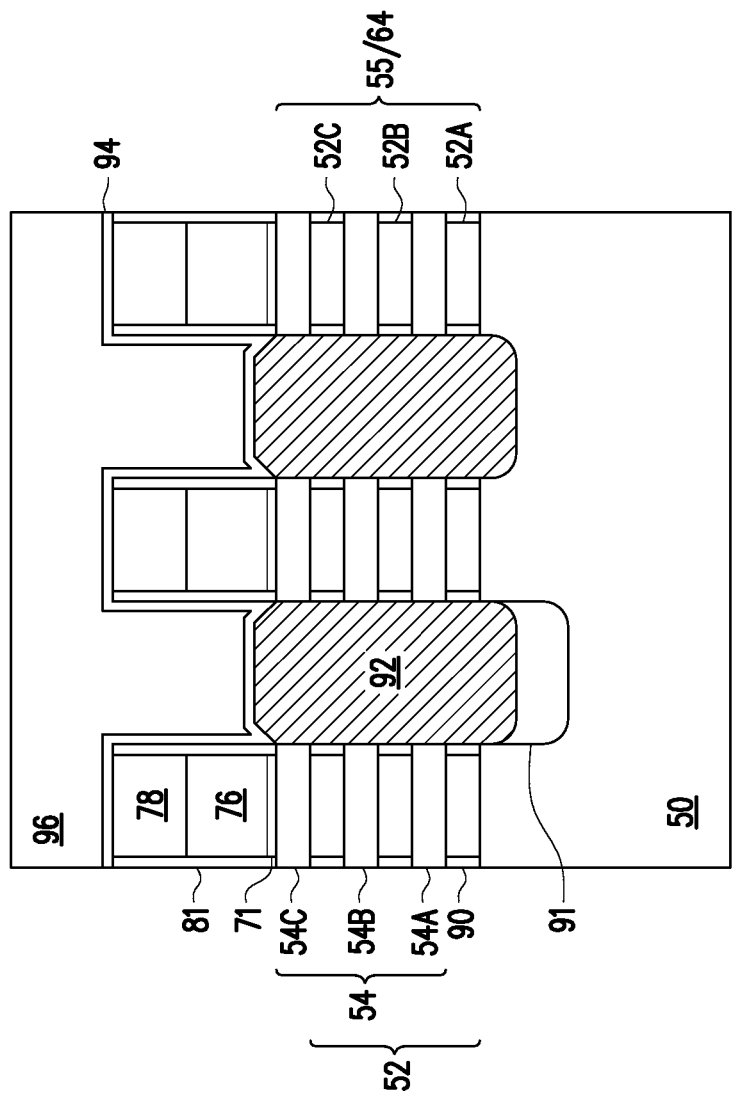

In FIGS. 13A through 13C, a first interlayer dielectric (ILD) 96 is deposited over the structure illustrated in FIGS. 12A through 12C, respectively. The first ILD 96 may be formed of a dielectric material, and may be deposited by any suitable method, such as CVD, plasma-enhanced CVD (PECVD), or FCVD. Dielectric materials may include phosphosilicate glass (PSG), borosilicate glass (BSG), boron-doped phosphosilicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, the first spacers 81, the second spacers 83, and the STI regions 68. The CESL 94 may comprise a dielectric material, such as, silicon nitride, silicon oxide, silicon oxynitride, or the like, having a different etch rate than the material of the overlying first ILD 96.

Figure 14B:
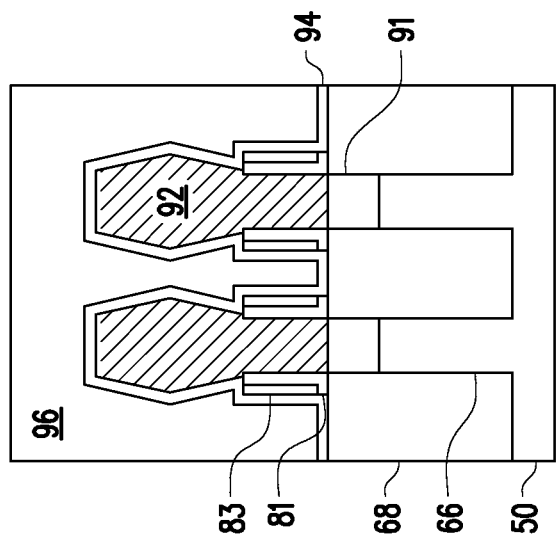
Figure 14A:
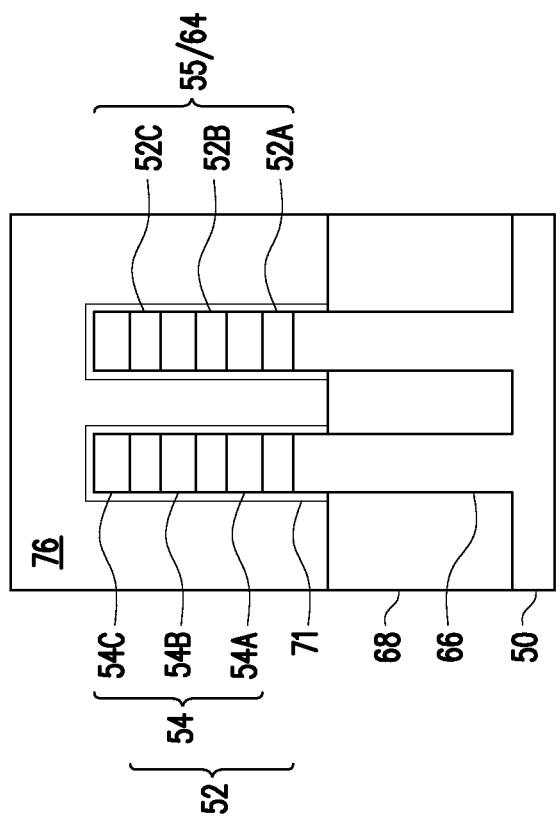
Figure 14C:
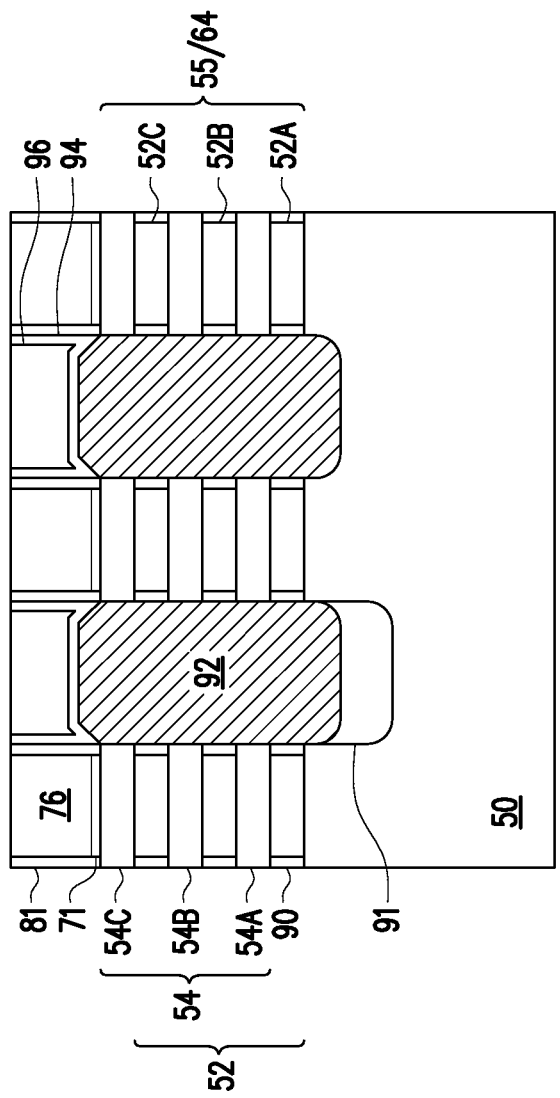

In FIGS. 14A through 14C, a planarization process, such as a CMP, may be performed to level the top surfaces of the first ILD 96 and the CESL 94 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, the first ILD 96, and the CESL 94 may be level with one another, within process variations. Accordingly, the top surfaces of the dummy gates 76 are exposed through the first ILD 96. In some embodiments, the masks 78 may remain, in which case the planarization process levels top surfaces of the first ILD 96 with top surfaces of the masks 78, the first spacers 81, and the CESL 94.

Figure 15B:
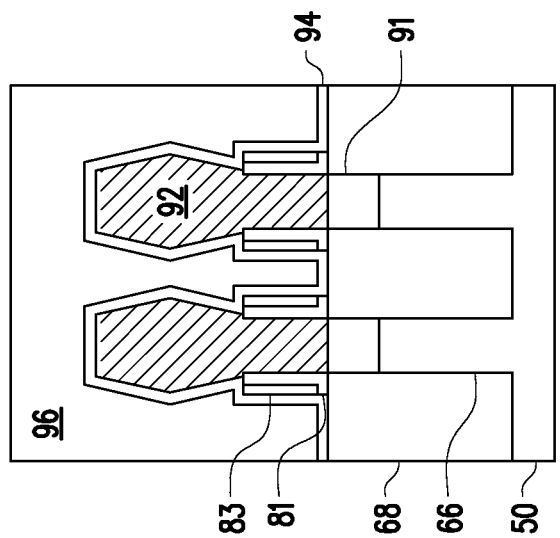
Figure 15A:
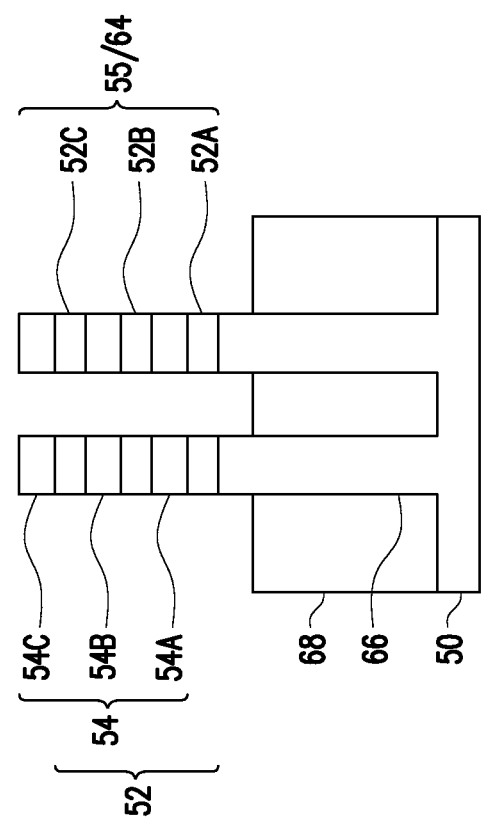
Figure 15C:
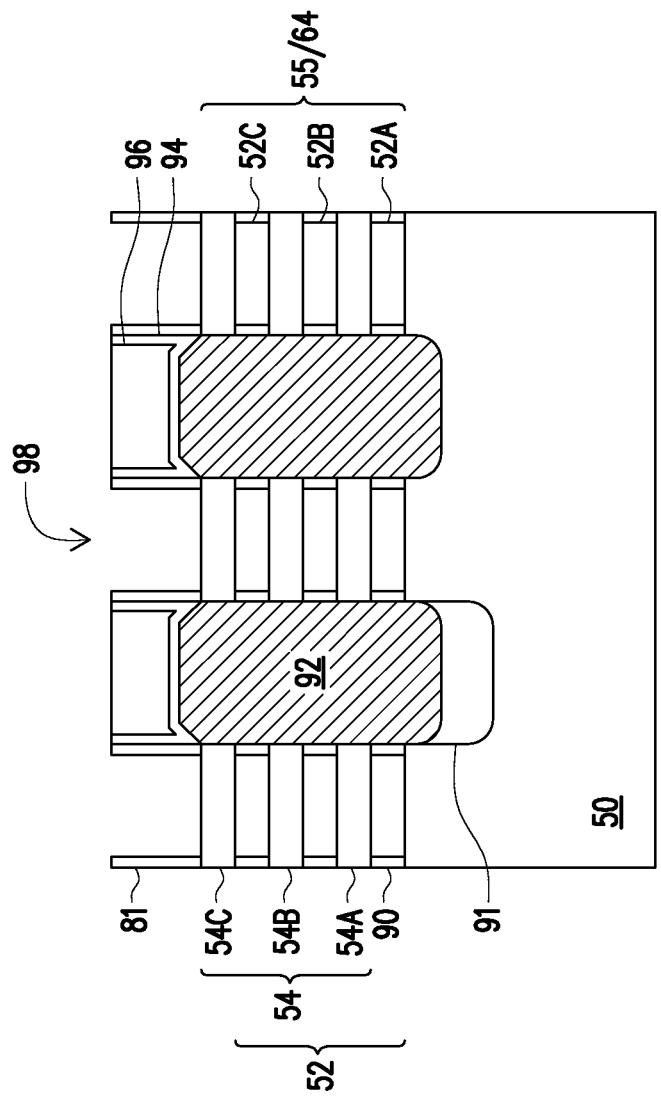

In FIGS. 15A through 15C, the dummy gates 76, and the masks 78 if present, are removed in one or more etching steps, forming recesses 98. Portions of the dummy gate dielectrics 71 in the recesses 98 are also be removed. In some embodiments, the dummy gates 76 and the dummy gate dielectrics 71 are removed by an anisotropic dry etch process. For example, the etching process may include a dry etch process using reaction gas(es) that selectively etch the dummy gates 76 at a faster rate than the first ILD 96, the CESL 94, or the first spacers 81. Each of the recesses 98 exposes and/or overlies portions of nanostructures 55, which act as channel regions in subsequently completed nanoFETs. Portions of the nanostructures 55 which act as the channel regions are disposed between neighboring pairs of the epitaxial source/drain regions 92. During the removal, the dummy gate dielectrics 71 may be used as etch stop layers when the dummy gates 76 are etched. The dummy gate dielectrics 71 may then be removed after the removal of the dummy gates 76.

Figure 16B:
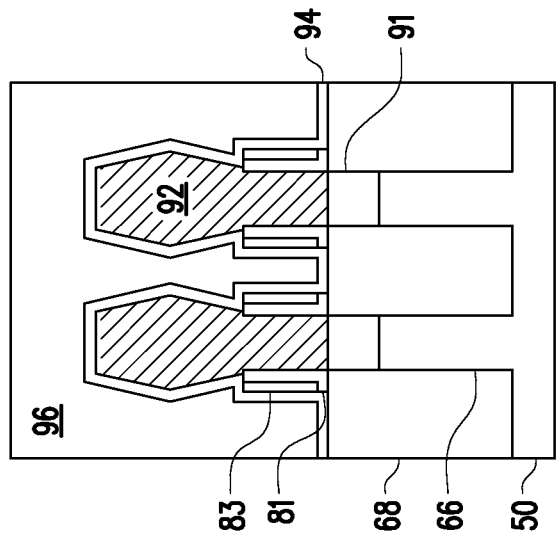
Figure 16A:
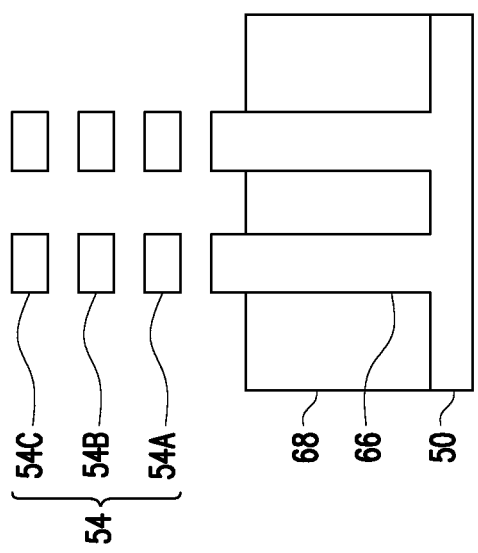
Figure 16C:
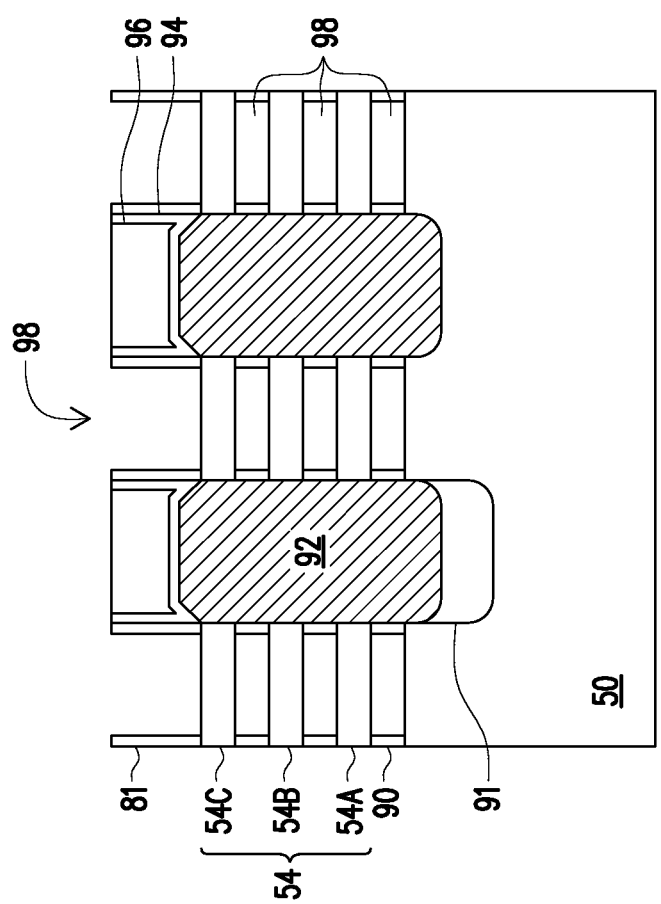

In FIGS. 16A through 16C, the first nanostructures 52 are removed extending the recesses 98. The first nanostructures 52 may be removed by performing an isotropic etching process, such as wet etching or the like, using etchants which are selective to the materials of the first nanostructures 52, while the second nanostructures 54, the substrate 50, the STI regions 68, the first ILD 96, the CESL 94, the first spacers 81, and the first inner spacers 90 remain relatively un-etched as compared to the first nanostructures 52. In embodiments in which the second nanostructures 54 include, e.g., Si or SiC, and the first nanostructures 52 include, e.g., SiGe, tetramethylammonium hydroxide (TMAH), ammonium hydroxide ($NH_4OH$), or the like may be used to remove the first nanostructures 52.

Figure 17B:
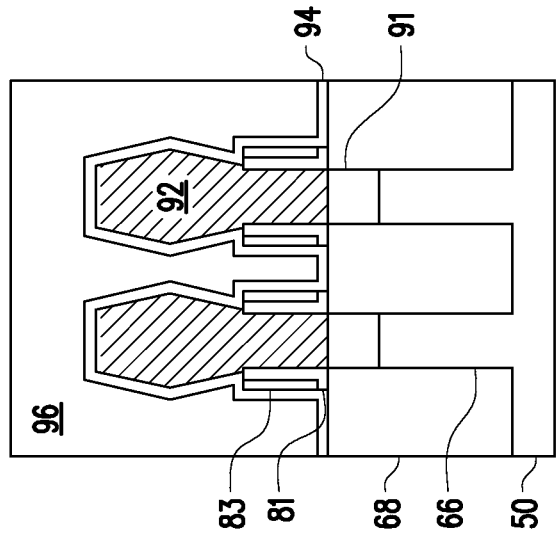
Figure 17A:
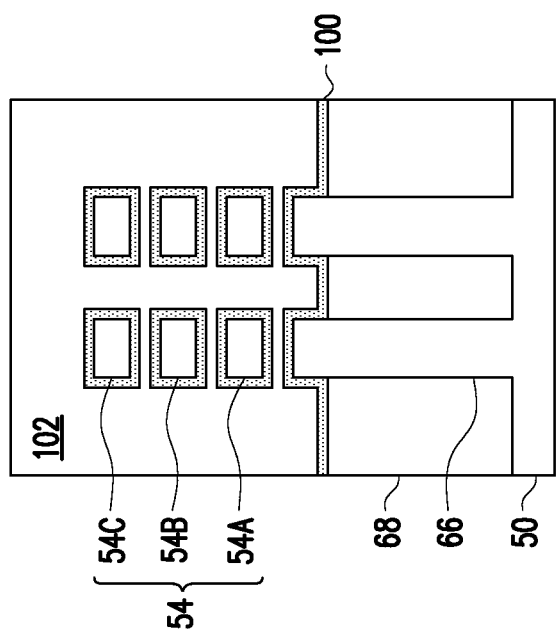
Figure 17C:
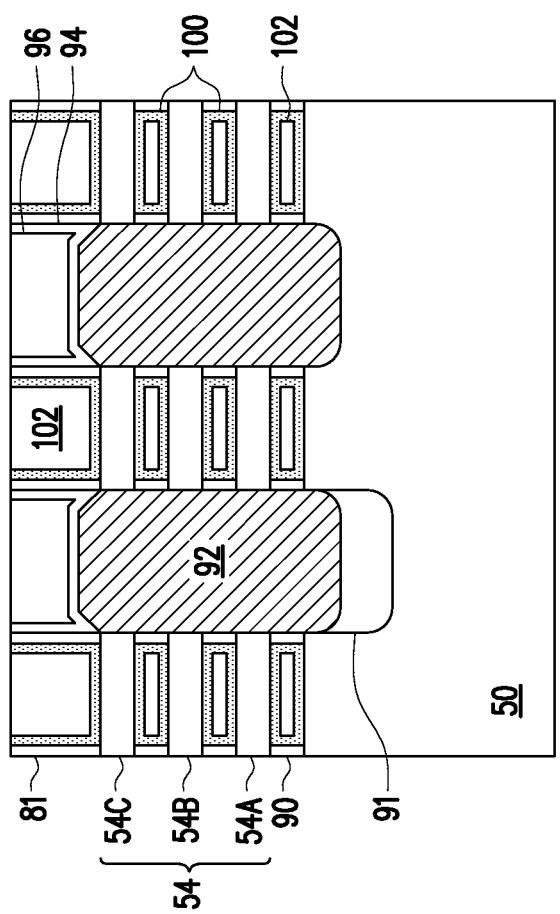

In FIGS. 17A through 17C, gate dielectric layers 100 and gate electrodes 102 are formed for replacement gates. The gate dielectric layers 100 are deposited conformally in the recesses 98. The gate dielectric layers 100 may be formed on top surfaces, sidewalls, and bottom surfaces of the second nanostructures 54. The gate dielectric layers 100 may also be deposited on top surfaces of the first ILD 96, the CESL 94, the first spacers 81, and the STI regions 68.

In accordance with some embodiments, the gate dielectric layers 100 comprise one or more dielectric layers, such as an oxide, a metal oxide, the like, or combinations thereof. For example, in some embodiments, the gate dielectric layers 100 may comprise a silicon oxide layer and a metal oxide layer over the silicon oxide layer. In some embodiments, the gate dielectric layers 100 include a high-k dielectric material, and in these embodiments, the gate dielectric layers 100 may have a k-value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, or the like.

The gate electrodes 102 are deposited over the gate dielectric layers 100 and fill remaining portions of the recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single-layer gate electrodes 102 are illustrated in FIGS. 17A and 17C, the gate electrodes 102 may comprise any number of liner layers, any number of work function tuning layers, and a fill material. Any combination of the layers that make up the gate electrodes 102 may be deposited between adjacent ones of the second nanostructures 54.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the recesses 98, a planarization process, such as a CMP, may be performed to remove the excess portions of the gate dielectric layers 100 and the material of the gate electrodes 102, which excess portions are over the top surfaces of the first ILD 96, the first spacers 81, and the CESL 94. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 18B:
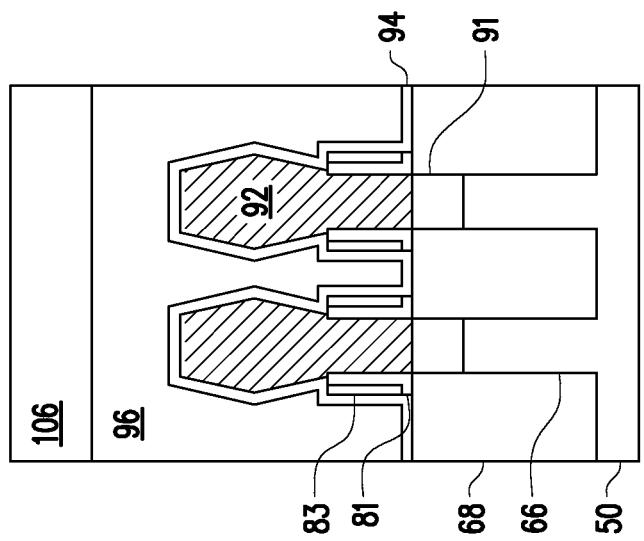
Figure 18A:
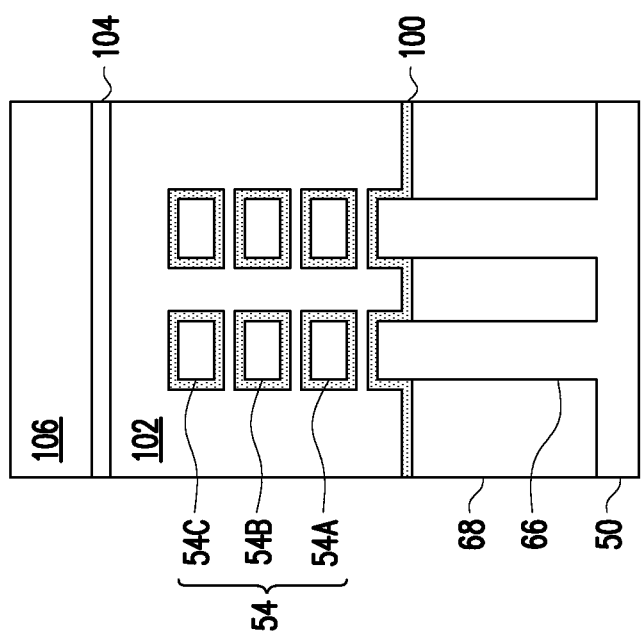
Figure 18C:
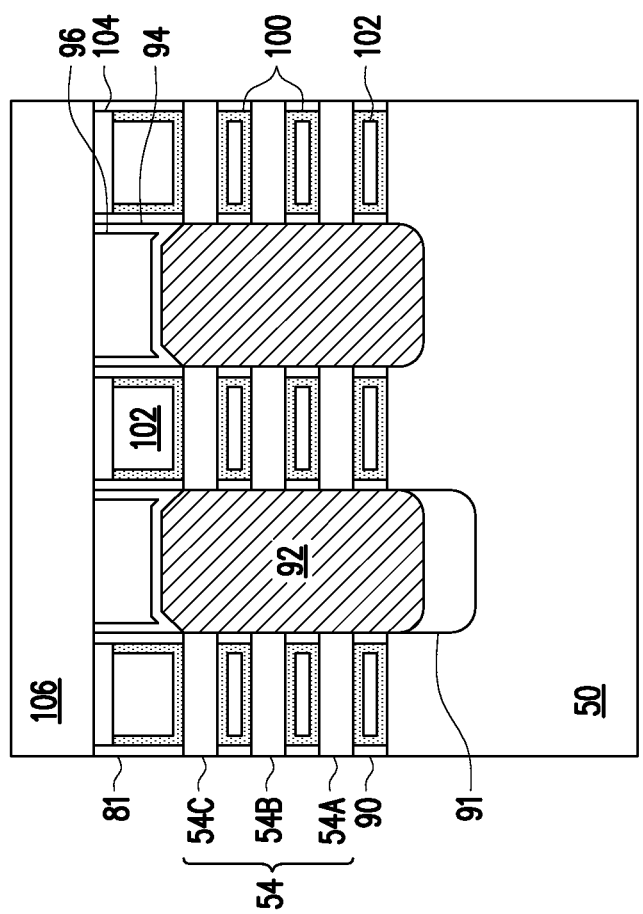

In FIGS. 18A through 18C, the gate structures (including the gate dielectric layers 100 and the corresponding overlying gate electrodes 102) are recessed, so that recesses are formed directly over each of the gate structures and between opposing portions of the first spacers 81. Gate masks 104 comprising one or more layers of dielectric material, such as silicon nitride, silicon oxynitride, or the like, are filled in the recesses, followed by a planarization process to remove excess portions of the dielectric material extending over the first ILD 96, the CESL 94, and the first spacers 81. Subsequently formed gate contacts (such as the gate contacts 114, discussed below with respect to FIGS. 20A and 20C) penetrate through the gate masks 104 to contact the top surface of the recessed gate electrodes 102.

As further illustrated by FIGS. 18A through 18C, a second ILD 106 is deposited over the first ILD 96, the CESL 94, and the gate masks 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 19B:
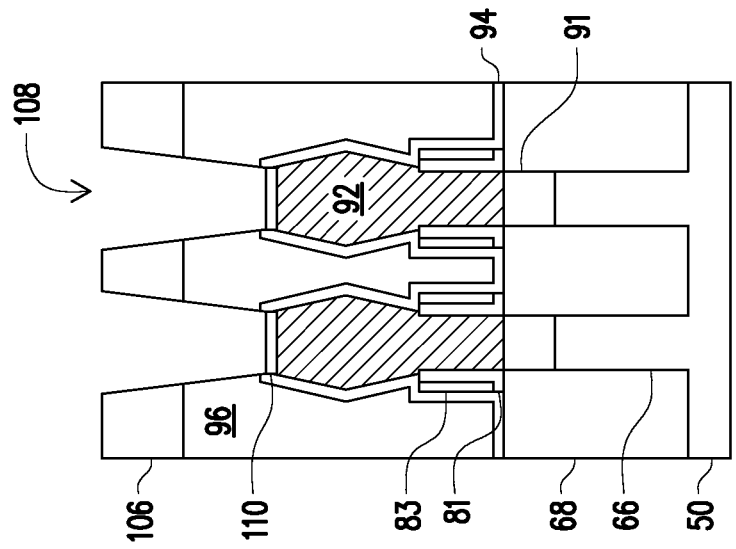
Figure 19A:
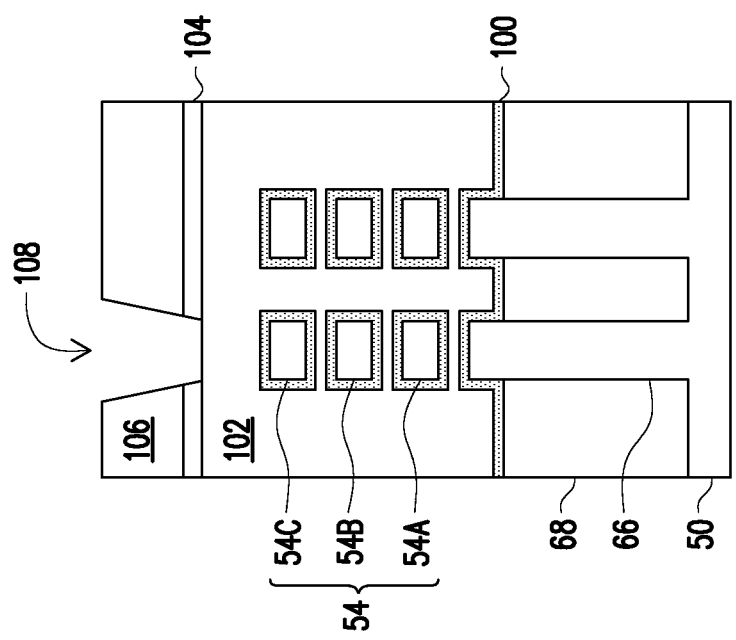
Figure 19C:
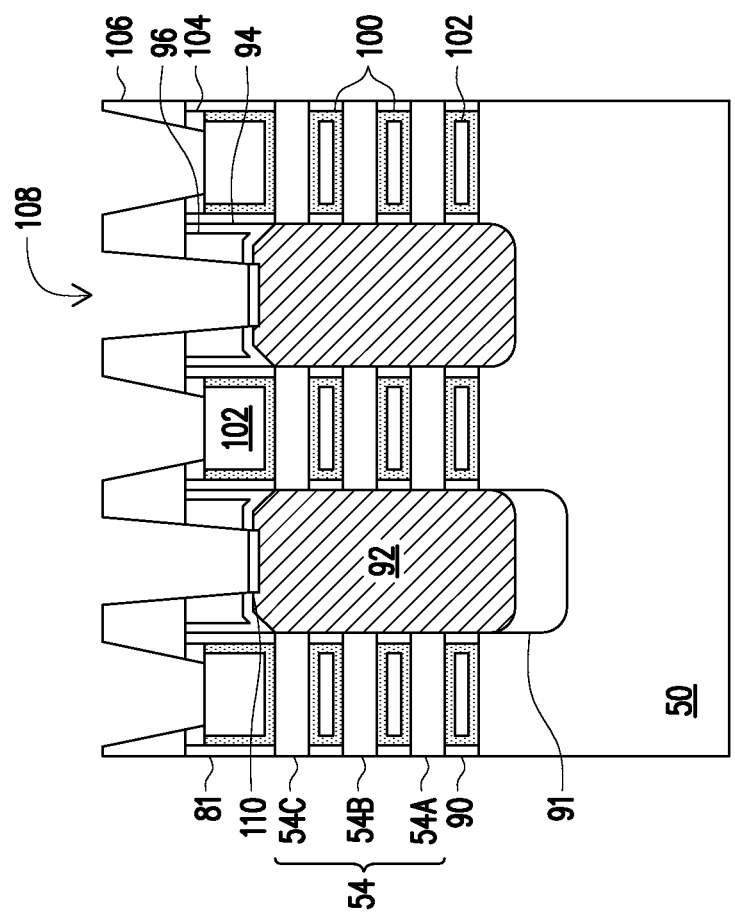

In FIGS. 19A through 19C, the second ILD 106, the first ILD 96, the CESL 94, and the gate masks 104 are etched to form recesses 108 exposing surfaces of the epitaxial source/drain regions 92 and/or the gate structures. The recesses 108 may be formed by etching using an anisotropic etching process, such as RIE, NBE, or the like. In some embodiments, the recesses 108 may be etched through the second ILD 106 and the first ILD 96 using a first etching process; may be etched through the gate masks 104 using a second etching process; and may be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the recesses 108 may extend into the epitaxial source/drain regions 92 and/or the gate structures. Bottom surfaces of the recesses 108 may be level with (e.g., at a same level, or having a same distance from the substrate 50), or lower than (e.g., closer to the substrate 50) top surfaces of the epitaxial source/drain regions 92 and/or the gate structures. Although FIG. 19C illustrates the recesses 108 as exposing the epitaxial source/drain regions 92 and the gate structures in a same cross-section, in some embodiments, the epitaxial source/drain regions 92 and the gate structures may be exposed in different cross-sections, thereby reducing the risk of shorting subsequently formed contacts.

After the recesses 108 are formed, first silicide regions 110 are formed over the epitaxial source/drain regions 92. In some embodiments, the first silicide regions 110 are formed by first depositing a metal (not separately illustrated) capable of reacting with the semiconductor materials of the underlying epitaxial source/drain regions 92 (e.g., silicon, silicon germanium, germanium, or the like) to form silicide or germanide regions. The metal may include nickel, cobalt, titanium, tantalum, platinum, tungsten, other noble metals, other refractory metals, rare earth metals or their alloys. The metal may be deposited over the exposed portions of the epitaxial source/drain regions 92, then a thermal anneal process may be performed to form the first silicide regions 110. The unreacted portions of the deposited metal are then removed by, e.g., an etching process. Although the first silicide regions 110 are referred to as silicide regions, the first silicide regions 110 may also be germanide regions, or silicon germanide regions (e.g., regions comprising silicon and germanium), or the like. In an embodiment, the first silicide regions 110 comprise TiSi, and have thicknesses ranging from about 2 nm to about 10 nm.

Figure 20C:
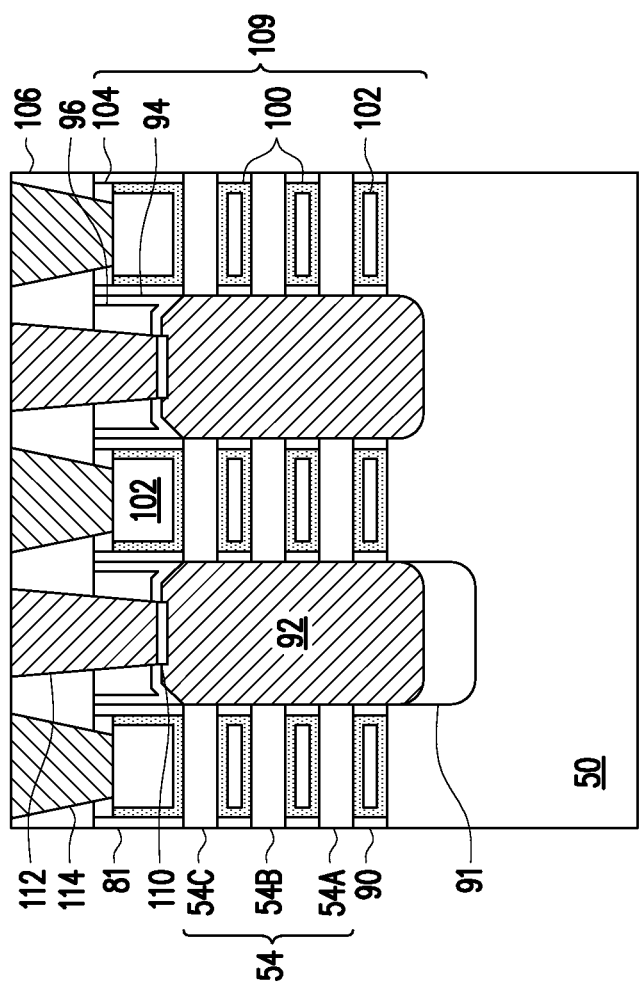

In FIGS. 20A through 20C, source/drain contacts 112 and gate contacts 114 (also referred to as contact plugs) are formed in the recesses 108. The source/drain contacts 112 and the gate contacts 114 may each comprise one or more layers, such as barrier layers, diffusion layers, and conductive fill materials. For example, in some embodiments, the source/drain contacts 112 and the gate contacts 114 each include a barrier layer and a conductive fill material. The source/drain contacts 112 and the gate contacts 114 are each electrically coupled to the underlying conductive feature (e.g., the gate electrodes 102 or the first silicide regions 110 over the epitaxial source/drain regions 92 in the illustrated embodiment). The gate contacts 114 are electrically coupled to the gate electrodes 102, and the source/drain contacts 112 are electrically coupled to the first silicide regions 110 over the epitaxial source/drain regions 92. The barrier layer may include titanium, titanium nitride, tantalum, tantalum nitride, or the like. The conductive fill material may be copper, a copper alloy, silver, gold, tungsten, cobalt, aluminum, nickel, or the like. A planarization process, such as a CMP, may be performed to remove excess portions of the source/drain contacts 112 and the gate contacts 114, which excess portions are over top surfaces of the second ILD 106.

Although FIGS. 20A through 20C illustrate a source/drain contact 112 extending to each of the epitaxial source/drain regions 92, the source/drain contacts 112 may be omitted from certain ones of the epitaxial source/drain regions 92. For example, as explained below, conductive lines (e.g., power rails) may be subsequently attached through a backside of one or more of the epitaxial source/drain regions 92. For these particular epitaxial source/drain regions 92, the source/drain contacts 112 may be omitted or may be dummy contacts that are not electrically coupled to any overlying conductive lines (such as the conductive features 122, discussed below with respect to FIGS. 21A through 21C).

The processes of FIGS. 2 through 20C form a device layer 109 that includes a plurality of active devices. Although the device layer 109 is described as including nanoFETs, other embodiments may include device layers 109 that include different types of transistors, such as planar FETs, FinFETs, thin film transistors (TFTs), or the like. The device layer may include the epitaxial source/drain regions 92, the second nanostructures 54, and the gate structures (including the gate dielectric layers 100 and the gate electrodes 102). A first interconnect structure (such as the front-side interconnect structure 120, discussed below with respect to FIGS. 21A through 21C) may be formed over a front-side of the device layer 109 and a second interconnect structure (such as the backside interconnect structure 140, discussed below with respect to FIGS. 27A through 27C) may be formed over a backside of the device layer 109.

FIGS. 21A through 27C illustrate intermediate steps of forming front-side interconnect structures and backside interconnect structures on the device layer 109. The front-side interconnect structures and the backside interconnect structures may each comprise conductive features that are electrically coupled to devices in the device layer 109 (e.g., the nano-FETs). In FIGS. 21A through 27C, figures ending in "A" illustrate a cross-sectional view along line A-A' of FIG. 1, figures ending in "B" illustrate a cross-sectional view along line B-B' of FIG. 1, and figures ending in "C" illustrate a cross-sectional view along line C-C' of FIG. 1. The process steps described in FIGS. 21A through 27C may be applied to both the n-type region 50N and the p-type region 50P. As noted above, a backside conductive feature (e.g., a backside via or a power rail) may be electrically coupled to one or more of the epitaxial source/drain regions 92. As such, the source/drain contacts 112 may be optionally omitted from the epitaxial source/drain regions 92.

Figure 21C:
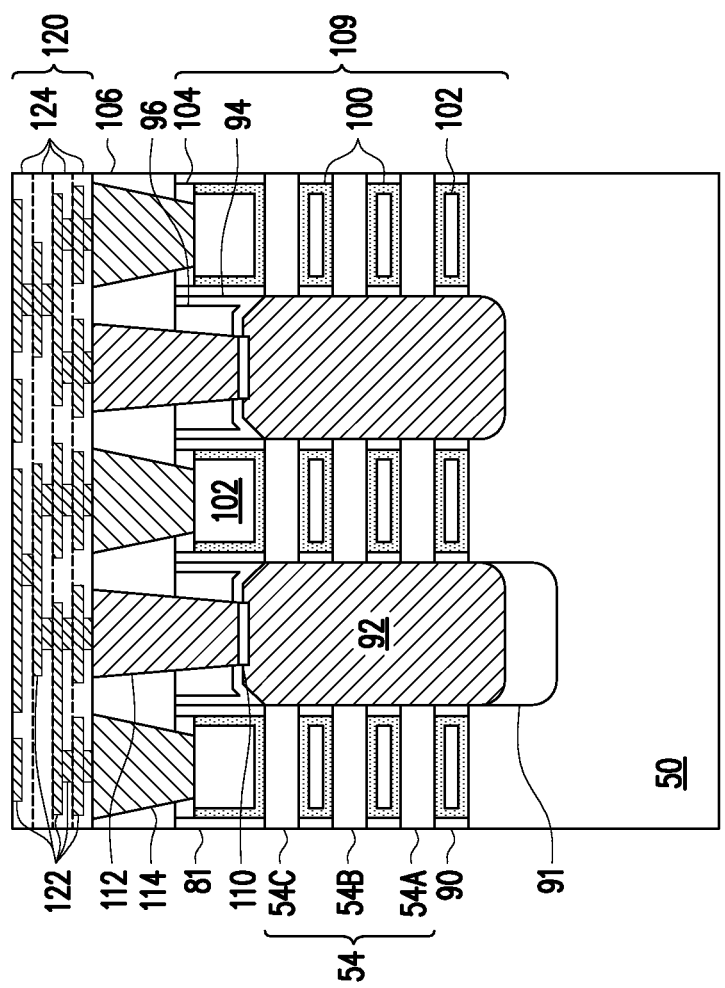

In FIGS. 21A through 21C, a front-side interconnect structure 120 is formed on the second ILD 106. The front-side interconnect structure 120 may be referred to as a front-side interconnect structure because it is formed on a front-side of the device layer 109 (e.g., a side of the device layer 109 opposite the substrate 50 on which active devices are formed).

The front-side interconnect structure 120 may comprise one or more layers of conductive features 122 formed in one or more stacked dielectric layers 124. Each of the stacked dielectric layers 124 may comprise a dielectric material, such as a low-k dielectric material, an extra low-k (ELK) dielectric material, or the like. The dielectric layers 124 may be deposited using an appropriate process, such as, CVD, ALD, PVD, PECVD, or the like.

The conductive features 122 may comprise conductive lines and conductive vias interconnecting the layers of conductive lines. The conductive vias may extend through respective ones of the dielectric layers 124 to provide vertical connections between layers of the conductive lines. The conductive features 122 may be formed through any acceptable process, such as, a damascene process, a dual damascene process, or the like.

In some embodiments, the conductive features 122 may be formed using a damascene process in which a respective dielectric layer 124 is patterned utilizing a combination of photolithography and etching techniques to form trenches corresponding to the desired pattern of the conductive features 122. An optional diffusion barrier and/or optional adhesion layer may be deposited and the trenches may then be filled with a conductive material. Suitable materials for the barrier layer include titanium, titanium nitride, titanium oxide, tantalum, tantalum nitride, tantalum oxide, combinations thereof, or the like, and suitable materials for the conductive material include copper, silver, gold, tungsten, aluminum, cobalt, tungsten, ruthenium, combinations thereof, or the like. In an embodiment, the conductive features 122 may be formed by depositing a seed layer of copper or a copper alloy, and filling the trenches by electroplating. A CMP process or the like may be used to remove excess conductive material from a surface of the respective dielectric layer 124 and to planarize surfaces of the dielectric layer 124 and the conductive features 122 for subsequent processing.

FIGS. 21A through 21C illustrate four layers of the conductive features 122 and the dielectric layers 124 in the front-side interconnect structure 120. However, it should be appreciated that the front-side interconnect structure 120 may comprise any number of conductive features 122 disposed in any number of dielectric layers 124. The front-side interconnect structure 120 may be electrically coupled to the gate contacts 114 and the source/drain contacts 112 to form functional circuits. In some embodiments, the functional circuits formed by the front-side interconnect structure 120 may comprise logic circuits, memory circuits, image sensor circuits, or the like.

Figure 22B:
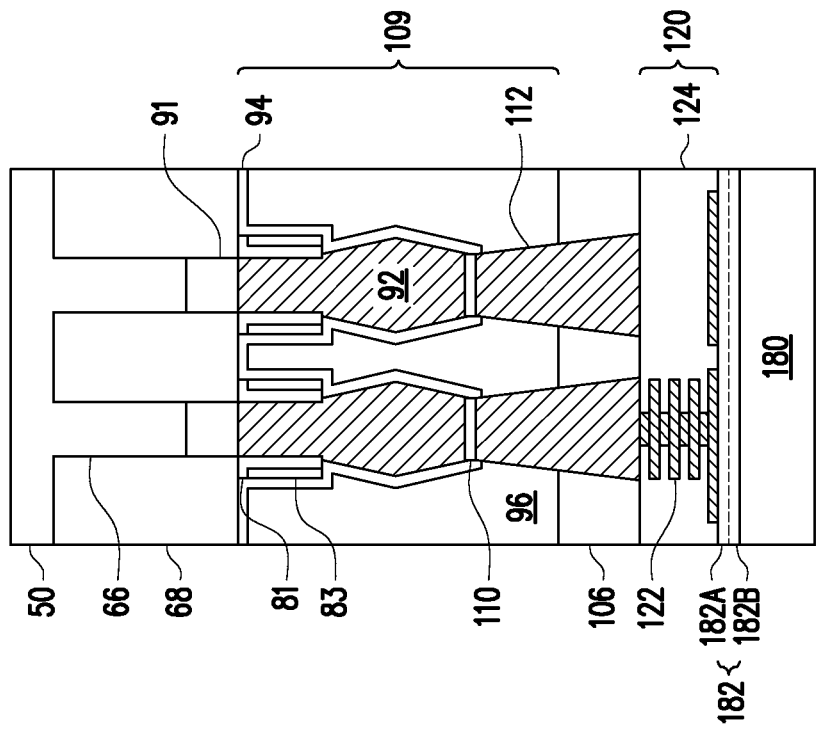
Figure 22A:
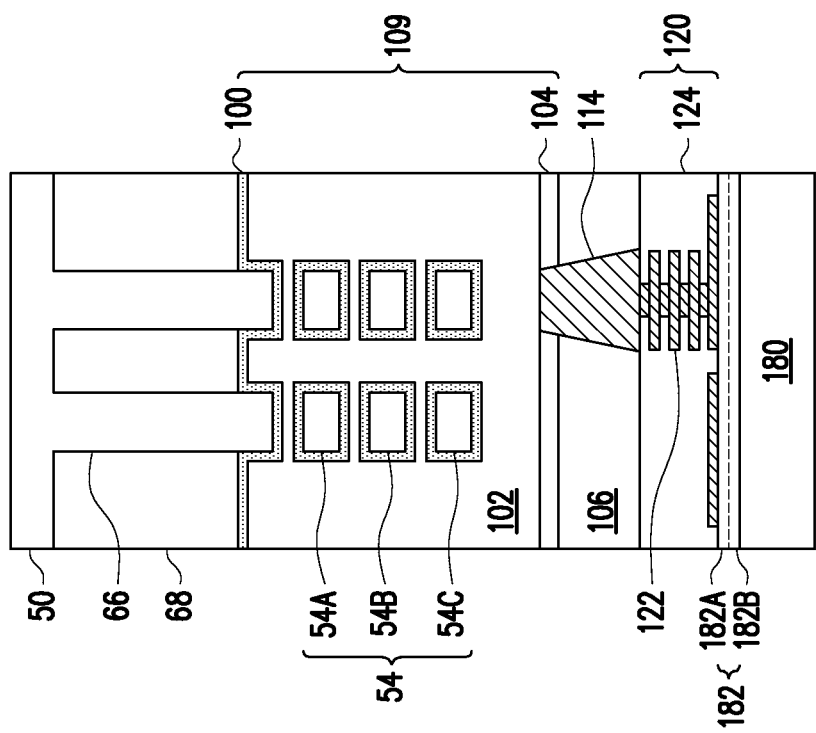
Figure 22C:
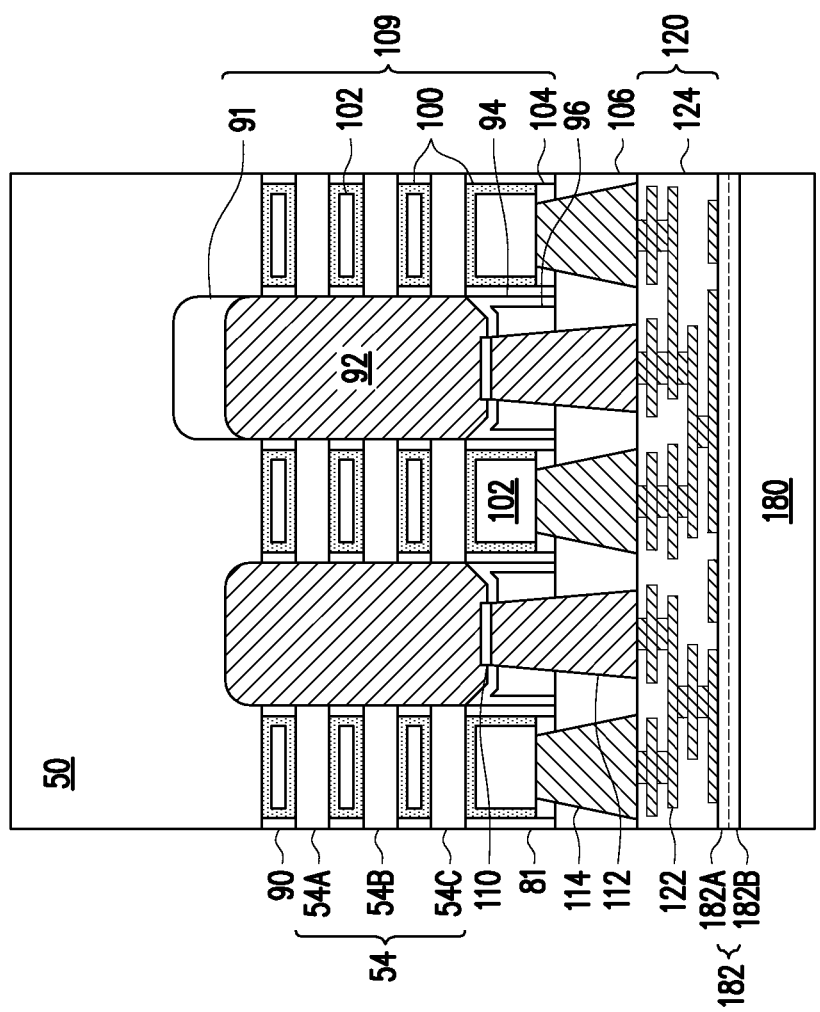

In FIGS. 22A through 22C, a carrier substrate 180 is bonded to a top surface of the front-side interconnect structure 120 by a first bonding layer 182A and a second bonding layer 182B (collectively referred to as bonding layers 182). The carrier substrate 180 may be a glass carrier substrate, a ceramic carrier substrate, a wafer (e.g., a silicon wafer), or the like. The carrier substrate 180 may provide structural support during subsequent processing steps and in the completed device.

In various embodiments, the carrier substrate 180 may be bonded to the front-side interconnect structure 120 using a suitable technique, such as dielectric-to-dielectric bonding, or the like. The dielectric-to-dielectric bonding may comprise depositing the first bonding layer 182A on the front-side interconnect structure 120. In some embodiments, the first bonding layer 182A comprises silicon oxide (e.g., a high-density plasma (HDP) oxide, or the like) that is deposited by CVD, ALD, PVD, or the like. The second bonding layer 182B may likewise be an oxide layer that is formed on a surface of the carrier substrate 180 prior to bonding using, for example, CVD, ALD, PVD, thermal oxidation, or the like. Other suitable materials may be used for the first bonding layer 182A and the second bonding layer 182B.

The dielectric-to-dielectric bonding process may further include applying a surface treatment to one or more of the first bonding layer 182A and the second bonding layer 182B. The surface treatment may include a plasma treatment. The plasma treatment may be performed in a vacuum environment. After the plasma treatment, the surface treatment may further include a cleaning process (e.g., a rinse with deionized water or the like) that may be applied to one or more of the bonding layers 182. The carrier substrate 180 is then aligned with the front-side interconnect structure 120 and the two are pressed against each other to initiate a pre-bonding of the carrier substrate 180 to the front-side interconnect structure 120. The pre-bonding may be performed at room temperature (e.g., between about 21° C. and about 25° C.). After the pre-bonding, an annealing process may be applied by, for example, heating the front-side interconnect structure 120 and the carrier substrate 180 to a temperature of about 170° C.

Further in FIGS. 22A through 22C, after the carrier substrate 180 is bonded to the front-side interconnect structure 120, the device may be flipped such that a backside of the device layer 109 faces upwards. The backside of the device layer 109 may refer to a side opposite to the front-side of the device layer 109.

Figure 23C:
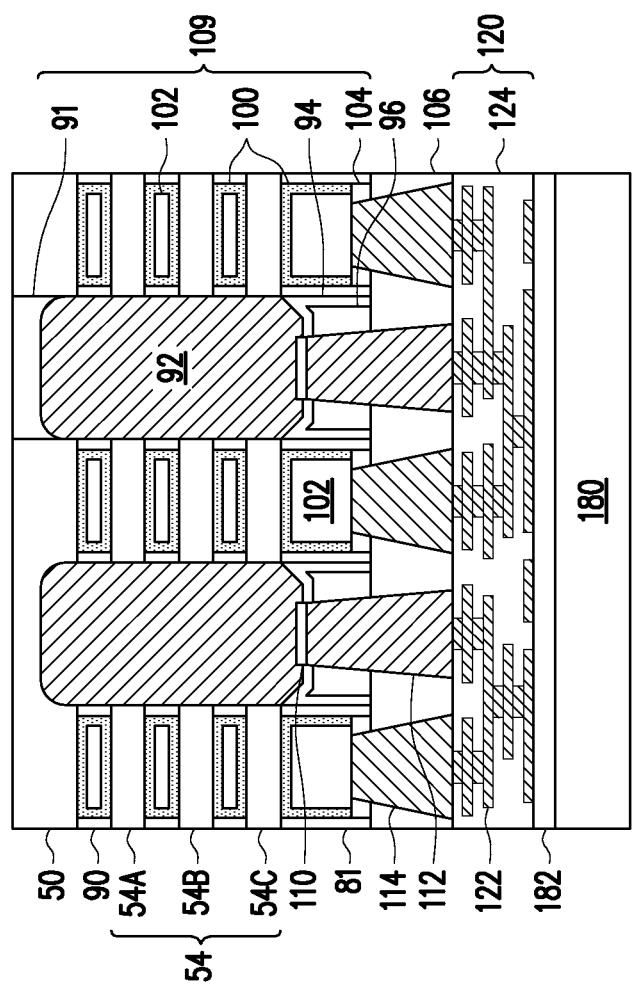

In FIGS. 23A through 23C, a thinning process is applied to the backside of the substrate 50. The thinning process may comprise a planarization process (e.g., a mechanical grinding, a CMP, or the like), an etch-back process, a combination thereof, or the like. The thinning process may expose surfaces of the epitaxial materials 91 opposite the front-side interconnect structure 120. Further, a portion of the substrate 50 may remain over the device layer 109 after the thinning process. As illustrated in FIGS. 23A through 23C, backside surfaces of the substrate 50, the epitaxial materials 91, the STI regions 68, and the fins 66 may be level with one another following the thinning process. In some embodiments, the fins 66 and the substrate 50 may be removed and replaced by a dielectric material, which may be the same as or similar to the second ILD 106.

Figure 24B:
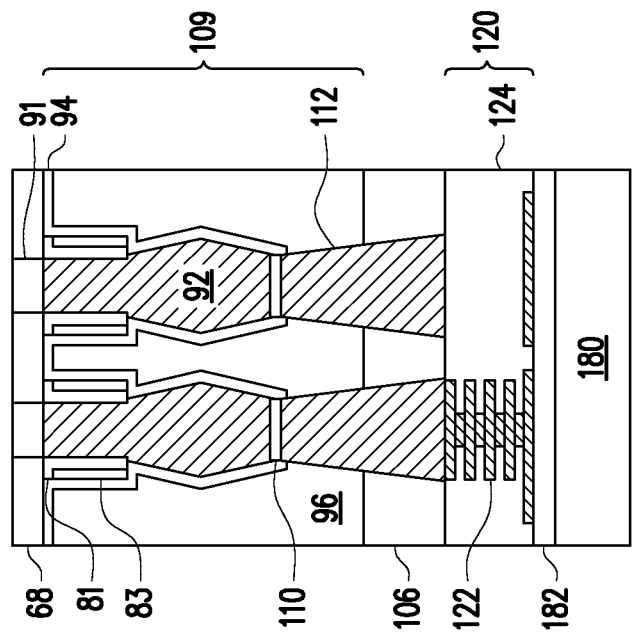
Figure 24A:
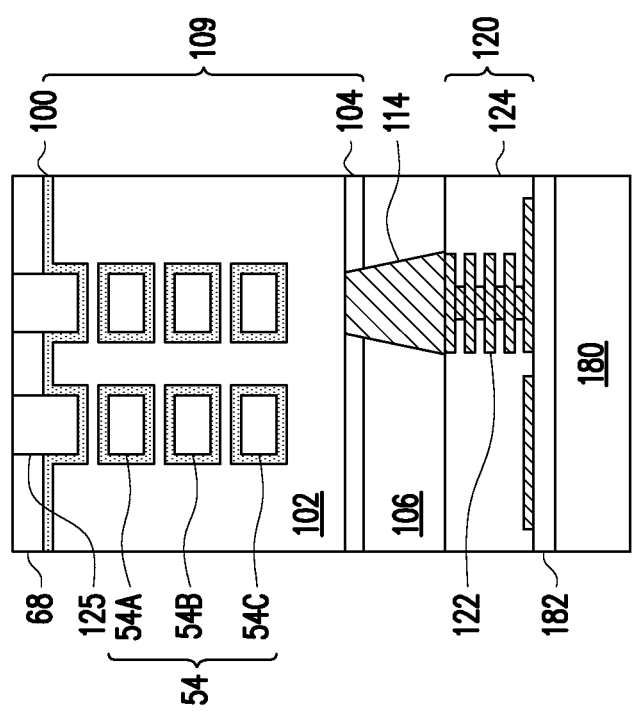
Figure 24C:
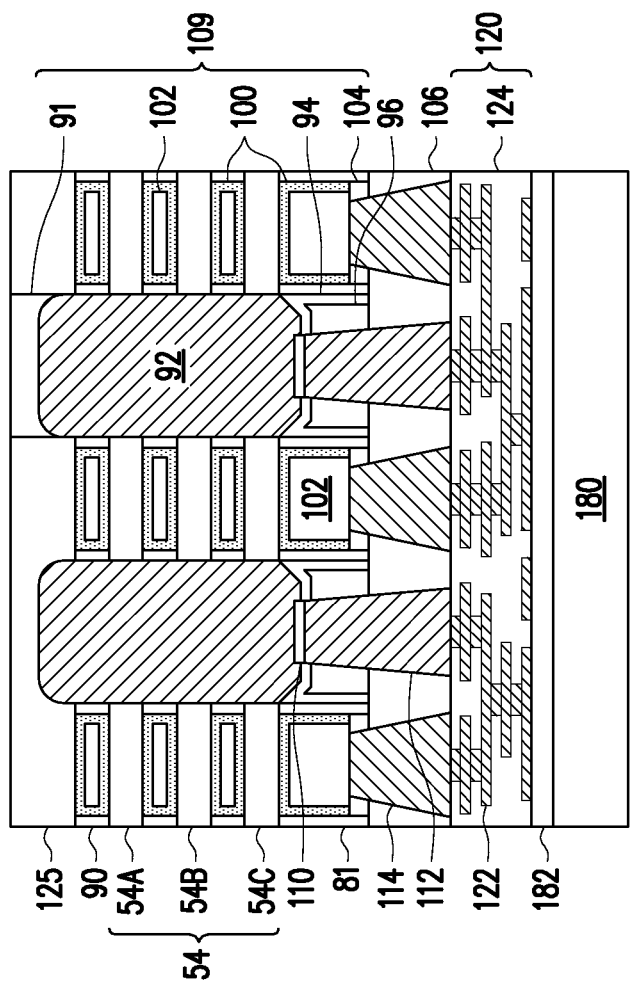

In FIGS. 24A through 24C, remaining portions of the fins 66 and the substrate 50 are removed and replaced with a dielectric layer 125. The fins 66 and the substrate 50 may be etched using a suitable etching process, such as an isotropic etching process (e.g., a wet etching process), an anisotropic etching process (e.g., a dry etching process), or the like. The etching process may be one that is selective to the material of the fins 66 and the substrate 50 (e.g., etches the material of the fins 66 and the substrate 50 at a faster rate than the material of the STI regions 68, the gate dielectric layers 100, the epitaxial source/drain regions 92, the epitaxial materials 91, and the first inner spacers 90). After etching the fins 66 and the substrate 50, surfaces of the STI regions 68, the gate dielectric layers 100, the epitaxial source/drain regions 92, the epitaxial materials 91, and the first inner spacers 90 may be exposed.

The dielectric layer 125 is then deposited on the backside of the device layer 109 in recesses formed by removing the fins 66 and the substrate 50. The dielectric layer 125 may be deposited over the STI regions 68, the gate dielectric layers 100, the epitaxial source/drain regions 92, the epitaxial materials 91, and the first inner spacers 90. The dielectric layer 125 may physically contact surfaces of the STI regions 68, the gate dielectric layers 100, the epitaxial source/drain regions 92, the epitaxial materials 91, and the first inner spacers 90. The dielectric layer 125 may be substantially similar to the second ILD 106, described above with respect to FIGS. 18A through 18C. For example, the dielectric layer 125 may be formed of a like material and using a like process as the second ILD 106. As illustrated in FIGS. 24A through 24C, a CMP process or the like may be used to remove material of the dielectric layer 125 such that top surfaces of the dielectric layer 125 are level with top surfaces of the STI regions 68 and the epitaxial materials 91. In some embodiments, the substrate 50 and the fins 66 may not be removed or replaced by the dielectric layer 125 and may remain as part of the device layer 109.

Figure 25B:
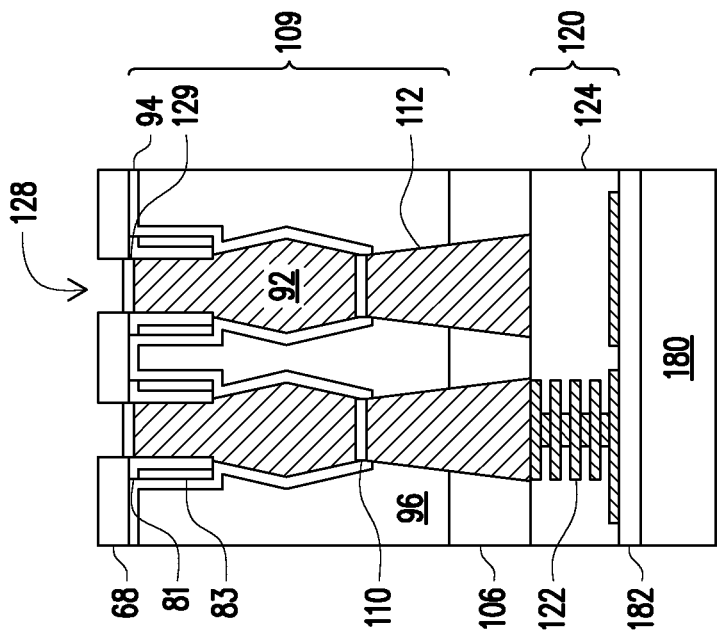
Figure 25A:
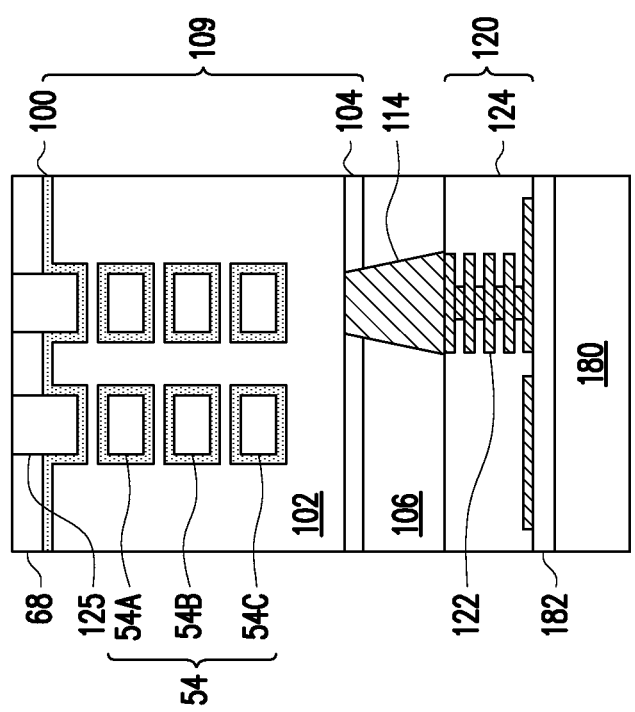
Figure 25C:
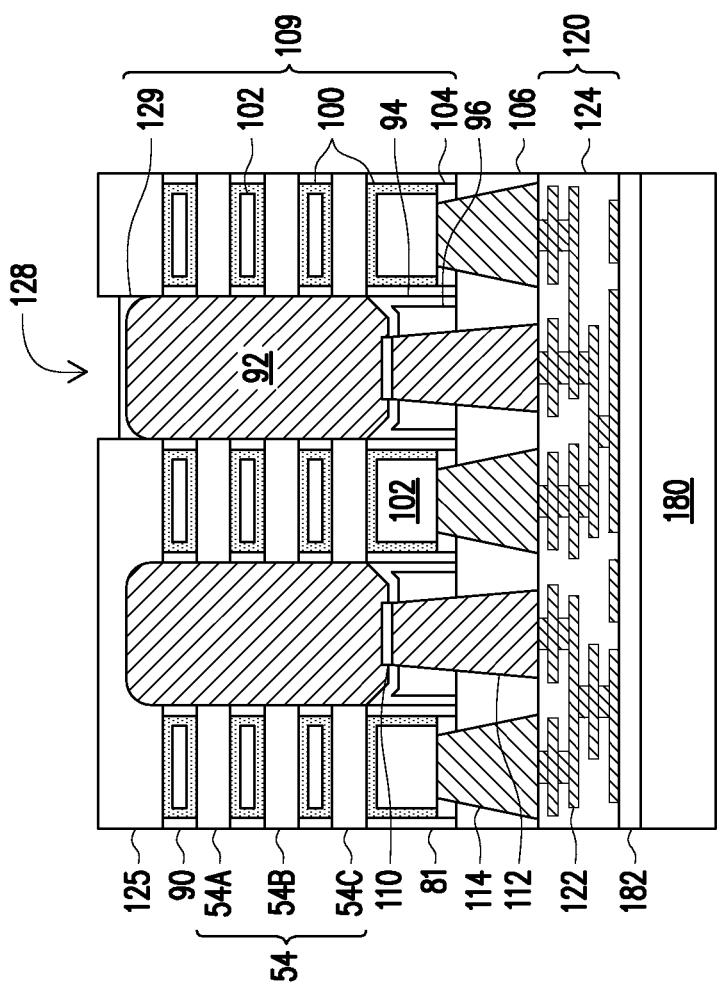

In FIGS. 25A through 25C, the epitaxial materials 91 are removed to form recesses 128 and second silicide regions 129 are formed in the recesses 128. The epitaxial materials 91 may be removed by a suitable etching process, which may be an isotropic etching process, such as a wet etching process. The etching process may have a high etch selectivity to materials of the epitaxial materials 91. As such, the epitaxial materials 91 may be removed without significantly removing materials of the dielectric layer 125, the STI regions 68, or the epitaxial source/drain regions 92. The recesses 128 may expose sidewalls of the STI regions 68, backside surfaces of the epitaxial source/drain regions 92, and sidewalls of the dielectric layer 125.

Second silicide regions 129 may then be formed in the recesses 128 on backsides of the epitaxial source/drain regions 92. The second silicide regions 129 may be similar to the first silicide regions 110, described above with respect to FIGS. 19A through 19C. For example, the second silicide regions 129 may be formed of a like material and using a like process as the first silicide regions 110.

Figure 26C:
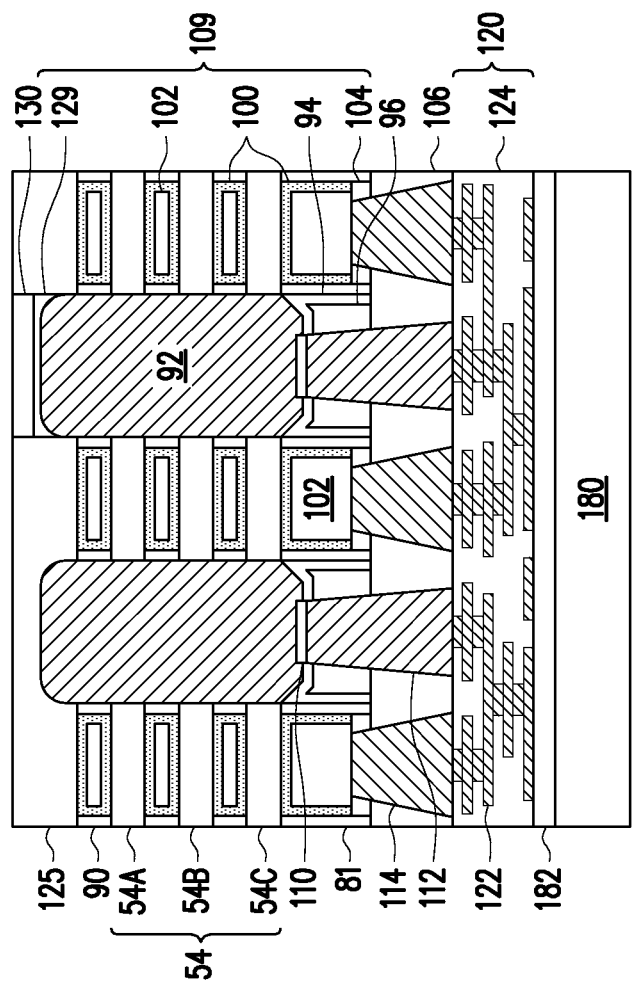

In FIGS. 26A through 26C, backside vias 130 are formed in the recesses 128. The backside vias 130 may extend through the dielectric layer 125 and the STI regions 68 and may be electrically coupled to the epitaxial source/drain regions 92 through the second silicide regions 129. The backside vias 130 may be similar to the source/drain contacts 112, described above with respect to FIGS. 20A through 20C. For example, the backside vias 130 may be formed of a like material and using a like process as the source/drain contacts 112. The backside vias 130 may include copper, a copper alloy, silver, gold, tungsten, cobalt, aluminum, nickel, ruthenium, or the like. A planarization process, such as a CMP, may be performed to remove excess portions of the backside vias 130, which excess portions are over top surfaces of the STI regions 68 and the dielectric layer 125.

Figure 27A:
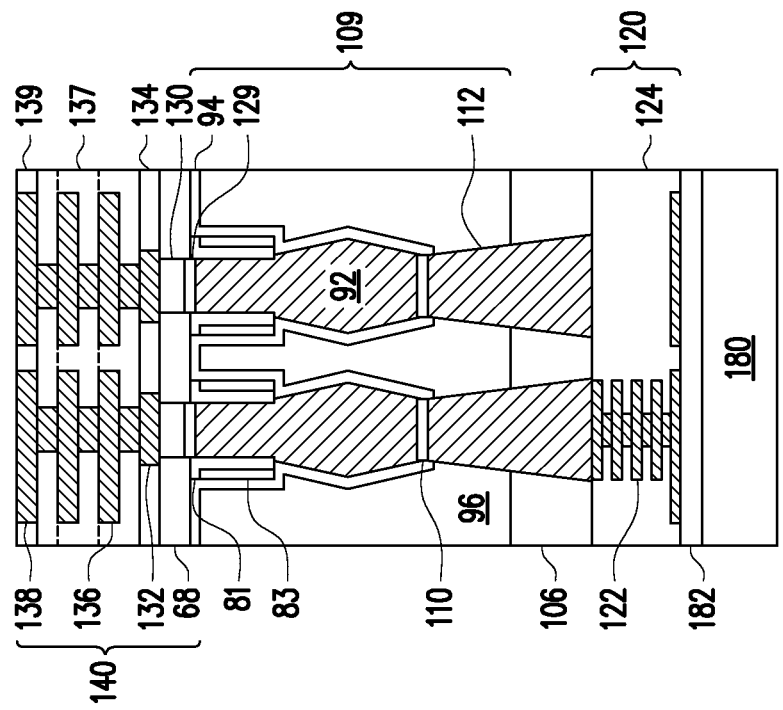
Figure 27B:
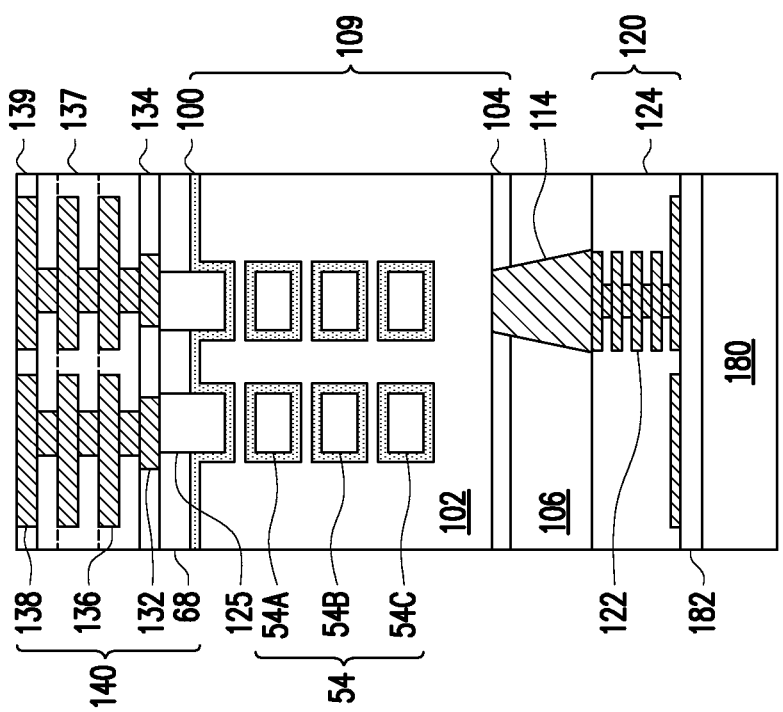
Figure 27C:
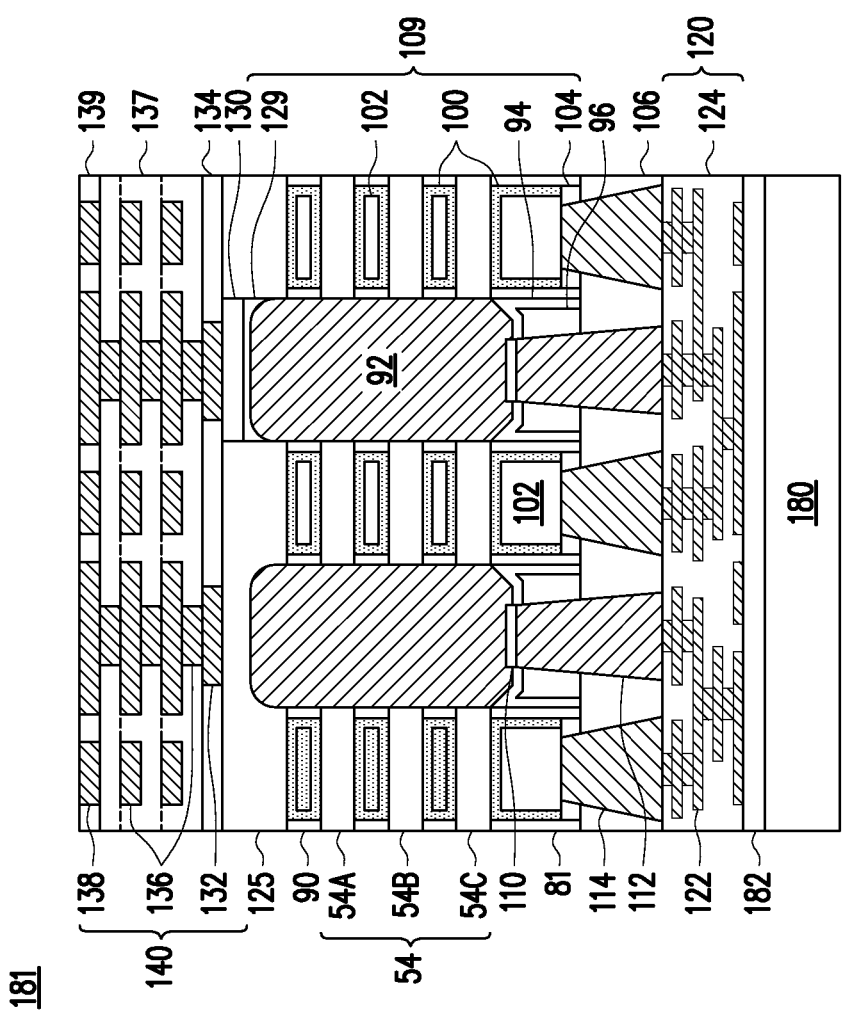

In FIGS. 27A through 27C, remaining portions of a backside interconnect structure 140 are formed over the backside vias 130, the dielectric layer 125, and the STI regions 68. The backside interconnect structure 140 may be referred to as a backside interconnect structure because it is formed on a backside of the device layer 109 (e.g., a side of the device layer 109 opposite the side of the device layer 109 on which active devices are formed). The backside interconnect structure 140 includes conductive lines 132, a dielectric layer 134, conductive features 136, dielectric layers 137, a redistribution layer 138, and a passivation layer 139. The dielectric layer 134 may be formed of materials and in a manner the same as or similar to the second ILD 106, described above with respect to FIGS. 18A through 18C.

The conductive lines 132 are formed in the dielectric layer 134. Forming the conductive lines 132 may include patterning recesses in the dielectric layer 134 using a combination of photolithography and etching processes, for example. A pattern of the recesses in the dielectric layer 134 may correspond to a pattern of the conductive lines 132. The conductive lines 132 are then formed by depositing a conductive material in the recesses. In some embodiments, the conductive lines 132 comprise a metal layer, which may be a single layer or a composite layer comprising a plurality of sub-layers formed of different materials. In some embodiments, the conductive lines 132 comprise copper, aluminum, cobalt, tungsten, titanium, tantalum, ruthenium, or the like. An optional diffusion barrier and/or optional adhesion layer may be deposited prior to filling the recesses with the conductive material. Suitable materials for the barrier layer/adhesion layer include titanium, titanium nitride, titanium oxide, tantalum, tantalum nitride, tantalum oxide, or the like. The conductive lines 132 may be formed using, for example, CVD, ALD, PVD, plating, or the like. The conductive lines 132 are electrically coupled to the epitaxial source/drain regions 92 through the backside vias 130 and the second silicide regions 129. A planarization process (e.g., a CMP, a grinding, an etch-back, or the like) may be performed to remove excess portions of the conductive lines 132 formed over the dielectric layer 134.

In some embodiments, the conductive lines 132 are backside power rails, which are conductive lines that electrically couple the epitaxial source/drain regions 92 to a reference voltage, a supply voltage, or the like. By placing the power rails on the backside of the semiconductor die, rather than on the front-side of the semiconductor die, advantages may be achieved. For example, a gate density of the nano-FETs and/or interconnect density of the front-side interconnect structure 120 may be increased. Further, the backside of the semiconductor die may accommodate wider power rails, reducing resistance and increasing efficiency of power delivery to the nano-FETs. For example, a width of the conductive lines 132 may be at least twice a width of first level conductive lines (e.g., the conductive features 122) of the front-side interconnect structure 120.

The remainder of the backside interconnect structure 140 may be similar to the front-side interconnect structure 120. For example, the backside interconnect structure 140 may be formed of materials and by processes the same as or similar to those of the front-side interconnect structure 120. The backside interconnect structure 140 may include stacked layers of conductive features 136 formed in stacked dielectric layers 137. The conductive features 136 may include conductive lines (e.g., for routing to and from subsequently formed contact pads and conductive connectors, such as external connectors). The conductive features 136 may include conductive vias that extend in the dielectric layers 137 to provide vertical interconnection between stacked layers of the conductive lines. The conductive features 136 may include one or more embedded passive devices, such as resistors, capacitors, inductors, or the like. The embedded passive devices may be integrated with the conductive lines 132 (e.g., the power rail) to provide circuits (e.g., power circuits) on the backside of the nano-FETs.

The redistribution layer 138 and the passivation layer 139 are formed over the conductive features 136 and the dielectric layers 137. The passivation layer 139 may include polymers such as PBO, polyimide, BCB, or the like. In some embodiments, the passivation layer 139 may include non-organic dielectric materials such as silicon oxide, silicon nitride, silicon carbide, silicon oxynitride, or the like. The passivation layer 139 may be deposited by, for example, CVD, PVD, ALD, or the like.

The redistribution layer 138 is formed through the passivation layer 139 to the conductive features 136. In some embodiments, the redistribution layer 138 may be used to provide input/output connections to other electrical components, such as, other device dies, redistribution structures, printed circuit boards (PCBs), motherboards, or the like. The redistribution layer 138 may be referred to as backside input/output pads that may provide signal, supply voltage, and/or ground connections to the nano-FETs. The redistribution layer 138 may be used to provide a heat dissipation path from the device layers 109 through the backside interconnect structure 140. The redistribution layer 138 may include one or more layers of copper, nickel, gold, or the like, which are formed by a plating process, or the like.

Figure 28:
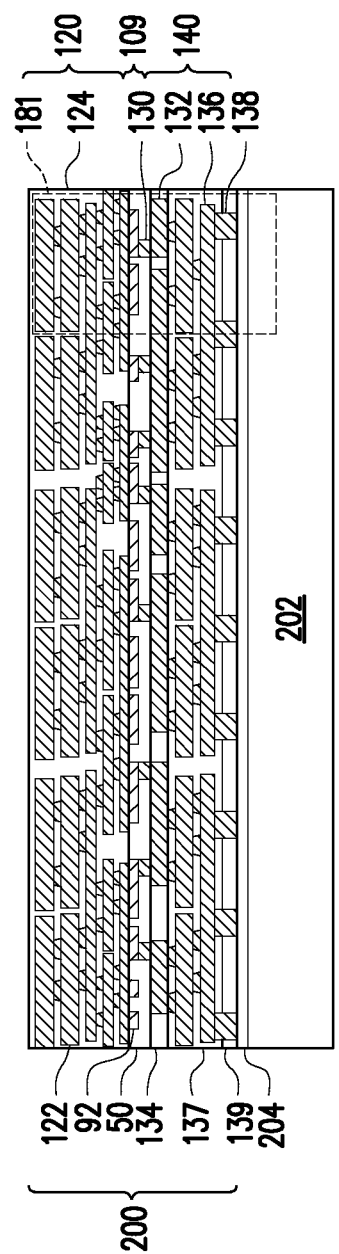
FIGS. 28, 29, 30, 31, 32, 33, 34, 35, 36, 37, 38, 39, 40, 41, 42, 43, 44A, 44B, 45A, 45B, 46, 47, 48A, 48B, 48C, 49, 50A, 50B, 50C, 51, 52, 53, 54, 55, 56, 57, 58, 59A, 59B, 59C, and 60 are cross-sectional and top-down views of intermediate stages in the manufacturing of packaged semiconductor devices including heat-dissipating structures, in accordance with some embodiments.

As will be discussed below, the structure of FIGS. 27A through 27C may be a portion of a device die. For example, FIG. 27C illustrates a region 181 of a device die 200, which is illustrated in FIG. 28 and discussed below. The device die 200 may include a plurality of the structures of FIGS. 27A through 27C arranged in a horizontal plane.

FIGS. 28 through 43 illustrate embodiments in which heat-dissipating structures include a thermally conductive cap 212 (illustrated in FIGS. 30 through 43) provided over a support die 210 attached to the front-side interconnect structure 120. The thermally conductive cap 212 is an example of a conductive cap heat spreader, which dissipate heat generated in a device die 200 (e.g., a device die including nano-FETs manufactured according to the processes of FIGS. 2 through 27C). The support die 210 is an example of a front-side heat spreader, which dissipates heat generated in the device die 200. The thermally conductive cap 212 and the support die 210 are thermally coupled to one another and to the device die 200. Providing the thermally conductive cap 212 and the support die 210 over the device die 200 improves heat dissipation from the device die 200. This improves device performance and reduces device defects caused by heat generated in the device die 200.

In FIG. 28, a device die 200 is attached to a carrier substrate 202 through a release layer 204. The processes of FIGS. 2 through 27C form interconnected devices, which are included in the device die 200. The device die 200 may include a plurality of the structures illustrated in FIGS. 27A through 27C, which are arranged horizontally adjacent to one another. For example, FIG. 27C illustrates a detailed view of a region 181 of the device die 200 of FIG. 28. In some embodiments, the device die 200 may be a power rail die, which includes the front-side interconnect structure 120 over a front-side of the device layer 109 and the backside interconnect structure 140 over a backside of the device layer 109.

In FIG. 28, a topmost one of the dielectric layers 124 is illustrated as covering a topmost layer of the conductive features 122, however, in some embodiments, top surfaces of the topmost dielectric layer 124 may be level with top surfaces of the topmost layer of the conductive features 122. The device layer 109 is illustrated as including the substrate 50; however, the substrate 50 may be replaced with the dielectric layer 125. FIG. 28 illustrates a simplified view in which certain features of the preceding figures are omitted or altered for clarity of illustration.

The device die 200 is attached to the carrier substrate 202 through the release layer 204. The carrier substrate 202 may be a glass carrier substrate, a ceramic carrier substrate, a wafer (e.g., a silicon wafer), or the like. The carrier substrate 202 may provide structural support during subsequent processing steps. The release layer 204 may be formed of a polymer-based material, which may be removed along with the carrier substrate 202 from the overlying structures that will be formed in subsequent steps. In some embodiments, the release layer 204 is an epoxy-based thermal-release material, which loses its adhesive property when heated, such as a light-to-heat-conversion (LTHC) release coating. In some embodiments, the release layer 204 may be an ultra-violet (UV) glue, which loses its adhesive property when exposed to UV lights. The release layer 204 may be dispensed as a liquid and cured, may be a laminate film laminated onto the carrier substrate 202, or may be the like. The top surface of the release layer 204 may be leveled and may have a high degree of planarity. The device die 200 may be flipped and the backside interconnect structure 140 may be attached to the carrier substrate 202 through the release layer 204.

A carrier substrate de-bonding is performed to detach (or "de-bond") the carrier substrate 180 from the front-side interconnect structure 120. In some embodiments, the de-bonding includes projecting a light, such as a laser light or an ultraviolet (UV) light on the bonding layers 182 so that the bonding layers 182 decompose under the heat of the light and the carrier substrate 180 can be removed. A major surface of the dielectric layer 124 or surfaces of the dielectric layer 124 and the conductive features 122 may be exposed after removing the carrier substrate 180 and the bonding layers 182.

Figure 29:
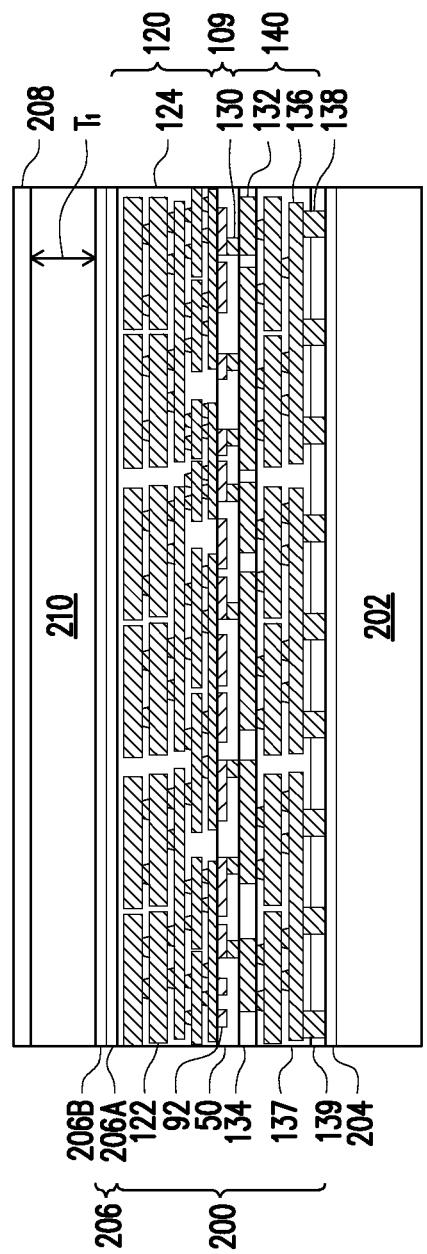

In FIG. 29, a support die 210 is attached to the device die 200. The support die 210 is a rigid structure that is attached to the device die 200 to provide structural or mechanical stability and to provide heat dissipation. The support die 210 may be bonded to a top surface of the front-side interconnect structure 120 of the device die 200 by a first bonding layer 206A and a second bonding layer 206B (collectively referred to as bonding layers 206). The support die 210 is thermally coupled to the device die 200 through the bonding layers 206. The support die 210 may comprise a high thermal conductivity substrate, which is used as part of a heat-dissipating structure, and which conducts heat away from the device die 200. In some embodiments, the support die 210 may include silicon, silicon carbide, aluminum nitride, or the like. In some embodiments, the support die 210 may be a blank die, as illustrated in FIG. 29. In some embodiments, the support die 210 may include active or passive devices, various conductive features, such as metal pillars, interconnect structures, through vias, other thermally conductive features, or the like. The support die 210 may have a thickness $T_1$ ranging from about 25 µm to about 775 µm. Providing the support die 210 with a thickness within the prescribed ranging provides sufficient heat dissipation, without undesirably increasing the thickness of the packaged semiconductor device including the support die 210. The support die 210 may be included to improve the structural and mechanical stability of the packaged semiconductor device, while providing improved heat dissipation from the device die 200. This improves device performance and reduces device defects caused by heat generated in the device die 200.

The support die 210 may be bonded to the front-side interconnect structure 120 of the device die 200 using a suitable technique, such as dielectric-to-dielectric bonding, or the like. The dielectric-to-dielectric bonding may comprise depositing the first bonding layer 206A on the front-side interconnect structure 120. In some embodiments, the first bonding layer 206A comprises silicon oxide (e.g., a high-density plasma (HDP) oxide, or the like) that is deposited by CVD, ALD, PVD, or the like. The second bonding layer 206B may likewise be an oxide layer that is formed on a surface of the support die 210 prior to bonding using, for example, CVD, ALD, PVD, thermal oxidation, or the like. Other suitable materials may be used for the first bonding layer 206A and the second bonding layer 206B. The dielectric-to-dielectric bonding may be the same as or similar to the dielectric-to-dielectric bonding process discussed above with respect to the FIGS. 22A through 22C.

Further in FIG. 29, an isolation layer 208 is formed over the support die 210. The isolation layer 208 may include polymers such as PBO, polyimide, BCB, or the like. In some embodiments, the isolation layer 208 may include non-organic dielectric materials such as silicon oxide, silicon nitride, silicon carbide, silicon oxynitride, or the like. The isolation layer 208 may be deposited by, for example, CVD, PVD, ALD, or the like.

Figure 30:
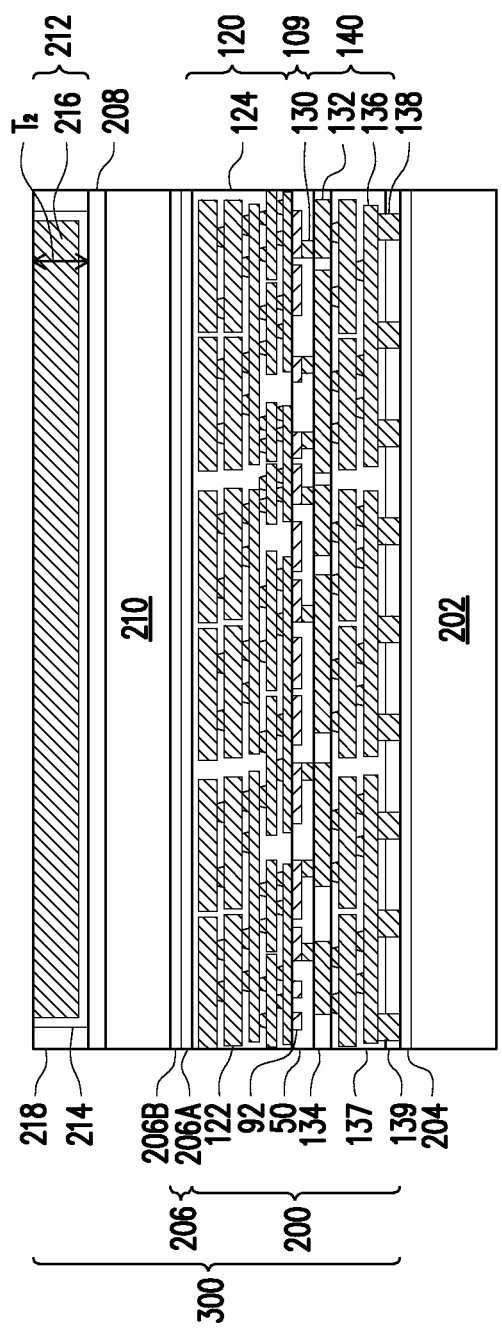

In FIG. 30, a thermally conductive cap 212 is formed over the isolation layer 208. The thermally conductive cap 212 be a high thermal conductivity structure, which is used as a heat-dissipating structure to conduct heat away from the device die 200. The thermally conductive cap 212 may be thermally coupled to the device die 200 through the support die 210. The isolation layer 208 may be included to eclectically isolate the thermally conductive cap 212 from the device die 200, such that the thermally conductive cap 212 is electrically floating (e.g., not electrically coupled to any electrical signals).

Forming the thermally conductive cap 212 includes depositing a passivation material 218 over the isolation layer 208, patterning the passivation material 218 to form an opening exposing the isolation layer 208, depositing a seed layer 214 in the opening, and depositing a conductive fill material 216 over the seed layer 214 and filling the opening. The passivation material 218 may include polymers such as PBO, polyimide, BCB, or the like. In some embodiments, the passivation material 218 may include non-organic dielectric materials such as silicon oxide, silicon nitride, silicon carbide, silicon oxynitride, or the like. The passivation material 218 may be deposited by, for example, CVD, PVD, ALD, or the like. The passivation material 218 may be patterned using a combination of photolithography and etching processes.

The thermally conductive cap 212 includes the seed layer 214 and the conductive fill material 216. The seed layer 214 may be a metal layer, which may be a single layer or a composite layer comprising a plurality of sub-layers formed of different materials. In some embodiments, the seed layer 214 comprises a titanium layer and a copper layer over the titanium layer. The seed layer 214 may be formed using, for example, physical vapor deposition (PVD) or the like. The conductive fill material 216 may be formed over the seed layer 214 by plating, such as electroplating or electroless plating, or the like. The conductive fill material 216 may include copper, nickel, another metal, a metal alloy, or the like. A planarization process (e.g., a CMP, a grinding, an etch-back, or the like) may be performed to remove excess portions of the thermally conductive cap 212 formed over the passivation material 218. The thermally conductive cap 212 may have a thickness $T_2$ ranging from about 1 µm to about 50 µm. A ratio of the thickness $T_2$ to the thickness $T_1$ may range from about 10% to about 60%. Providing the thermally conductive cap 212 with a thickness within the prescribed ranging provides sufficient heat dissipation, without undesirably increasing the thickness of the packaged semiconductor device including the thermally conductive cap 212. The device die 200, the support die 210, and the thermally conductive cap 212 collectively form a die structure 300. The thermally conductive cap 212 may be thermally coupled to the device die 200 through the support die 210 and electrically isolated from the device die 200 by the support die 210 and the isolation layer 208. The thermally conductive cap 212 may be included to provide improved heat dissipation from the device die 200. This improves device performance and reduces device defects caused by heat generated in the device die 200.

Figure 31:
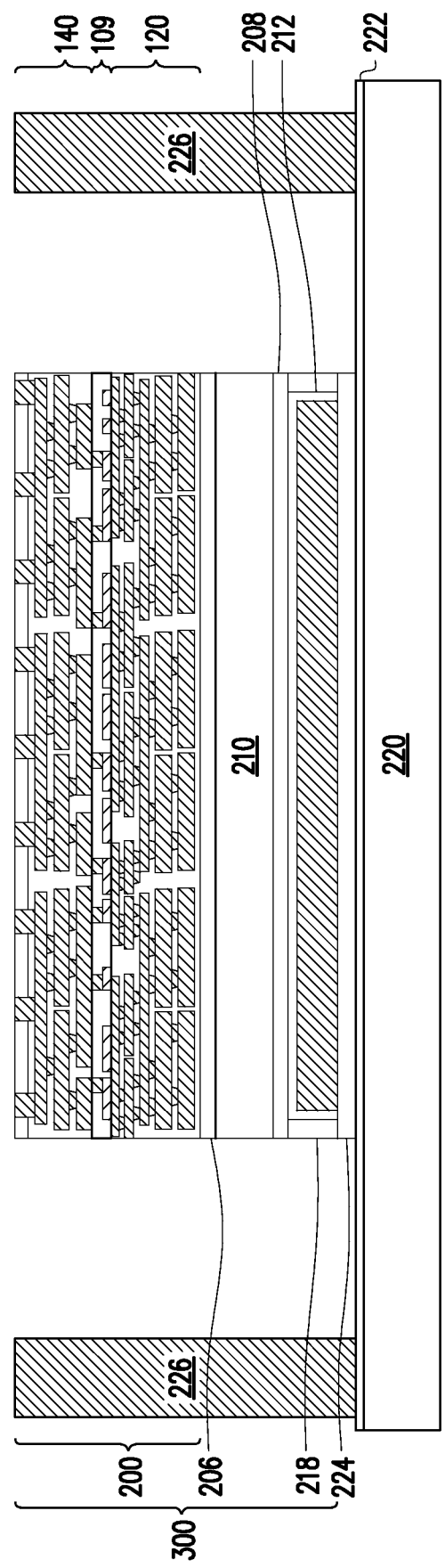

In FIG. 31, the die structure 300 is flipped, attached to a carrier substrate 220, and vias 226 are formed over the carrier substrate 220. The die structure 300 may be attached to the carrier substrate 220 through an adhesive 224 adhered to the thermally conductive cap 212 and the passivation material 218 and a release layer 222 attached to the carrier substrate 220.

The carrier substrate 220 may be a glass carrier substrate, a ceramic carrier substrate, a wafer (e.g., a silicon wafer), or the like. The carrier substrate 220 may provide structural support during subsequent processing steps. The release layer 222 may be formed of a polymer-based material, which may be removed along with the carrier substrate 220 from the overlying structures that will be formed in subsequent steps. In some embodiments, the release layer 222 is an epoxy-based thermal-release material, which loses its adhesive property when heated, such as a LTHC release coating. In some embodiments, the release layer 22 may be a UV glue, which loses its adhesive property when exposed to UV lights. The release layer 222 may be dispensed as a liquid and cured, may be a laminate film laminated onto the carrier substrate 220, or may be the like. The top surface of the release layer 222 may be leveled and may have a high degree of planarity. The die structure 300 may be flipped and the thermally conductive cap 212 and the passivation material 218 may be attached to the carrier substrate 220 through the release layer 222.

The die structure 300 may be adhered to the carrier substrate 220 through the adhesive 224. The adhesive 224 is on bottom surfaces of the thermally conductive cap 212 and the passivation material 218 and adheres the die structure 300 to the carrier substrate 220. The adhesive 224 may be any suitable adhesive, epoxy, die attach film (DAF), or the like. The adhesive 224 may be applied to bottom surfaces of the thermally conductive cap 212 and the passivation material 218, may be applied over the surface of the carrier substrate 220, or the like.

The vias 226 are formed on the release layer 222 and extending away from the carrier substrate 220. As an example to form the vias 226, a seed layer (not separately illustrated) is formed over the release layer 222. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the vias 226.

A carrier substrate de-bonding is performed to detach (or "de-bond") the carrier substrate 202 from the backside interconnect structure 140. In some embodiments, the de-bonding includes projecting a light, such as a laser light or a UV light on the release layer 204 so that the release layer 204 decomposes under the heat of the light and the carrier substrate 202 can be removed. Surfaces of the passivation layer 139 and the redistribution layer 138 may be exposed after removing the carrier substrate 202 and the release layer 204.

Figure 32:
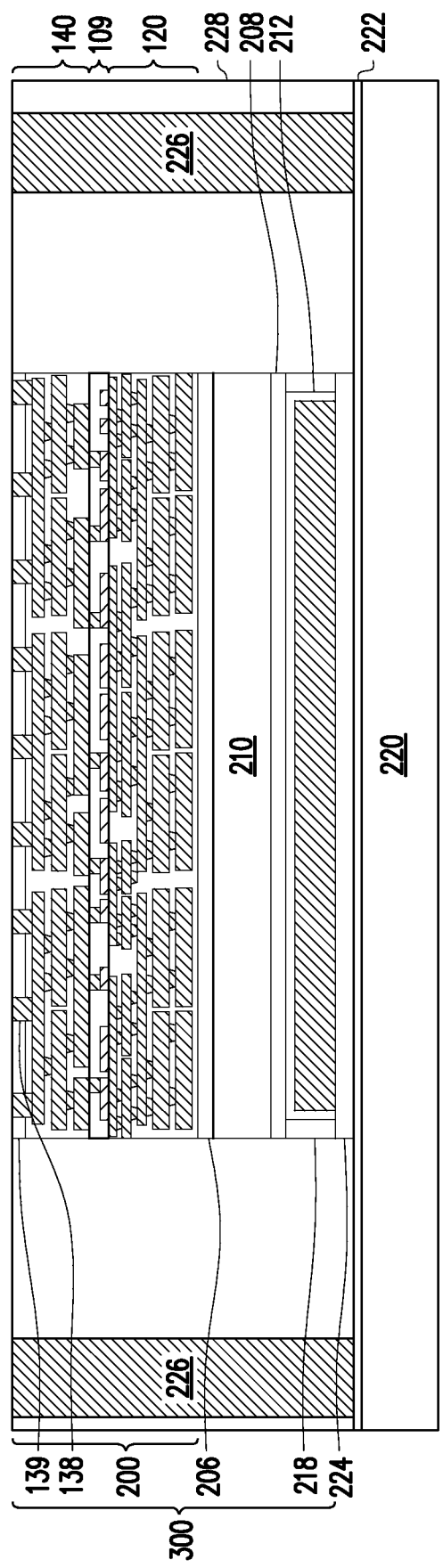

In FIG. 32, an encapsulant 228 is formed on and around the various components. For example, the encapsulant 228 may be formed on the vias 226, on the release layer 222 over the carrier substrate 220, and on the die structure 300 and around the vias 226 and the die structure 300. After formation, the encapsulant 228 encapsulates the vias 226 and die structure 300. The encapsulant 228 may be a molding compound, epoxy, or the like. The encapsulant 228 may be applied by compression molding, transfer molding, or the like, and may be formed over the carrier substrate 220 such that the vias 226 and/or the die structure 300 are buried or covered. The encapsulant 228 may be applied in liquid or semi-liquid form and subsequently cured. Upper surfaces of the encapsulant 228 may be aligned with upper surfaces of the vias 226. The vias 226 may be referred to as through mold vias.

Further in FIG. 32, a planarization process is performed on the encapsulant 228 to expose the vias 226 and the die structure 300. The planarization process may also remove material of the vias 226, the redistribution layer 138, and/or the passivation layer 139 until the redistribution layer 138, the vias 226, and the passivation layer 139 are exposed. Top surfaces of the vias 226, the redistribution layer 138, the passivation layer 139, and the encapsulant 228 are substantially coplanar after the planarization process within process variations. The planarization process may be, for example, a CMP, a grinding process, or the like. In some embodiments, the planarization may be omitted, for example, if the vias 226 and/or the redistribution layer 138 are already exposed.

Figure 33:
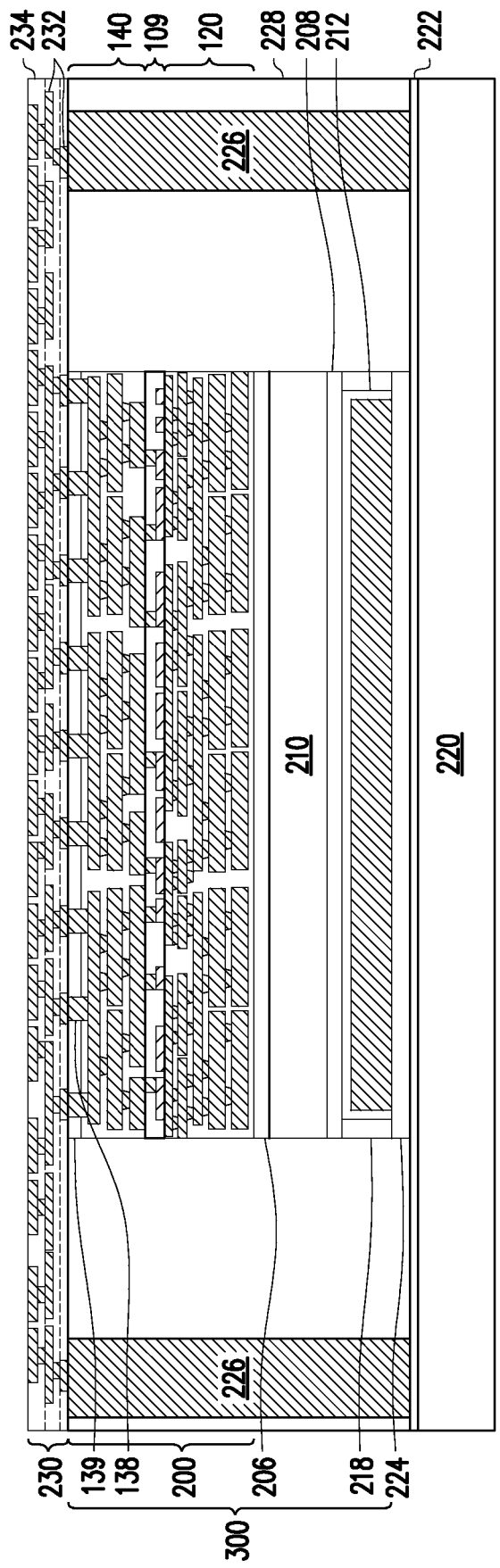

In FIG. 33, a redistribution structure 230 is formed over the encapsulant 228, the vias 226, the redistribution layer 138, and the passivation layer 139. The redistribution structure 230 may be similar to the front-side interconnect structure 120 and the backside interconnect structure 140. For example, the redistribution structure 230 may be formed of materials and by processes the same as or similar to those of the front-side interconnect structure 120 and the backside interconnect structure 140. The redistribution structure 230 may include stacked layers of conductive features 232 formed in stacked dielectric layers 234. The conductive features 232 may include conductive lines (e.g., for routing to and from subsequently formed contact pads and conductive connectors). The conductive features 232 may include conductive vias that extend in the dielectric layers 234 to provide vertical interconnection between stacked layers of the conductive lines. The conductive features 232 may include one or more embedded passive devices, such as resistors, capacitors, inductors, or the like. The embedded passive devices may be integrated with the die structure 300 to provide circuits.

Figure 34:
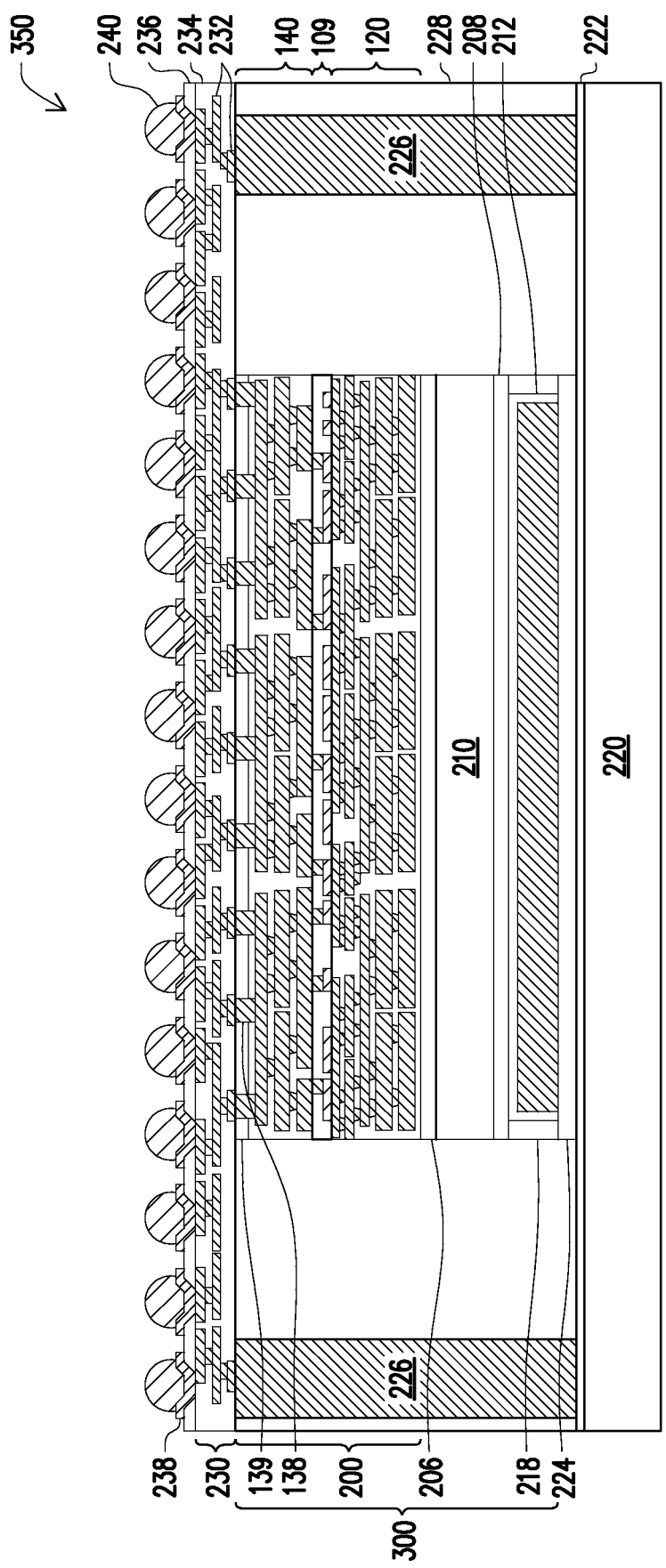

In FIG. 34, a passivation layer 236, UBMs 238, and conductive connectors 240 (also referred to as external connectors) are formed over the redistribution structure 230. The passivation layer 236 may comprise polymers such as PBO, polyimide, BCB, or the like. In some embodiments, the passivation layer 236 may include non-organic dielectric materials, such as silicon oxide, silicon nitride, silicon carbide, silicon oxynitride, or the like. The passivation layer 236 may be deposited by CVD, PVD, ALD, or the like.

The UBMs 238 are formed through the passivation layer 236 to the conductive features 232 in the redistribution structure 230. The conductive connectors 240 are formed on the UBMs 238. The UBMs 238 may comprise one or more layers of copper, nickel, gold, or the like, which are formed by a plating process, or the like. The conductive connectors 240 (e.g., solder balls) are formed on the UBMs 238. The formation of conductive connectors 240 may include placing solder balls on the exposed portions of UBMs 238 and then reflowing the solder balls. In some embodiments, the formation of the conductive connectors 240 includes performing a plating step to form solder regions over the topmost conductive features 232 and then reflowing the solder regions. The UBMs 238 and the conductive connectors 240 may be used to provide input/output connections to other electrical components, such as, other device dies, redistribution structures, printed circuit boards (PCBs), motherboards, or the like. The UBMs 238 and the conductive connectors 240 may also be referred to as backside input/output pads that may provide signal, supply voltage, and/or ground connections to the nano-FETs described above.

The UBMs 238 and the conductive connectors 240 may be thermally coupled to the backside interconnect structure 140 through the redistribution structure 230. Thus, the redistribution structure 230 may improve heat dissipation away from the active devices in the device die 200 through the backside interconnect structure 140 to an exterior of a packaged semiconductor device. The die structure 300, the encapsulant 228, the vias 226, the redistribution structure 230, the passivation layer 236, the UBMs 238, and the conductive connectors 240 collectively form a first package component 350.

Figure 35:
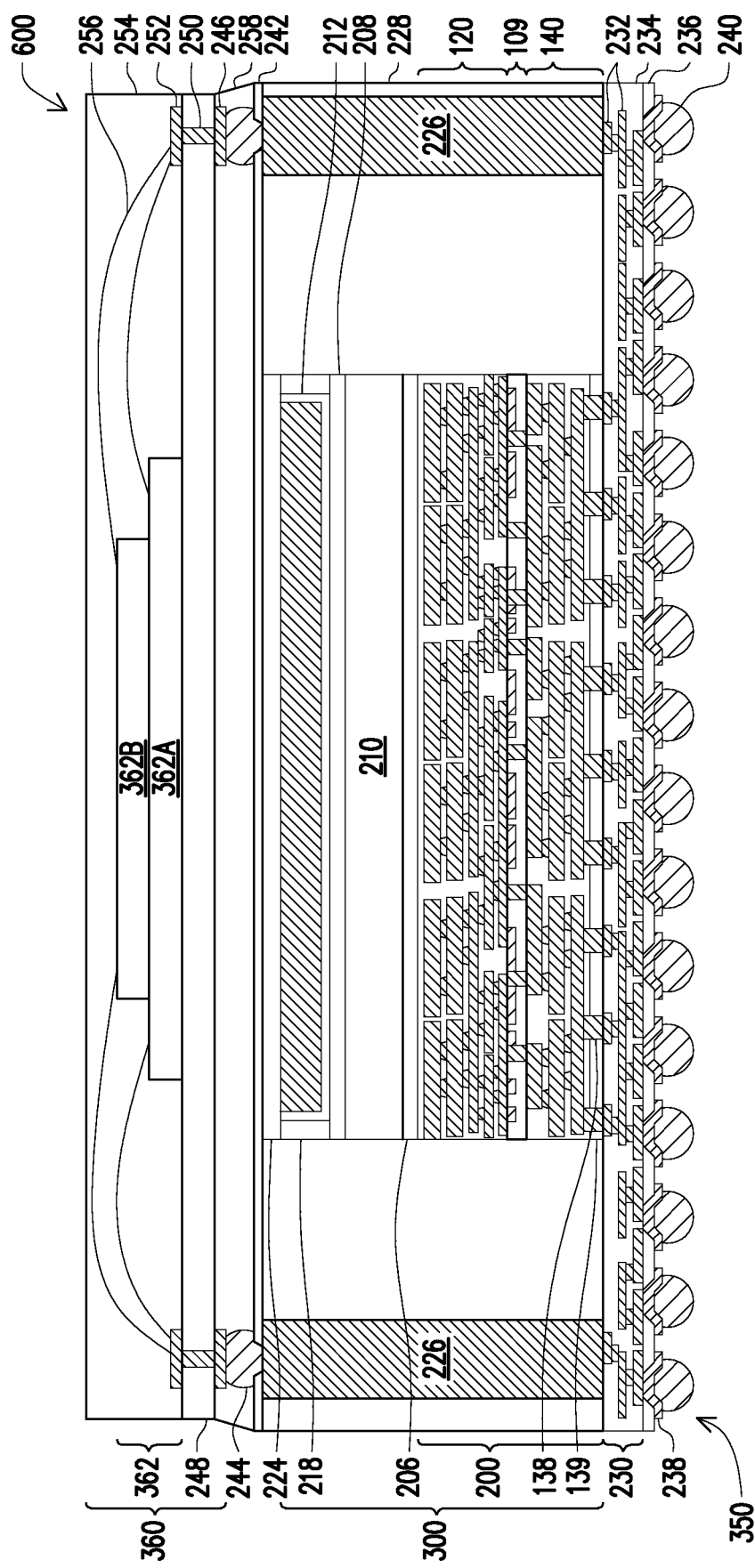

In FIG. 35, the first package component 350 is flipped; the carrier substrate 220 is removed; a passivation layer 242 is formed over the encapsulant 228, the vias 226, and the die structure 300; and a second package component 360 is coupled to the first package component 350. A carrier substrate de-bonding is performed to detach (or "de-bond") the carrier substrate 220 from the encapsulant 228, the vias 226, and the adhesive 224. In some embodiments, the de-bonding includes projecting a light, such as a laser light or an ultraviolet (UV) light on the release layer 222 so that the release layer 222 decomposes under the heat of the light and the carrier substrate 220 can be removed. Surfaces of the encapsulant 228, the vias 226, and the adhesive 224 may be exposed after removing the carrier substrate 220 and the release layer 222. A top surface of the adhesive 224 may be aligned with top surfaces of the encapsulant 228.

The passivation layer 242 may be formed on the encapsulant 228, the vias 226, and the adhesive 224. The passivation layer 242 may be formed in contact with the encapsulant 228, the vias 226, and the adhesive 224. In some embodiments, the passivation layer 242 is formed of a polymer, such as polybenzoxazole (PBO), polyimide, benzocyclobutene (BCB), or the like. In some embodiments, the passivation layer 242 is formed of a nitride such as silicon nitride; an oxide such as silicon oxide, phosphosilicate glass (PSG), borosilicate glass (BSG), boron-doped phosphosilicate glass (BPSG), or the like; or the like. The passivation layer 242 may be deposited by any acceptable deposition process, such as spin coating, CVD, laminating, the like, or a combination thereof.

Conductive connectors 244 are formed extending through the passivation layer 242 to contact the vias 226. Openings are formed through the passivation layer 242 to expose portions of the vias 226. The openings may be formed using laser drilling, etching, or the like. The conductive connectors 244 are formed in the openings. The conductive connectors 244 may include flux and may be formed in a flux dipping process. In some embodiments, the conductive connectors 244 include a conductive paste, such as solder paste, silver paste, or the like, and the conductive connectors 244 are dispensed in a printing process. In some embodiments, the conductive connectors 244 are formed in a manner similar to the conductive connectors 240, and may be formed of a similar material as the conductive connectors 240. The conductive connectors 244 may be used to bond the second package component 360 to the first package component 350.

The second package component 360 may include a substrate 248 and one or more stacks of stacked dies 362 (e.g., a first stacked die 362A and a second stacked die 362B) coupled to the substrate 248. Although one stack of stacked dies 362 (362A and 362B) is illustrated in FIG. 35, in some embodiments, a plurality of stacks of the stacked dies 362 (each having one or more stacked dies) may be disposed side-by-side coupled to a same surface of the substrate 248. The substrate 248 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may be used. Additionally, the substrate 248 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. In some embodiments, the substrate 248 is based on an insulating core, such as a fiberglass-reinforced resin core. The core material may be a fiberglass resin, such as FR4. In some embodiments, the core material may include bismaleimide-triazine (BT) resin, other printed circuit board (PCB) materials or films, or the like. Build-up films, such as Ajinomoto build-up film (ABF) or other laminates, may be used for the substrate 248. The substrate 248 may include active and passive devices (not separately illustrated). A wide variety of devices, such as transistors, capacitors, resistors, combinations of these, and the like, may be used to generate the structural and functional requirements of the design for the second package component 360. The devices may be formed using any suitable methods.

The substrate 248 may include metallization layers (not separately illustrated), in addition to conductive vias 250. The metallization layers may be formed over the active and passive devices and are designed to connect the various devices to form functional circuitry. The metallization layers may be formed of alternating layers of dielectric material (e.g., a low-k dielectric material) and conductive material (e.g., copper) with vias interconnecting the layers of conductive material. The metallization layers may be formed through any suitable process (such as deposition, damascene, dual damascene, or the like). In some embodiments, the substrate 248 is substantially free of active and passive devices.

The substrate 248 may have bond pads 252 on a first side of the substrate 248 to couple to the stacked dies 362, and bond pads 246 on a second side of the substrate 248, the second side being opposite the first side of the substrate 248, to couple to the conductive connectors 244. In some embodiments, the bond pads 246 and the bond pads 252 are formed by forming recesses (not separately illustrated) into dielectric layers (not separately illustrated) on the first and second sides of the substrate 248. The recesses may be formed to allow the bond pads 246 and the bond pads 252 to be embedded into the dielectric layers. In some embodiments, the recesses are omitted and the bond pads 246 and the bond pads 252 may be formed on the dielectric layer. In some embodiments, the bond pads 246 and the bond pads 252 include a thin seed layer (not separately illustrated) made of copper, titanium, nickel, gold, palladium, the like, or a combination thereof. The conductive material of the bond pads 246 and the bond pads 252 may be deposited over the thin seed layer. The conductive material may be formed by an electro-chemical plating process, an electroless plating process, CVD, ALD, PVD, the like, or a combination thereof. In some embodiments, the conductive material of the bond pads 246 and the bond pads 252 is copper, tungsten, aluminum, silver, gold, the like, or a combination thereof.

In some embodiments, the bond pads 246 and the bond pads 252 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 246 and the bond pads 252. In some embodiments, the conductive vias 250 extend through the substrate 248 and couple at least one of the bond pads 246 to at least one of the bond pads 252.

In the illustrated embodiment, the stacked dies 362 are coupled to the substrate 248 by wire bonds 256, although other connections may be used, such as conductive bumps. In some embodiments, the stacked dies 362 are stacked memory dies. For example, the stacked dies 362 may be memory dies such as low-power (LP) double data rate (DDR) memory modules, such as LPDDR1, LPDDR2, LPDDR3, LPDDR4, or the like memory modules. The stacked dies 362 and the wire bonds 256 may be encapsulated by a molding material 254. The molding material 254 may be molded on the stacked dies 362 and the wire bonds 256 using compression molding. In some embodiments, the molding material 254 is a molding compound, a polymer, an epoxy, a silicon oxide filler material, the like, or a combination thereof. A curing process may be performed to cure the molding material 254. The curing process may be a thermal curing, a UV curing, the like, or a combination thereof. After curing of the molding material 254, a planarization step, such as a grinding, is performed to remove excess portions of the molding material 254 and provide a substantially planar surface for the second package component 360.

After the second package component 360 is formed, the second package component 360 is mechanically and electrically bonded to the first package component 350 by way of the conductive connectors 244, the bond pads 246, and the vias 226. In some embodiments, the stacked dies 362 may be coupled to the device die 200 through the wire bonds 256, the bond pads 252, the conductive vias 250, the bond pads 246, the conductive connectors 244, the vias 226, the redistribution structure 230, and the backside interconnect structure 140. In some embodiments, a solder resist (not separately illustrated) is formed on the side of the substrate 248 opposite the stacked dies 362. The conductive connectors 144 may be disposed in openings in the solder resist to be electrically and mechanically coupled to conductive features (e.g., the bond pads 246) in the substrate 248. The solder resist may be used to protect areas of the substrate 248 from external damage. In some embodiments, the conductive connectors 244 have an epoxy flux (not separately illustrated) formed thereon before they are reflowed with at least some of the epoxy portion of the epoxy flux remaining after the second package component 360 is attached to the first package component 350.

An underfill 258 is formed between the first package component 350 and the second package component 360, surrounding the conductive connectors 244. The underfill 258 may reduce stress and protect the joints resulting from the reflowing of the conductive connectors 244. The underfill 258 may be formed by a capillary flow process after the second package component 360 is attached, or may be formed by a suitable deposition method before the second package component 360 is attached. In embodiments where the epoxy flux is formed, the epoxy flux may act as the underfill 258. The first package component 350, the second package component 360, and the intervening structures used to couple the second package component 360 to the first package component 350 (e.g., the passivation layer 242, the conductive connectors 244, the underfill 258) collectively form a packaged semiconductor device 600.

The support die 210 and the thermally conductive cap 212 are heat-dissipating structures formed on a front-side of the device die 200. The support die 210 may be referred to as a front-side heat spreader. The thermally conductive cap 212 may be referred to as a conductive cap heat spreader. The support die 210 and the thermally conductive cap 212 are thermally coupled to the device die 200 and improve heat dissipation from the device die 200. This improves device performance and reduces device defects caused by heat generated in the device die 200. The support die 210 improves the structural and mechanical stability of the first package component 350.

Figure 36:
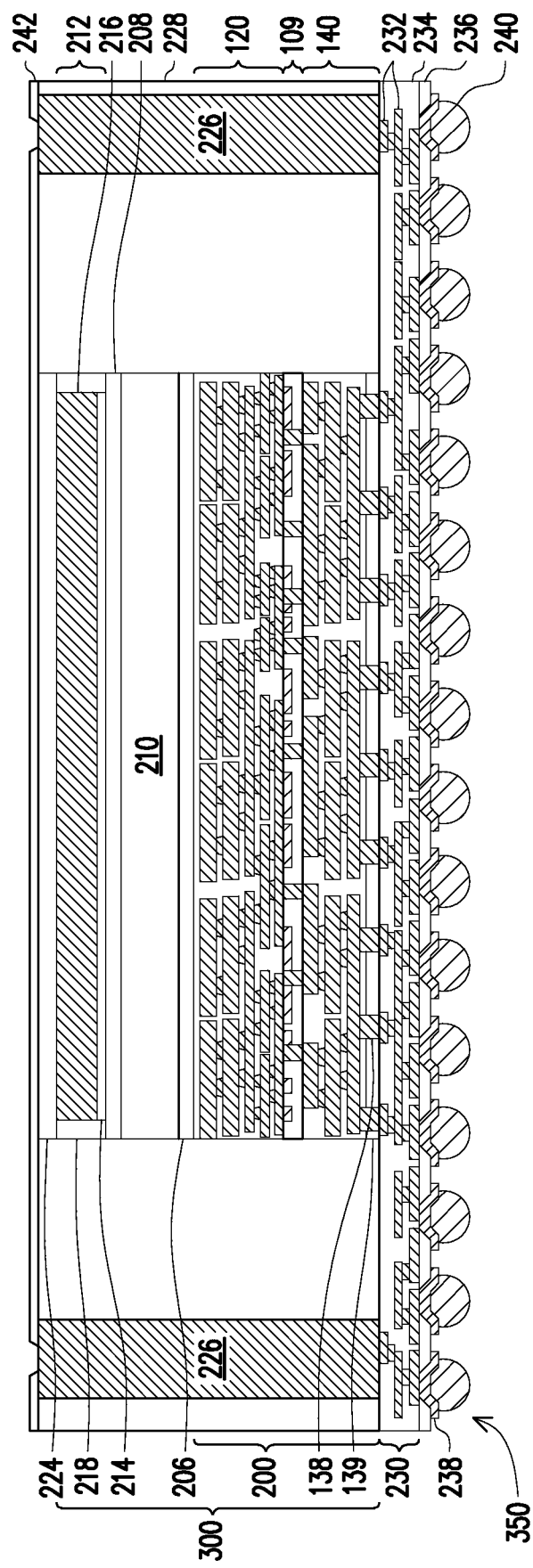

FIGS. 36 through 43 illustrate various configurations of the thermally conductive cap 212, in accordance with some embodiments. FIGS. 36 through 39 illustrate cross-sectional views, while FIGS. 40 through 43 illustrate top-down views. Various features, such as the vias 226, have been omitted in FIGS. 40 through 43 for clarity and ease of illustration. FIG. 36 illustrates an embodiment in which the thermally conductive cap 212 is formed before forming the passivation material 218. As illustrated in FIG. 36, side surfaces of the conductive fill material 216 may be aligned with side surfaces of the seed layer 214 and side surfaces of the conductive fill material 216 and the seed layer 214 may be in contact with the passivation material 218.

Figure 37:
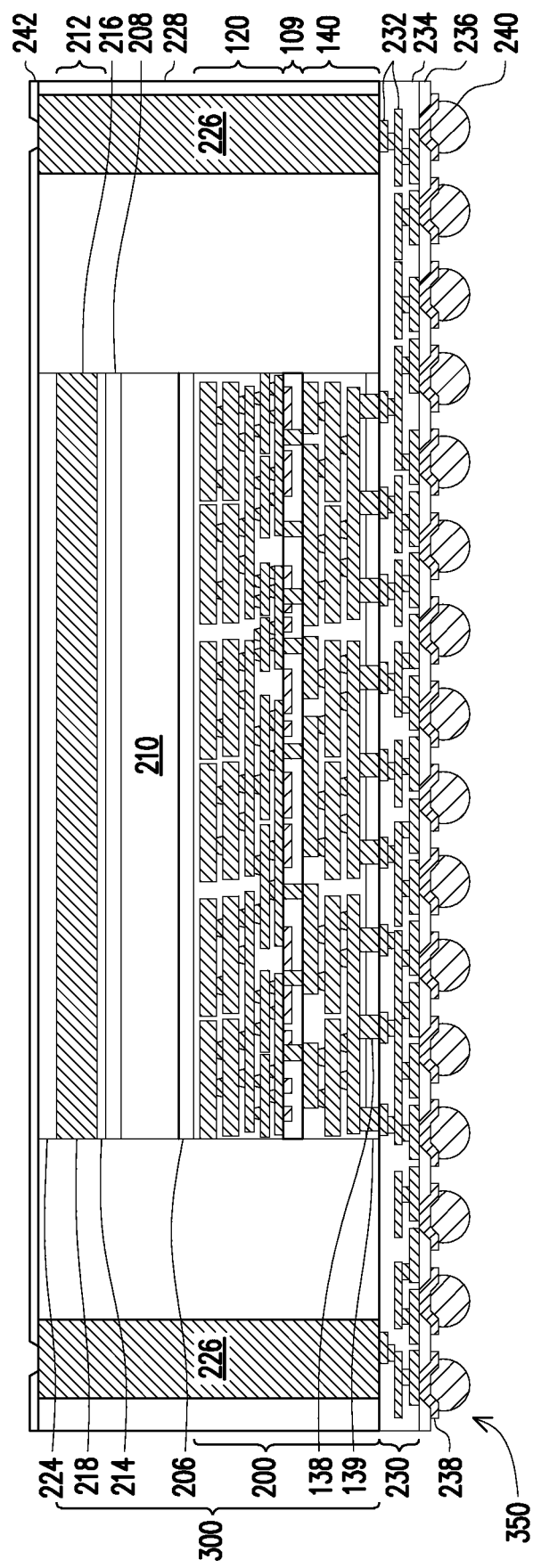

FIG. 37 illustrates an embodiment in which the thermally conductive cap 212 is formed and the passivation material 218 is omitted. As illustrated in FIG. 37, side surfaces of the conductive fill material 216 and the seed layer 214 may be aligned with side surfaces of the isolation layer 208 and side surfaces of the conductive fill material 216 and the seed layer 214 may be in contact with the encapsulant 228. The thermally conductive cap 212 may be thermally coupled to the device die 200 and electrically isolated from the device die 200. In some embodiments, the thermally conductive cap 212 may be electrically floating. Omitting the passivation material 218 may reduce processing steps and costs for forming the thermally conductive cap 212, while still providing improved heat dissipation from the thermally conductive cap 212 and the support die 210.

Figure 38:
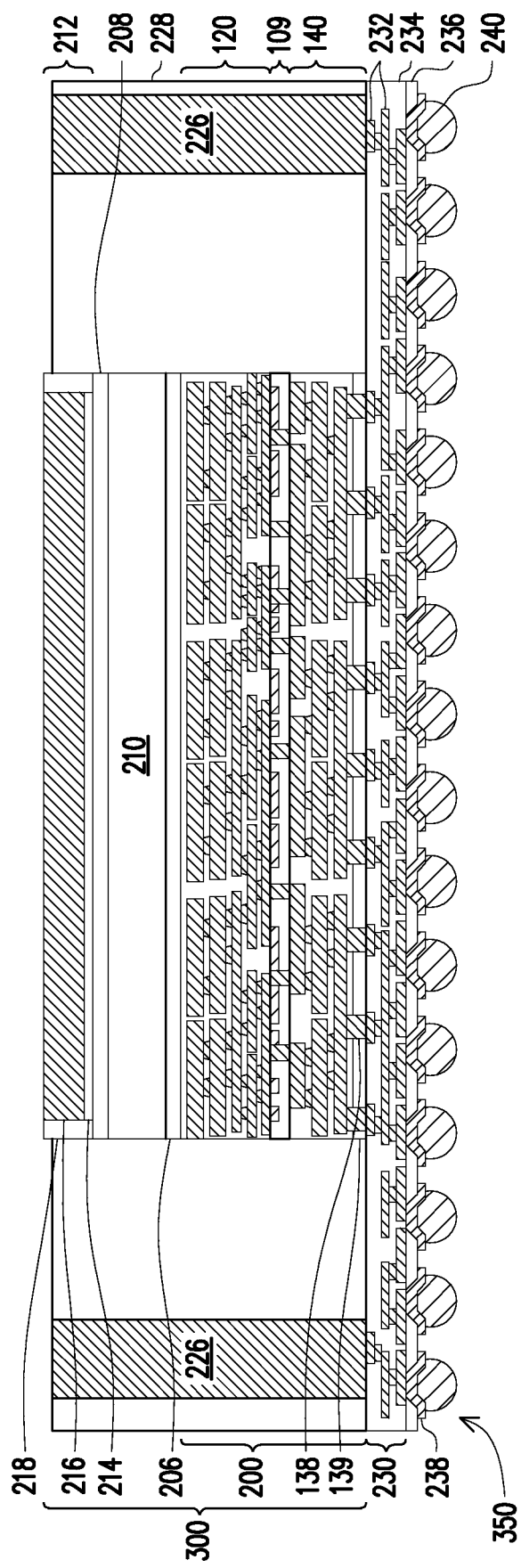

FIG. 38 illustrates an embodiment in which the thermally conductive cap 212 protrudes from the encapsulant 228 and the adhesive 224 is omitted. As illustrated in FIG. 36, side surfaces of the conductive fill material 216 may be aligned with side surfaces of the seed layer 214 and side surfaces of the conductive fill material 216 and the seed layer 214 may be in contact with the passivation material 218. Top surfaces of the vias 226 may be level with top surfaces of the encapsulant 228, top surfaces of the passivation material 218 may be level with top surfaces of the conductive fill material 216, and the top surfaces of the passivation material 218 and the conductive fill material 216 may be disposed above the top surfaces of the vias 226 and the encapsulant 228. In some embodiments, the vias 226 may also protrude from the encapsulant 228 and may be level with the top surfaces of the conductive fill material 216 and/or the passivation material 218. An initial planarization process, such as a CMP, may be performed after forming the encapsulant 228 to expose top surfaces of the vias 226 and the conductive cap 212. Thereafter, one or more wet etching processes having a high etch selectivity between the material of the encapsulant 228 and the vias 226 and/or the conductive cap 212 may be performed, thereby leaving the conductive cap 212 and/or the vias 226 protruding from the backside of the encapsulant 228, as illustrated in FIG. 38. The thermally conductive cap 212 may be thermally coupled to the device die 200 and electrically isolated from the device die 200. In some embodiments, the thermally conductive cap 212 may be electrically floating. Providing the thermally conductive cap 212 protruding from the backside of the encapsulant 228 may provide increased heat dissipation, while reducing a thickness of a packaged semiconductor device.

Figure 39:
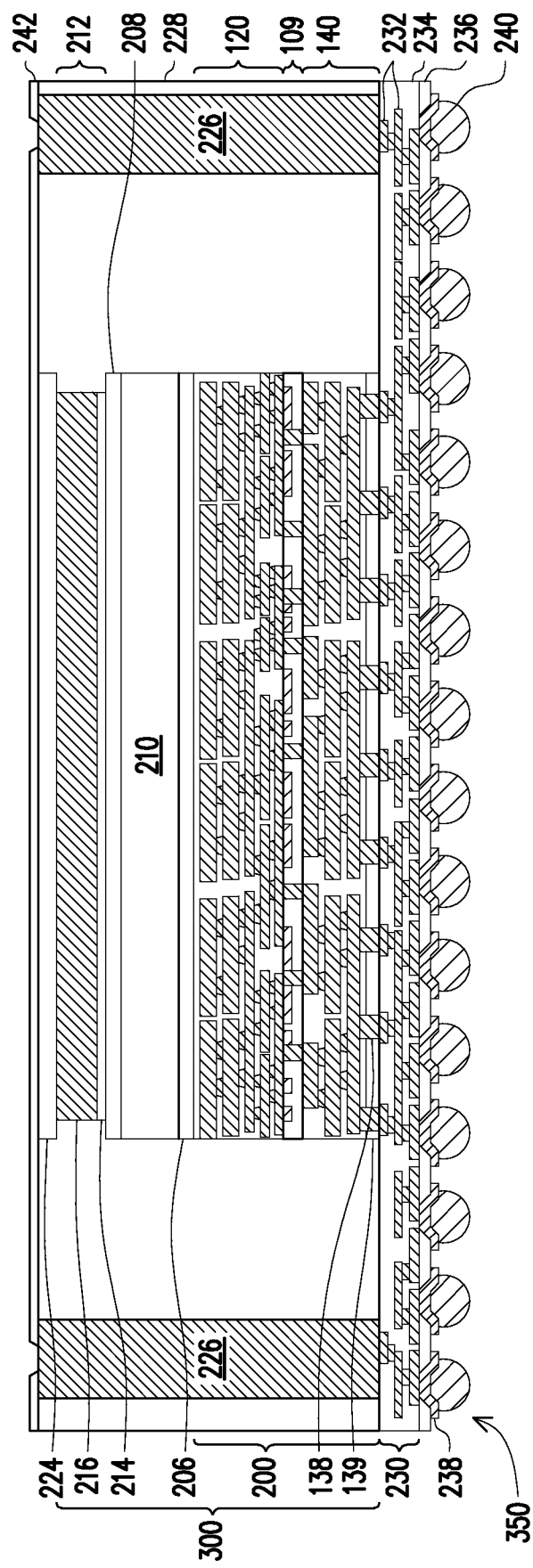

FIG. 39 illustrates an embodiment in which the thermally conductive cap 212 is formed and the passivation material 218 is omitted. As illustrated in FIG. 39, side surfaces of the conductive fill material 216 may be aligned with side surfaces of the seed layer 214 and side surfaces of the conductive fill material 216 and the seed layer 214 may be in contact with the passivation material 218. The thermally conductive cap 212 may be formed by methods similar to or the same as the vias 226, as discussed above with respect to FIG. 31. The thermally conductive cap 212 may be thermally coupled to the device die 200 and electrically isolated from the device die 200. In some embodiments, the thermally conductive cap 212 may be electrically floating. Omitting the passivation material 218 may reduce processing steps and costs for forming the thermally conductive cap 212, while still providing improved heat dissipation from the thermally conductive cap 212 and the support die 210.

Figure 40:
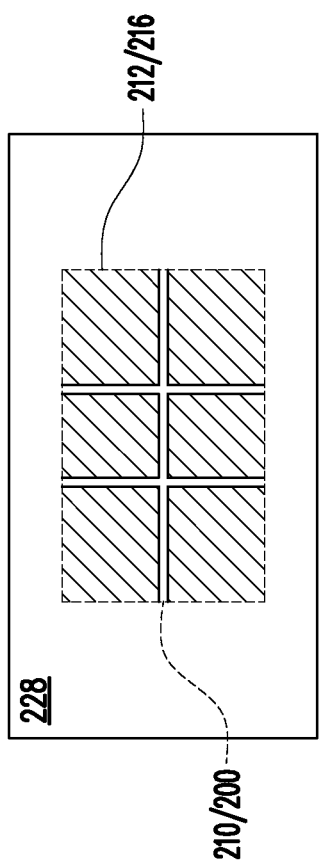

FIGS. 40 through 43 illustrate top-down views of the encapsulant 228, the thermally conductive cap 212, and the support die 210, in accordance with some embodiments. Certain features, such as the vias 226, have been omitted in FIGS. 40 through 43 for clarity and ease of illustration. FIG. 40 illustrates the embodiment of FIG. 35, with the passivation material 218 surrounding the conductive cap 212. Side surfaces of the passivation material 218 may be aligned with side surfaces of the underlying support die 210. As illustrated in FIG. 40, the seed layer 214 may surround side surfaces of the conductive fill material 216, the passivation material 218 may surround side surfaces of the seed layer 214, and the encapsulant 228 may surround side surfaces of the passivation material 218. The thermally conductive cap 212 may be thermally coupled to the device die 200 and electrically isolated from the device die 200. In some embodiments, the thermally conductive cap 212 may be electrically floating. In the embodiment of FIG. 40, the conductive cap 212 has a large area, such as an area ranging from about 50% to about 100% of an area of the support die 210 and/or the device die 200, which provides improved heat dissipation through the conductive cap 212. This improves device performance and reduces device defects caused by heat generated in the device die 200.

Figure 41:
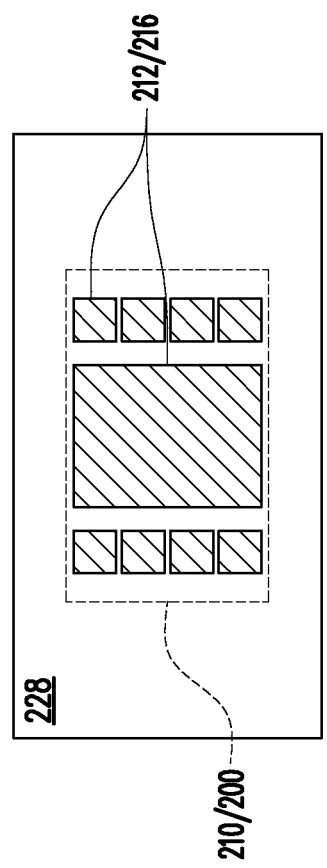

FIG. 41 illustrates an embodiment in which the thermally conductive cap 212 is formed in segments, which are separated from one another. Each of the segments of the conductive cap 212 may be separated from adjacent segments by a gap. The gap separating each of the segments of the conductive cap from adjacent segments may have a width of greater than about 10 µm. Although FIG. 41 illustrates the thermally conductive cap 212 as including six segments, the thermally conductive cap 212 may include more or fewer segments. The thermally conductive cap 212 may be formed by methods similar to or the same as the vias 226, as discussed above with respect to FIG. 31. As illustrated in FIG. 41, the encapsulant 228 may extend between the segments of the thermally conductive cap 212 and may fill the gaps between the segments of the thermally conductive cap 212. Forming the thermally conductive cap 212 with multiple segments and filling gaps between the segments with the encapsulant 228 reduces coefficient of thermal expansion (CTE) mismatch stress between the conductive cap 212 and the encapsulant 228, which reduces package warpage, reduces device defects, and improves device performance.

Figure 42:
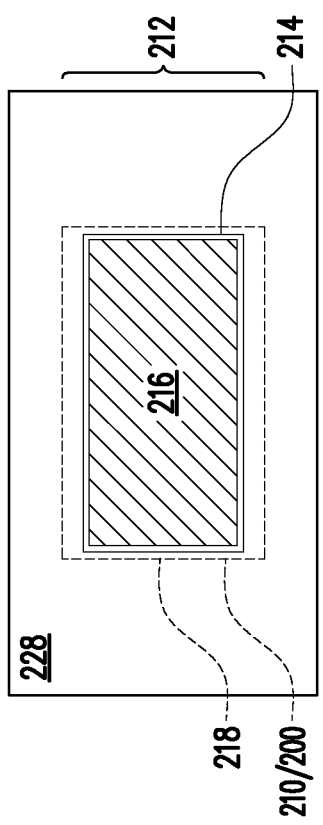

FIG. 42 illustrates an embodiment in which the thermally conductive cap 212 is formed over a hot spot in the device die 200. Although the thermally conductive cap 212 is illustrated as having a circular shape, the thermally conductive cap 212 may have any suitable shape, such as a square, rectangular, oval, or the like shape. Providing the thermally conductive cap 212 over a hot spot of the device die 200 reduces the area of the thermally conductive cap 212, which reduces costs, while still providing improved heat dissipation. This improves device performance and reduces device defects caused by heat generated in the device die 200.

Figure 43:
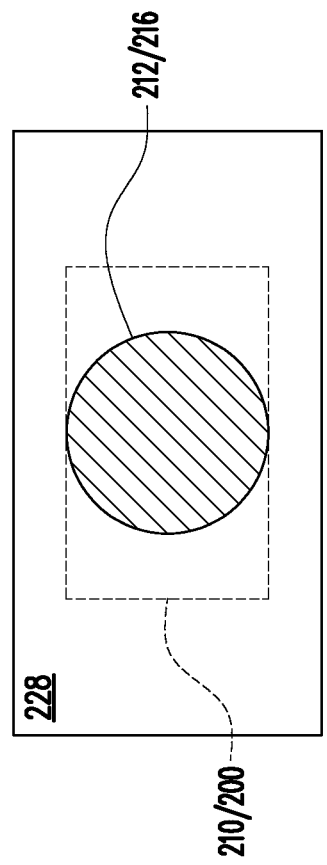

FIG. 43 illustrates an embodiment in which the thermally conductive cap 212 includes segments and at least a portion of the thermally conductive cap 212 is formed over a hot spot in the device die 200. Although the thermally conductive cap 212 is illustrated as having rectangular segments, the various segments of the thermally conductive cap 212 may have any suitable shape, such as square, rectangular, oval, circular, or the like shapes. Providing the thermally conductive cap 212 over a hot spot of the device die 200 reduces the area of the thermally conductive cap 212, which reduces costs, while still providing improved heat dissipation. This improves device performance and reduces device defects caused by heat generated in the device die 200. Forming the thermally conductive cap 212 with multiple segments and filling gaps between the segments with the encapsulant 228 reduces CTE mismatch stress between the conductive cap 212 and the encapsulant 228, which reduces package warpage, reduces device defects, and improves device performance.

Including the support die 210 and the thermally conductive cap 212 in the embodiments of FIGS. 28 through 43 improves the structural and mechanical stability of a packaged semiconductor device, while providing improved heat dissipation from the device die 200. This improves device performance and reduces device defects caused by heat generated in the device die 200.

FIGS. 44A through 48C illustrate embodiments in which heat-dissipating structures include a support die 310 attached to the front-side interconnect structure 120 and an interposer die 320 attached to the backside interconnect structure 140. The support die 310 is an example of a front-side heat spreader, which dissipates heat generated in a device die 200 (e.g., a device die including nano-FETs manufactured according to the processes of FIGS. 2 through 27C). The interposer die 320 is an example of a backside heat spreader, which dissipates heat generated in a device die 200. Providing the support die 310 and the interposer die 320 over the device die 200 improves heat dissipation from the device die 200. This improves device performance and reduces device defects caused by heat generated in the device die 200.

Figure 44A:
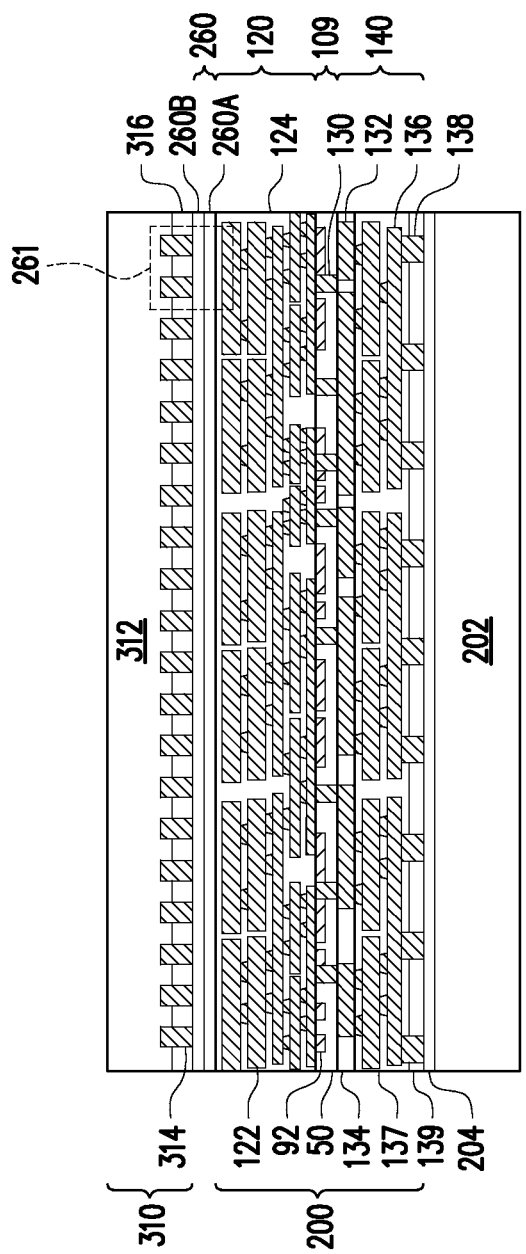
Figure 44B:
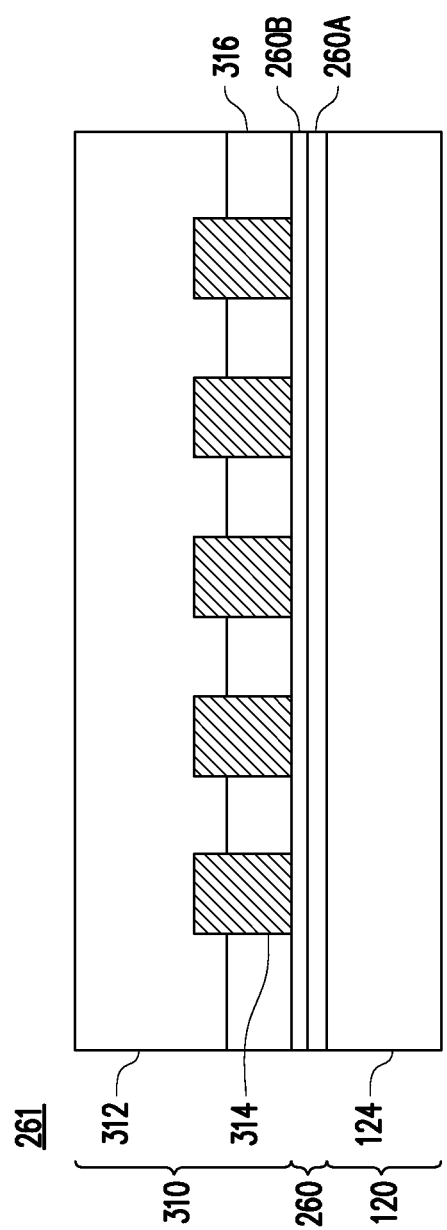

In FIGS. 44A and 44B, a backside interconnect structure 140 of a device die 200 is attached to a carrier substrate 202 through a release layer 204, and a support die 310 is attached to a front-side interconnect structure 120 of the device die 200 through bonding layers 260. FIG. 44B illustrates a detailed view of bonding between the bonding layers 260 of the support die 310 and the device die 200 in a region 261 of FIG. 44A. The backside interconnect structure 140 may be attached to the carrier substrate 202 through the release layer 204 in a manner the same as or similar to that discussed above with respect to FIG. 28.

The support die 310 is a rigid structure that is attached to the device die 200 to provide structural or mechanical stability and to provide heat dissipation. The support die 310 may be bonded to a top surface of the front-side interconnect structure 120 of the device die 200 by a first bonding layer 260A and a second bonding layer 260B (collectively referred to as bonding layers 260). The support die 310 may include a support substrate 312, which may be a high thermal conductivity substrate. The support substrate 312 is used as part of a heat-dissipating structure, which conducts heat away from the device die 200. In some embodiments, the support substrate 312 may include silicon, silicon carbide, aluminum nitride, or the like. In some embodiments, the support substrate 312 may be a blank die, as illustrated in FIGS. 44A and 44B. In some embodiments, the support substrate 312 may include active and/or passive devices, various conductive features, such as metal pillars, interconnect structures, through vias, other thermally conductive features, or the like.

The support die 310 may include a dielectric layer 316 formed over the support substrate 312 and conductive features 314 extending through the dielectric layer 316 into the support substrate 312. The dielectric layer 316 may include polymers such as PBO, polyimide, BCB, or the like. In some embodiments, the dielectric layer 316 may include non-organic dielectric materials such as silicon oxide, silicon nitride, silicon carbide, silicon oxynitride, or the like. The dielectric layer 316 may be deposited by, for example, CVD, PVD, ALD, or the like. In some embodiments, the dielectric layer 316 may be formed by thermal oxidation.

The conductive features 314 may be formed by forming openings extending through the dielectric layer 316 and into the support substrate 312 and filling the openings with suitable conductive materials. The openings may be formed using suitable photolithography and etching methods. The openings may be filled with copper, a copper alloy, silver, gold, tungsten, tantalum, aluminum, aluminum alloys, a combination thereof, or the like, using PVD, ALD, electro-chemical plating, electroless plating, a combination thereof, or the like. In some embodiments, a liner and/or an adhesive layer may be formed in the openings before filling the openings with the suitable conductive materials. The liner may include dielectric material, such as silicon oxide, silicon nitride, silicon oxynitride or the like, or combinations thereof. The adhesive layer may include Ta, TaN, Ti, TiN, or combinations thereof. A planarization process (e.g., a CMP, a grinding, an etch-back, or the like) may be performed to remove excess portions of the conductive features 314 formed over the dielectric layer 316. The conductive features 314 may be dummy features, which are thermally conductive. The conductive features 314 may be formed in the support die 310 to improve heat dissipation from the device die 200 to the support die 310. This improves device performance and reduces device defects caused by heat generated in the device die 200.

The support die 310 may be bonded to the front-side interconnect structure 120 using a suitable technique, such as dielectric-to-dielectric bonding, or the like. The dielectric-to-dielectric bonding may comprise depositing the first bonding layer 260A on the front-side interconnect structure 120. In some embodiments, the first bonding layer 260A comprises silicon oxide (e.g., a high-density plasma (HDP) oxide, or the like) that is deposited by CVD, ALD, PVD, or the like. The second bonding layer 260B may likewise be an oxide layer that is formed on a surface of the support die 310 prior to bonding using, for example, CVD, ALD, PVD, thermal oxidation, or the like. Other suitable materials may be used for the first bonding layer 260A and the second bonding layer 260B. The dielectric-to-dielectric bonding may be the same as or similar to the dielectric-to-dielectric bonding process discussed above with respect to the FIGS. 22A through 22C. The support die 310 may be included to provide improved heat dissipation from the device die 200. This improves device performance and reduces device defects caused by heat generated in the device die 200.

Figure 45A:
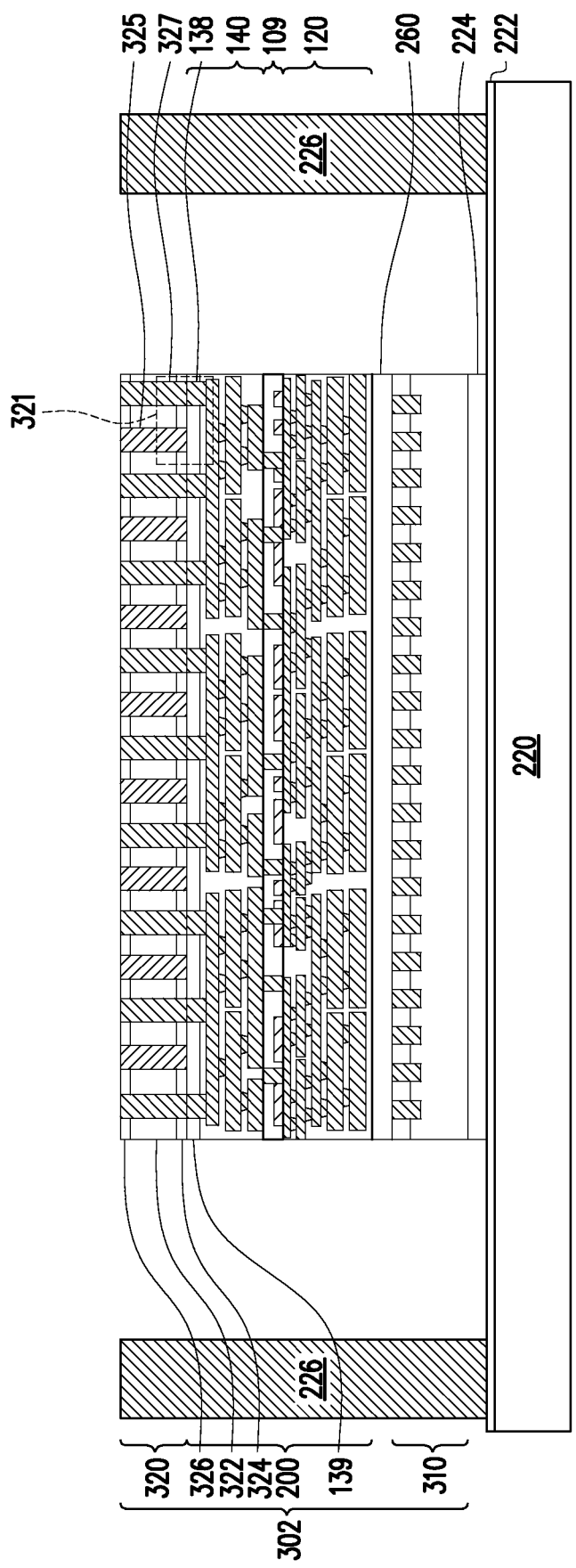
Figure 45B:
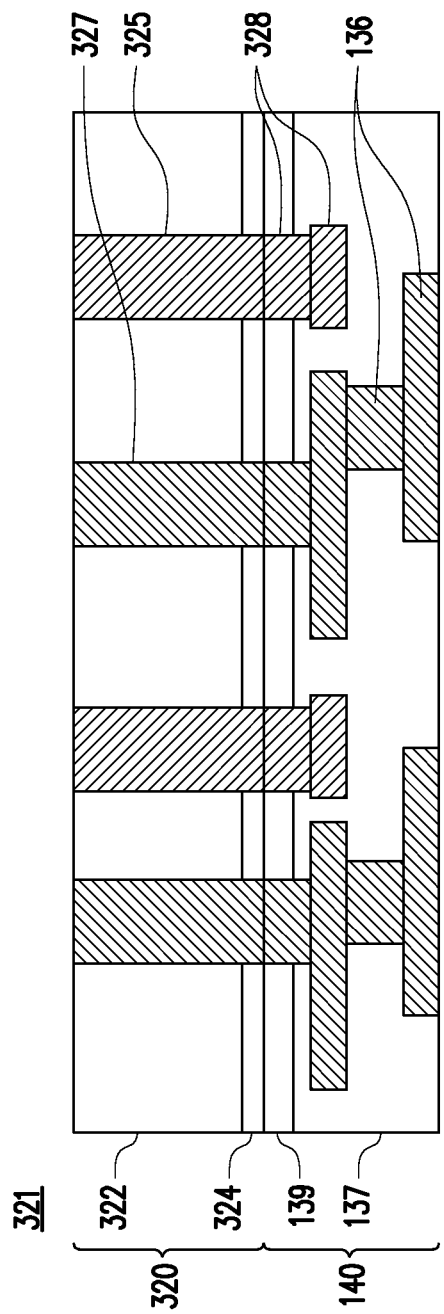

In FIGS. 45A and 45B, the structure of FIGS. 44A and 44B is flipped and attached to a carrier substrate 220, the carrier substrate 202 is removed, an interposer die 320 is attached to the backside interconnect structure 140 of the device die 200, and vias 226 are formed over the carrier substrate 220. The support die 310 may be attached to the carrier substrate 220 through an adhesive 224 adhered to the support die 310 and a release layer 222 attached to the carrier substrate 220. The carrier substrate 220, the release layer 222, and the adhesive 224 may be the same as or similar to those discussed above with respect to FIG. 31.

A carrier substrate de-bonding is performed to detach (or "de-bond") the carrier substrate 202 from the backside interconnect structure 140. In some embodiments, the de-bonding includes projecting a light, such as a laser light or a UV light on the release layer 204 so that the release layer 204 decomposes under the heat of the light and the carrier substrate 202 can be removed. Surfaces of the passivation layer 139 and the redistribution layer 138 may be exposed after removing the carrier substrate 202 and the release layer 204.

The interposer die 320 may be attached to the device die 200 through hybrid bonding or the like. The interposer die 320 may comprise an interposer substrate 322, a bonding layer 324, a passivation layer 326, electrically conductive vias 327, and thermally conductive vias 325. The interposer substrate 322 may include a semiconductor substrate, such as silicon, doped or un-doped, or an active layer of a semiconductor-on-insulator (SOI) substrate. The interposer substrate 322 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AnInAs, AlGaAs, GaInAs, GaInP, and/or GaInAsP; or combinations thereof. Other substrates, such as multi-layered or gradient substrates, may also be used. The interposer substrate 322 may be free from active devices and may provide interconnections between the backside interconnect structure 140 external devices. The interposer substrate 322 may include optional passive devices.

The bonding layer 324 may be formed over the interposer substrate 322 using, for example, CVD, ALD, PVD, thermal oxidation, or the like. In some embodiments, the bonding layer 324 comprises silicon oxide (e.g., a high-density plasma (HDP) oxide, or the like). Other suitable materials may be used for the bonding layer 324. The passivation layer 326 may include polymers such as PBO, polyimide, BCB, or the like. In some embodiments, the passivation layer 326 may include non-organic dielectric materials such as silicon oxide, silicon nitride, silicon carbide, silicon oxynitride, or the like. The passivation layer 326 may be deposited by, for example, CVD, PVD, ALD, or the like.

The interposer substrate 322 may include the electrically conductive vias 327 and the thermally conductive vias 325 (sometimes referred to as through silicon vias or through substrate vias (TSVs)), and may further include metallization layers (not separately illustrated). The metallization layers may be designed to connect various devices to form functional circuitry. The metallization layers may be formed of alternating layers of dielectric materials (e.g., low-k dielectric materials) and conductive materials (e.g., copper), with vias interconnecting the layers of conductive materials. The electrically conductive vias 327, the thermally conductive vias 325, and the metallization layers may be formed through any suitable processes (such as deposition, damascene, dual damascene, or the like).

The electrically conductive vias 327 may be electrically coupled to active devices of the device layer 109 through the backside interconnect structure 140. The thermally conductive vias 325 may be dummy features, which are not electrically coupled to the active devices of the device layer 109 through the backside interconnect structure 140. The thermally conductive vias 325 may be thermally coupled to dummy features of the backside interconnection structure 140. For example, FIG. 45B illustrates a detailed view of bonding between thermally conductive features 328 in the backside interconnect structure 140 and the thermally conductive vias 325 in the interposer die 320 in a region 321 of FIG. 45A. The thermally conductive features 328 may be formed of materials and by methods the same as or similar to the conductive features 136 and the redistribution layer 138, discussed above with respect to FIGS. 27A through 27C. The thermally conductive features 328 may be dummy features, which are not electrically coupled to the active devices of the device layer 109. In some embodiments, the thermally conductive vias 325 and the thermally conductive features 328 may be electrically floating. Providing the thermally conductive vias 325 and the thermally conductive features 328 in the interposer die 320 and the backside interconnect structure 140, respectively, improves heat dissipation from the device die 200 through the backside interconnect structure 140 and the interposer die 320. This improves device performance and reduces device defects caused by heat generated in the device die 200. The thermally conductive features 328 are optional and may be omitted in some embodiments, as illustrated in FIG. 45A.

In some embodiments, the interposer die 320 may be bonded to the device die 200 through hybrid bonding. For example, the bonding layer 324 of the interposer die 320 may be directly bonded to the passivation layer 139 of the device die 200, and the electrically conductive vias 327 and the thermally conductive vias 325 of the interposer die 320 may be directly bonded to the redistribution layer 138 and the thermally conductive features 328 of the device die 200. In an embodiment, the bond between the bonding layer 324 and the passivation layer 139 may be an oxide-to-oxide bond, or the like. The hybrid bonding process further directly bonds the electrically conductive vias 327 and the thermally conductive vias 325 to the redistribution layer 138 and the thermally conductive features 328, respectively, through direct metal-to-metal bonding. Thus, electrical connections and thermal connections between the interposer die 320 and the device die 200 are provided by the physical connection of the electrically conductive vias 327 and the thermally conductive vias 325 to the redistribution layer 138 and the thermally conductive features 328, respectively. The device die 200, the support die 310, and the interposer die 320 collectively form a die structure 302. The direct thermal connections between the thermally conductive vias 325 and the thermally conductive features 328 further improve heat dissipation from the device die 200 through the backside interconnect structure 140 and the interposer die 320. This improves device performance and reduces device defects caused by heat generated in the device die 200.

As an example, the hybrid bonding process may start by applying a surface treatment to the bonding layer 324 of the interposer die 320 and/or the passivation layer 139 of the device die 200. The surface treatment may include a plasma treatment. The plasma treatment may be performed in a vacuum environment. After the plasma treatment, the surface treatment may further include a cleaning process (e.g., a rinse with deionized water or the like) that may be applied to the bonding layer 324 and/or the passivation layer 139. The hybrid bonding process may then proceed to aligning the electrically conductive vias 327 and the thermally conductive vias 325 to the redistribution layer 138 and the thermally conductive features 328. Next, the hybrid bonding includes a pre-bonding step, during which the electrically conductive vias 327 and the thermally conductive vias 325 are brought into physical contact with the redistribution layer 138 and the thermally conductive features 328, respectively. The pre-bonding may be performed at room temperature (e.g., between about 21° C. and about 25° C.). The hybrid bonding process continues with performing an anneal at a temperature ranging from about 150° C. to about 400° C. for a duration ranging from about 0.5 hours to about 3 hours. The anneal causes the metal of the electrically conductive vias 327 and the thermally conductive vias 325 (e.g., copper) and the metal of the redistribution layer 138 and the thermally conductive features 328 (e.g., copper) to inter-diffuse with each other, forming the direct metal-to-metal bonding. The anneal may further form covalent bonds between the bonding layer 324 and the passivation layer 139. In some embodiments, other bonding parameters and/or methods (e.g., solder bonding) may be used.

The vias 226 are formed on the release layer 222 and extending away from the carrier substrate 220. As an example to form the vias 226, a seed layer (not separately illustrated) is formed over the release layer 222. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the vias 226.

Figure 46:
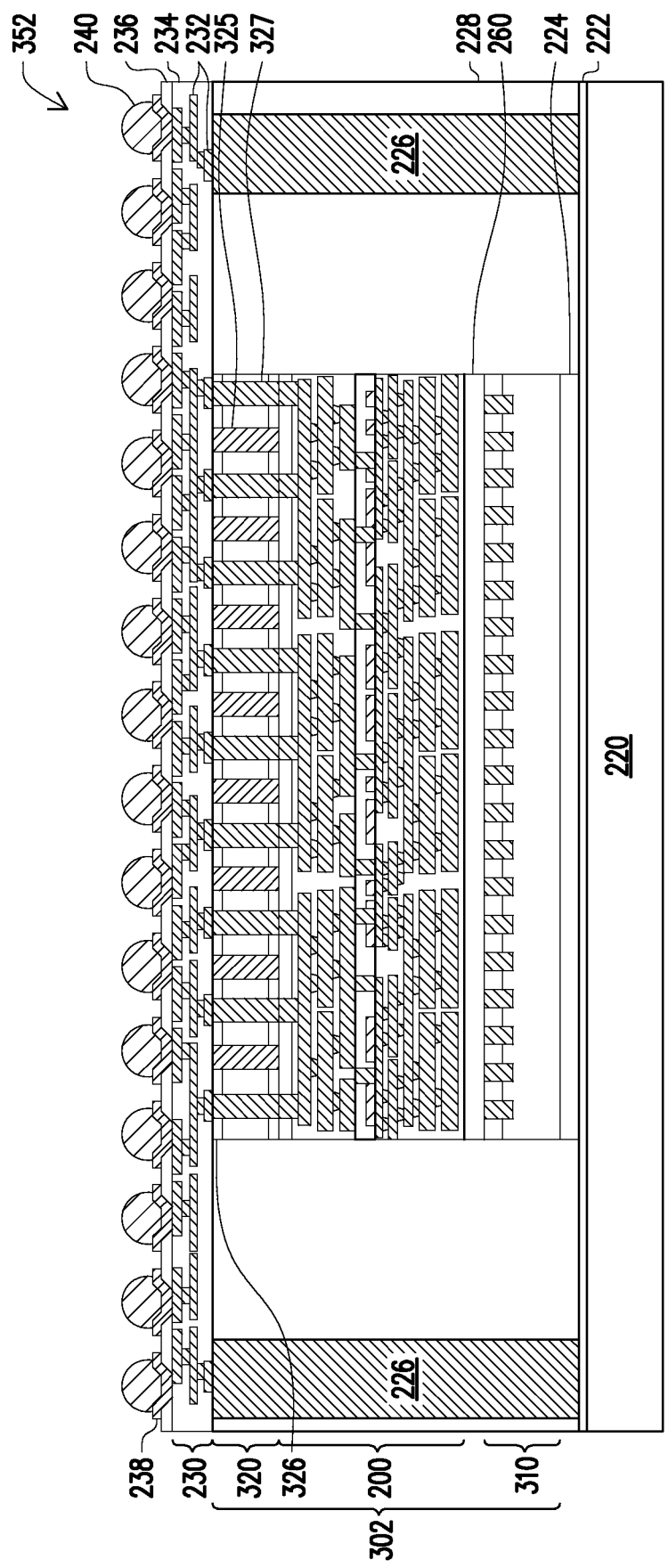

In FIG. 46, an encapsulant 228 is formed on the die structure 302, the carrier substrate 220, and the vias 226 and around the die structure 302 and the vias 226; a redistribution structure 230 is formed over the encapsulant 228, the vias 226, and the die structure 302; and a passivation layer 236, UBMs 238, and conductive connectors 240 are formed over the redistribution structure 230. The encapsulant 228 may be formed of materials and by methods the same as or similar to those discussed above with respect to FIG. 32. The redistribution structure 230 may include stacked layers of the conductive features 232 formed in the stacked dielectric layers 234. The redistribution structure 230 may be formed of materials and by methods the same as or similar to those discussed above with respect to FIG. 33. The passivation layer 236, the UBMs 238, and the conductive connectors 240 may be formed of materials and by methods the same as or similar to those discussed above with respect to FIG. 34. The die structure 302, the encapsulant 228, the vias 226, the redistribution structure 230, the passivation layer 236, the UBMs 238, and the conductive connectors 240 collectively form a first package component 352.

Figure 47:
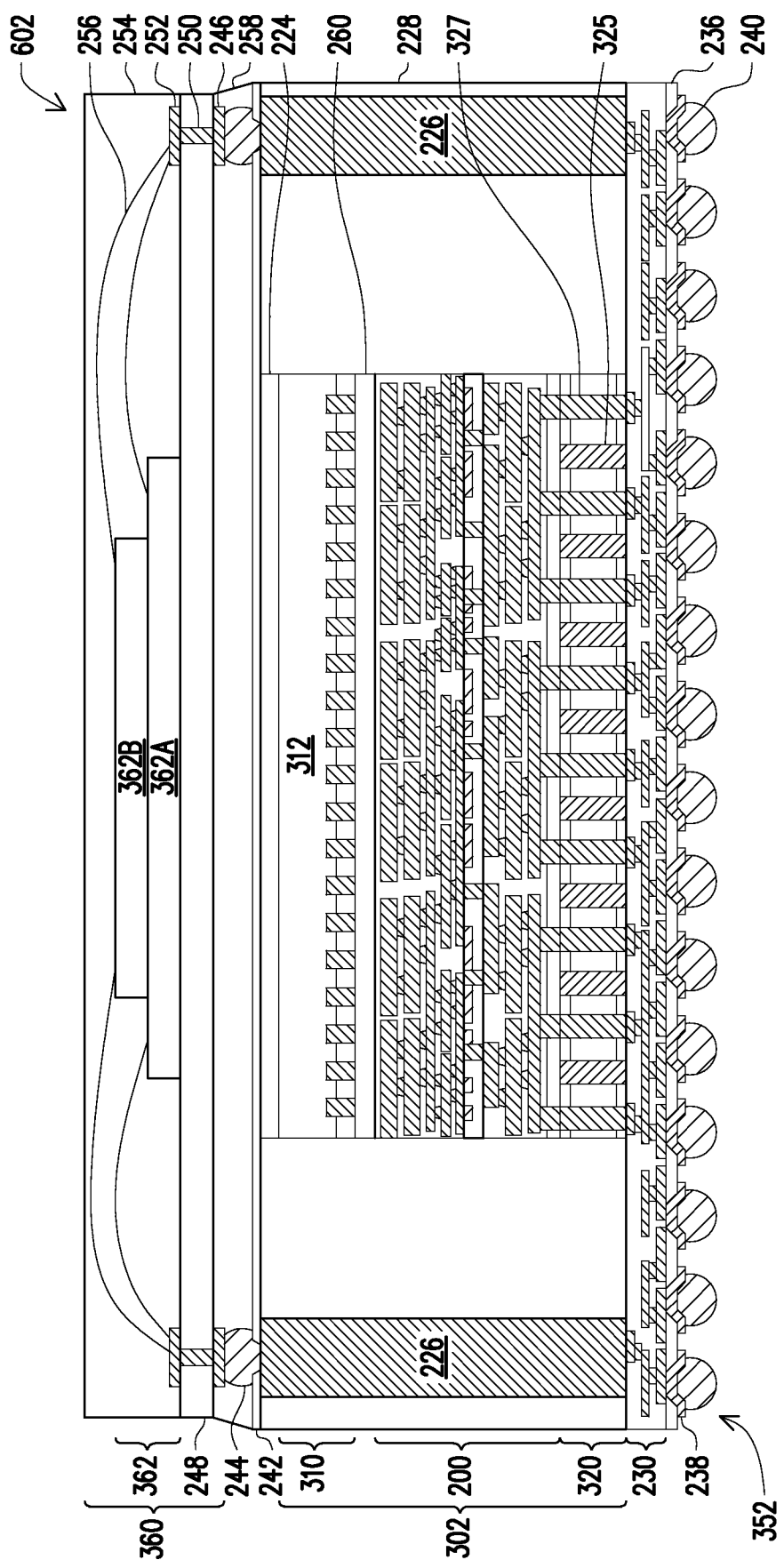

In FIG. 47, the first package component 352 is flipped; the carrier substrate 220 is removed; a passivation layer 242 is formed over the encapsulant 228, the vias 226, and the die structure 302; and a second package component 360 is coupled to the first package component 352. The processes performed in FIG. 47 are similar to or the same as those discussed above with respect to FIG. 35. The first package component 352, the second package component 360, and the intervening structures used to couple the second package component 360 to the first package component 352 (e.g., the passivation layer 242, the conductive connectors 244, the underfill 258) collectively form a packaged semiconductor device 602. The packaged semiconductor device 602 may be an integrated fan-out (InFO) package on package (PoP) structure, which may be a wafer-level package having high-density redistribution layers.

The support die 310 is a heat-dissipating structure formed on a front-side of the device die 200, and may be referred to as a front-side heat spreader. The support die 310 may be included in the packaged semiconductor device 602 of FIG. 47 to improve structural and mechanical stability of the first package component 352, while providing improved heat dissipation. The interposer die 320 is a heat-dissipating structure formed on a backside of the device die 200, and may be referred to as a backside heat spreader. The interposer die 320 provides electrical interconnections and improves heat dissipation. This improves device performance and reduces device defects caused by heat generated in the device die 200.

Figure 48A:
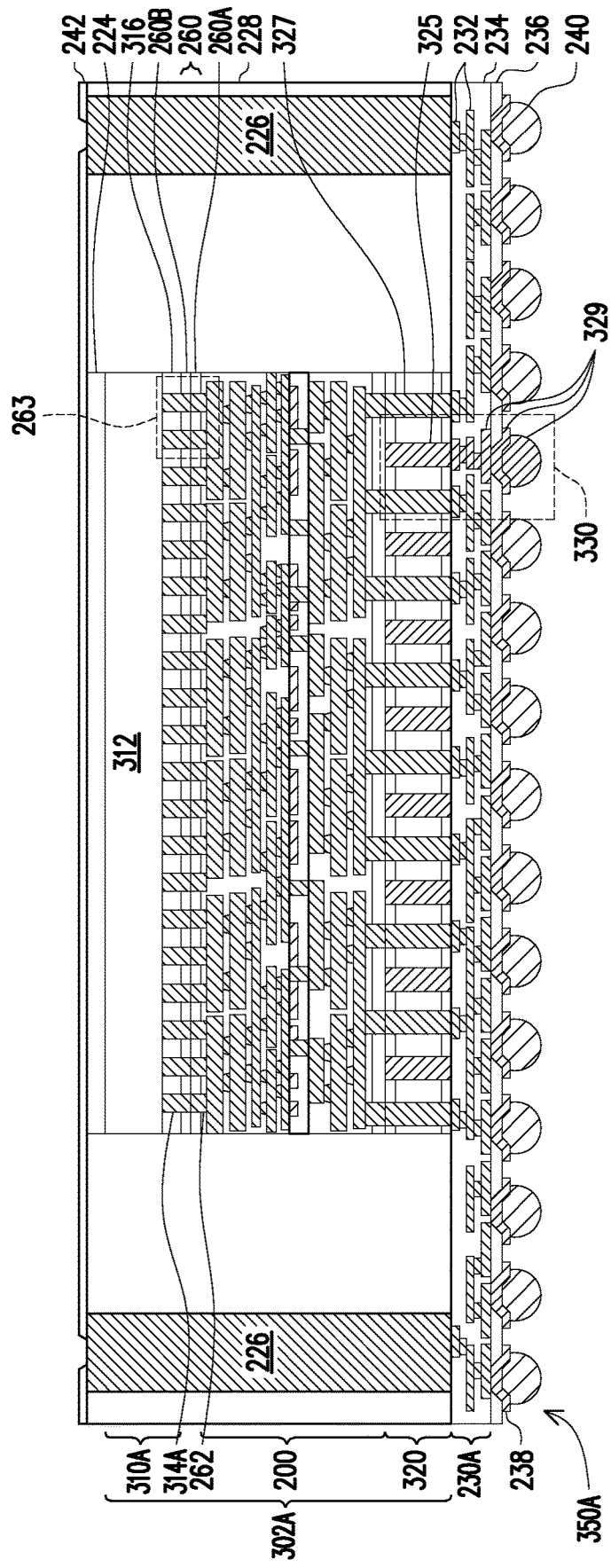
Figures 48B, 48C:
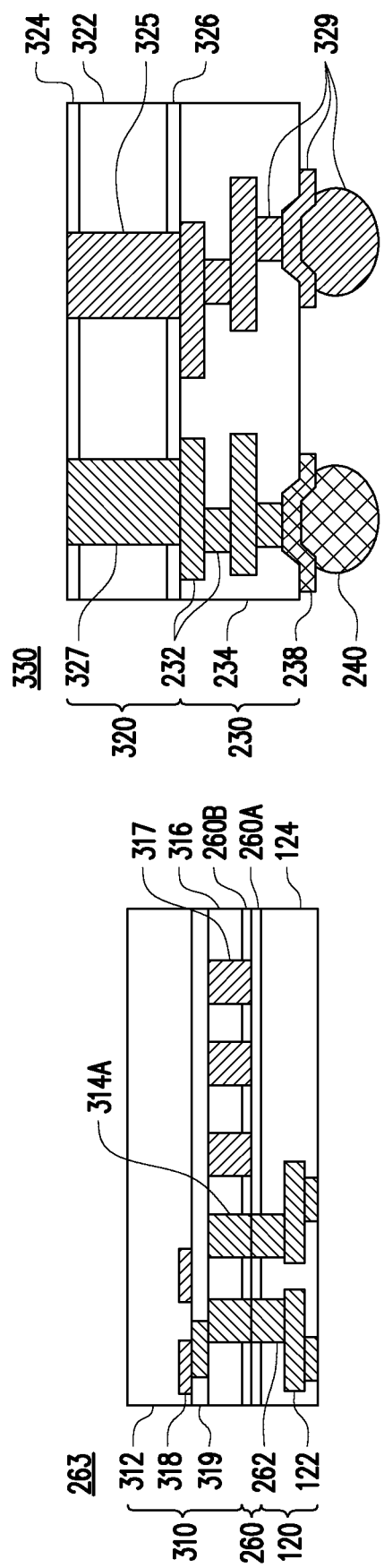

FIGS. 48A through 48C illustrate alternate configurations for bonding a support die 310A to a device die 200 and for providing a heat dissipation path from the device die 200 through an interposer die 320 and a redistribution structure 230A. In FIGS. 48A and 48B, the support die 310A includes devices 318 formed on a support substrate 312; metallization layers 319 on the devices 318 and the support substrate 312; a dielectric layer 316 over the metallization layers 319; a second bonding layer 260B over the dielectric layer 316; and conductive features 314A and thermally conductive features 317 extending through the second bonding layer 260B and the dielectric layer 316. FIG. 48B illustrates a detailed view of a region 263 of FIG. 48A. The support die 310A is attached to the device die 200 through hybrid bonding or the like. The device die 200, the support die 310A, and the interposer die 320A collectively form a die structure 302A. The die structure 302A, the encapsulant 228, the vias 226, the redistribution structure 230A, the passivation layer 236, the UBMs 238, and the conductive connectors 240 collectively form a first package component 352A.

The devices 318 may include active and/or passive devices. A wide variety of devices, such as transistors, capacitors, resistors, combinations of these, and the like, may be used to generate the structural and functional requirements of the design for the die structure 302A. The devices may be formed using any suitable methods. The support die 310A may also include metallization layers 319. The metallization layers 319 may be formed over the devices 318 and are designed to connect the devices 318 to form functional circuitry. The metallization layers 319 may be formed of alternating layers of dielectric materials (e.g., low-k dielectric materials) and conductive materials (e.g., copper) with vias interconnecting the layers of conductive materials. The metallization layers 319 may be formed through any suitable process (such as deposition, damascene, dual damascene, or the like).

The dielectric layer 316 and the second bonding layer 260B may be the same as or similar to those discussed above with respect to FIGS. 44A and 44B. The conductive features 314A and the thermally conductive features 317 may be formed of materials and by methods the same as or similar to those used to form the conductive features 314, discussed above with respect to FIGS. 44A and 44B, except that the conductive features 314A and the thermally conductive features 317 are formed after forming the second bonding layer 260B and extend through the second bonding layer 260B and the dielectric layer 316. The conductive features 314A may provide electrical connections between the devices 318 of the support die 310A and the device die 200. The conductive features 314A may be electrically coupled to the conductive features 122 of the front-side interconnect structure 120 and the metallization layers 319. The thermally conductive features 317 may be dummy features, which are thermally conductive and are not electrically coupled to the devices 318 or active devices of the device die 200. In some embodiments, the thermally conductive features 317 may be electrically floating. The thermally conductive features 317 may be formed in the support die 310A to improve heat dissipation from the device die 200 to the support die 310A. This improves device performance and reduces device defects caused by heat generated in the device die 200.

The front-side interconnect structure 120 of the device die 200 further includes conductive features 262, which are bonded to the conductive features 314A. The conductive features 262 may be formed of materials and by methods the same as or similar to those used to form the conductive features 314, discussed above with respect to FIGS. 44A and 44B. The conductive features 262 may be formed extending through the first bonding layer 260A and the topmost dielectric layer 124 of the front-side interconnect structure 120. The conductive features 262 may provide electrical connections between the devices 318 of the support die 310A and the device die 200. The conductive features 262 may be electrically coupled to the conductive features 122 of the front-side interconnect structure 120 and the conductive features 314A.

The support die 310A may be bonded to the front-side interconnect structure 120 of the device die 200 through hybrid bonding, which may be a process similar to or the same as the hybrid bonding process described above with respect to FIGS. 45A and 45B. Specifically, dielectric-to-dielectric bonds, such as oxide-to-oxide bonds, may be formed between the second bonding layer 260B and the first bonding layer 260A. Metal-to-metal bonds may be formed between the conductive features 314A and the conductive features 262. Direct thermal connections between the conductive features 314A and the conductive features 262 further improve heat dissipation from the device die 200 through the front-side interconnect structure 120 and the support die 310A. This improves device performance and reduces device defects caused by heat generated in the device die 200.

Further in FIGS. 48A and 48C, a heat dissipation path is provided from the device die 200 through the interposer die 320 and the redistribution structure 230A. FIG. 48C illustrates a detailed view of a region 330 of FIG. 48A. As illustrated in FIGS. 48A and 48C, the redistribution structure 230A includes thermally conductive features 329. The thermally conductive features 329 may comprise one or more of the UBMs 238 and the conductive connectors 240. The thermally conductive features 329 in the redistribution structure 230A may be the same as or similar to the conductive features 232, discussed above with respect to FIG. 33. The thermally conductive features 329 that comprise the UBMs 238 and the conductive connectors 240 may be the same as or similar to the UBMs 238 and the conductive connectors 240, discussed above with respect to FIG. 34. The thermally conductive features 329 may be dummy features, which are thermally conductive and are not electrically coupled to active devices of the device die 200. In some embodiments, the thermally conductive features 329 may be electrically floating. The thermally conductive features 329 may be thermally coupled with the thermally conductive vias 325 to provide a heat dissipation path through the interposer die 320 and the redistribution structure 230A to an exterior of a packaged semiconductor device. Thus the thermally conductive features 329 further improve heat dissipation from the device die 200 through the backside interconnect structure 140, the interposer die 320, and the redistribution structure 230A. This improves device performance and reduces device defects caused by heat generated in the device die 200.

FIGS. 49 through 58 illustrate embodiments in which heat-dissipating structures include a support die 210 attached to a front-side interconnect structure 120 of a device die 200, thermally conductive features 507 or thermally conductive features 513 attached to side surfaces of the device die 200, and thermally conductive vias 141 or thermally conductive features 510 formed through portions of the device die 200. The support die 210 is an example of a front-side heat spreader, which dissipates heat generated in the device die 200 (e.g., a device die including nano-FETs manufactured according to the processes of FIGS. 2 through 27C). The thermally conductive features 507/513 are examples of lateral heat spreaders, which dissipate heat generated in the device die 200. The thermally conductive vias 141/thermally conductive features 510 are examples of thermally conductive dummy features, which dissipate heat generated in the device die 200. Providing the support die 210, the thermally conductive features 507/513, and the thermally conductive vias 141/thermally conductive features 510 improves heat dissipation from the device die 200. This improves device performance and reduces device defects caused by heat generated in the device die 200.

Figure 49:
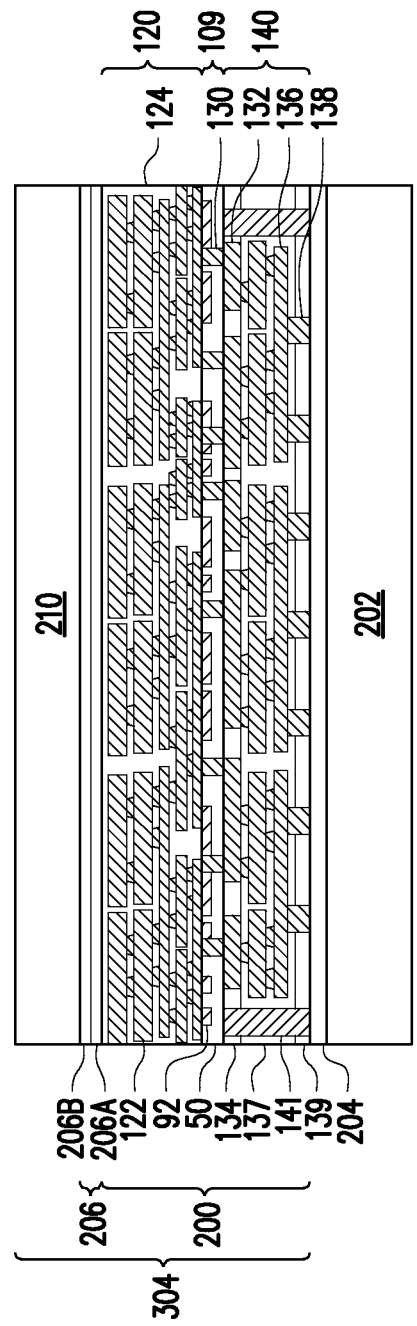

FIG. 49 illustrates a structure similar to FIG. 29, except that thermally conductive vias 141 are formed extending through the backside interconnect structure 140 and the isolation layer 208 is omitted. More specifically, the structure of FIG. 49 includes a device die 200 attached to a carrier substrate 202 by a release layer 204 and a support die 210 attached to the device die 200 by bonding layers 206. Although the support die 210 is illustrated as being attached to the device die 200 through bonding layers 206, in some embodiments, the support die 210 may be replaced by a support die 310, which may be attached to the device die 200 through materials and methods similar to or the same as those discussed with respect to FIGS. 44A, 44B, 48A, and 48B. The device die 200, the support die 210, and the thermally conductive cap 212 collectively form a die structure 304.

The thermally conductive vias 141 may be formed extending through the passivation layer 139, the dielectric layers 137, and the dielectric layer 134. The thermally conductive vias 141 may be dummy features, which are not electrically coupled to the active devices of the device layer 109. In some embodiments, the thermally conductive vias 141 may be electrically floating. The thermally conductive vias 141 may be formed by etching openings extending through the passivation layer 139, the dielectric layers 137, and the dielectric layer 134, and filling the openings with a thermally conductive material. The thermally conductive vias 141 may each comprise one or more layers, such as barrier layers, diffusion layers, and conductive fill materials. For example, in some embodiments, the thermally conductive vias 141 each include a barrier layer and a conductive fill material. The barrier layer may include titanium, titanium nitride, tantalum, tantalum nitride, or the like. The conductive fill material may be copper, a copper alloy, silver, gold, tungsten, cobalt, aluminum, nickel, or the like. A planarization process, such as a CMP, may be performed to remove excess portions of the thermally conductive vias 141, which excess portions are over top surfaces of the passivation layer 139. The thermally conductive vias 141 provide a heat dissipation path away from the device layer 109 of the device die 200, which improves heat dissipation from the device die 200. This improves device performance and reduces device defects caused by heat generated in the device die 200.

Figure 50A:
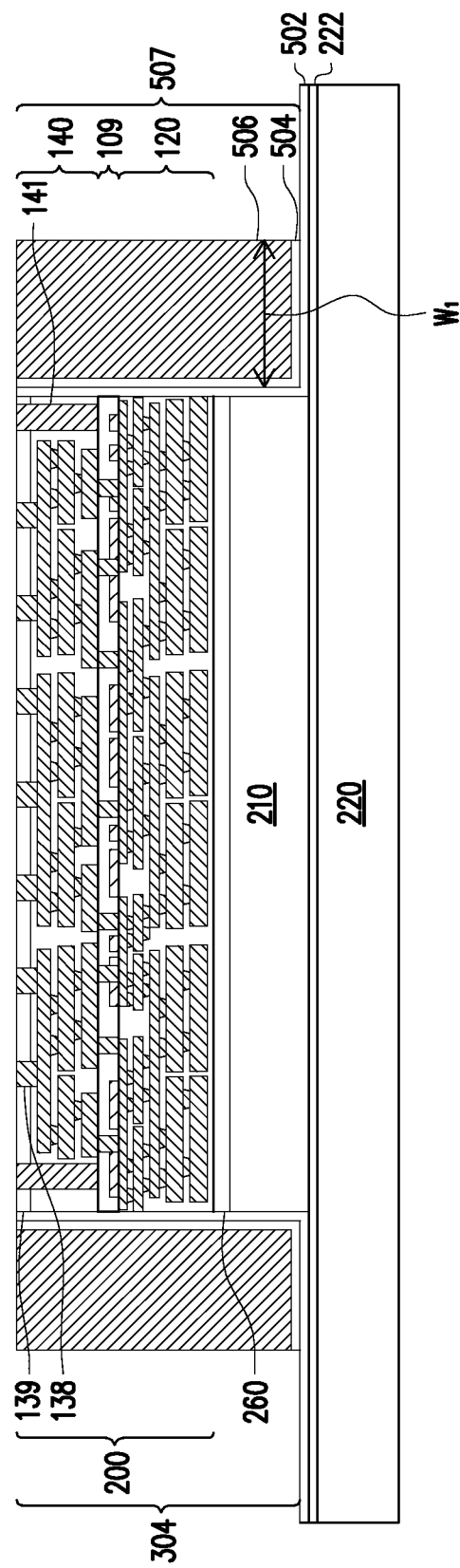
Figure 50C:
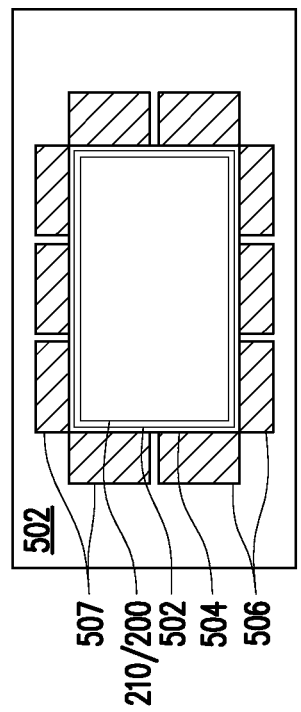
Figure 50B:
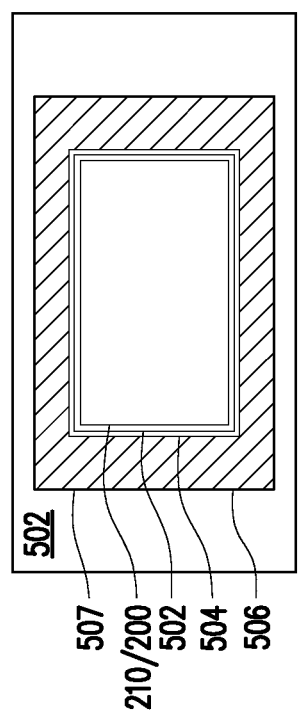

In FIGS. 50A through 50C, the die structure 304 is flipped, attached to a carrier substrate 220, the carrier substrate 202 is removed, and thermally conductive features 507 are formed over the carrier substrate 220 adjacent the die structure 304. The backside interconnect structure 140 of the die structure 304 may be attached to the carrier substrate 220 through a release layer 222 attached to the carrier substrate 220. The carrier substrate 220 and the release layer 222 may be the same as or similar to those discussed above with respect to FIG. 31. The carrier substrate 202 may be removed from the device die 200 by a process the same as or similar to the process discussed with respect to FIG. 31.

A passivation layer 502 is formed over the carrier substrate 220 and the die structure 304. The passivation layer 502 may include polymers such as PBO, polyimide, BCB, or the like. In some embodiments, the passivation layer 502 may include non-organic dielectric materials such as silicon oxide, silicon nitride, silicon carbide, silicon oxynitride, or the like. The passivation layer 502 may include high thermal conductivity materials, such as aluminum nitride (AlN). The passivation layer 502 may be deposited by, for example, CVD, PVD, ALD, or the like. The passivation layer 502 may be deposited by a conformal deposition process, and may extend along horizontal top surfaces of the release layer 222 and the die structure 304 and vertical side surfaces of the die structure 304.

The thermally conductive features 507 are formed on the passivation layer 502 adjacent the die structure 304. As an example to form the thermally conductive features 507, a seed layer 504 is formed over the passivation layer 502. In some embodiments, the seed layer 504 is a metal layer, which may be a single layer or a composite layer comprising a plurality of sub-layers formed of different materials. In a particular embodiment, the seed layer 504 comprises a titanium layer and a copper layer over the titanium layer. The seed layer 504 may be formed using, for example, PVD or the like. A photoresist (not separately illustrated) is formed and patterned on the seed layer 504. The photoresist may be formed by spin coating or the like and may be exposed to light for patterning. The pattern of the photoresist corresponds to the thermally conductive features 507. The patterning forms openings through the photoresist to expose the seed layer 504. A conductive material 506 is formed in the openings of the photoresist and on the exposed portions of the seed layer 504. The conductive material 506 may be formed by plating, such as electroplating or electroless plating, or the like. The conductive material 506 may comprise a metal, like copper, titanium, tungsten, aluminum, or the like. The photoresist and portions of the seed layer 504 on which the conductive material 506 is not formed are removed. The photoresist may be removed by an acceptable ashing or stripping process, such as using an oxygen plasma or the like. Once the photoresist is removed, exposed portions of the seed layer 504 are removed, such as by using an acceptable etching process, such as by wet or dry etching. The remaining portions of the seed layer 504 and conductive material 506 form the thermally conductive features 507. A planarization process, such as a CMP, may be performed to remove excess portions of the passivation layer 502, the seed layer 504, and the conductive material 506, which excess portions are over top surfaces of the die structure 304. As such, top surfaces of the passivation layer 502, the seed layer 504, and the conductive material 506 may be level with top surfaces of the die structure 304 (e.g., top surfaces of the passivation layer 139, the redistribution layer 138, and the thermally conductive vias 141). The thermally conductive features 507 may be formed with widths $W_1$ perpendicular to side surfaces of the die structure 304 ranging from about 1 μm to about 100 μm. This provides improved heat dissipation through the thermally conductive features 507, without the thermally conductive features 507 extending into keep-out zones between the die structure 304 and subsequently formed vias (such as the vias 226, discussed below with respect to FIG. 51.

FIGS. 50B and 50C illustrate top-down views of various embodiments of the thermally conductive features 507. As illustrated in FIG. 50B, the thermally conductive features 507 may be continuous structures, which surround side surfaces of the die structure 304. This provides improved heat dissipation through the thermally conductive features 507. In the embodiment illustrated in FIG. 50C, the thermally conductive features 507 are separated into segments. As will be discussed in detail below, an encapsulant (such as the encapsulant 228, discussed below with respect to FIG. 51) may be formed between adjacent segments of the thermally conductive features 507. Forming the thermally conductive features 507 in segments reduces costs and reduces stress caused by a CTE mismatch between the thermally conductive features 507 and the encapsulant, which reduces package warpage, reduces device defects, and improves device performance. The thermally conductive features 507 formed in segments also provide improved heat dissipation. This improves device performance and reduces device defects caused by heat generated in the device die 200.

Figure 51:
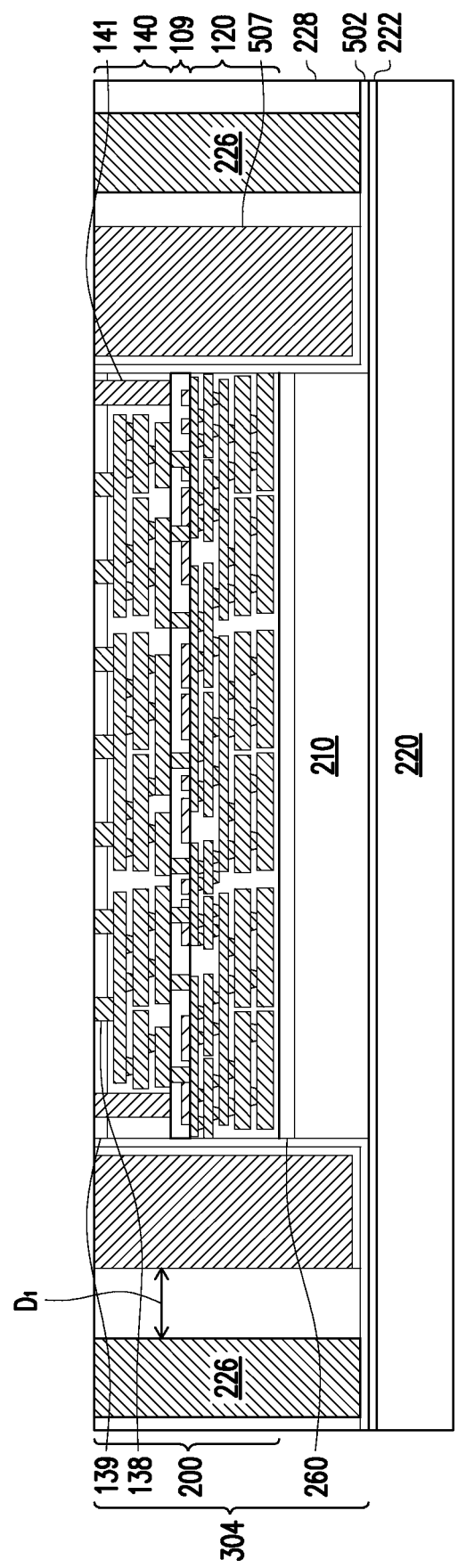

In FIG. 51, vias 226 are formed on the carrier substrate 220 and an encapsulant 228 is formed on the carrier substrate 220, the vias 226, and the die structure 304 and around the vias 226 and the die structure 304. The vias 226 and the encapsulant 228 may be formed of materials and by processes the same as or similar to those discussed above with respect to FIGS. 31 and 32. The vias 226 may be separated from the thermally conductive features 507 by a distance $D_1$ perpendicular to side surfaces of the die structure 304 (referred to as a keep-out zone) ranging from about 1 μm to about 10 μm or greater than about 1 μm. This ensures sufficient isolation of the vias 226 and the thermally conductive features 507, which improves device performance and reduces device defects. After the vias 226 and the encapsulant 228 are formed, a planarization process is performed on the encapsulant 228 to expose the vias 226, the thermally conductive features 507, and the die structure 304. The planarization process may also remove material of the vias 226, the redistribution layer 138, the thermally conductive vias 141, the thermally conductive features 507, and/or the passivation layer 139 until the redistribution layer 138, the thermally conductive vias 141, the thermally conductive features 507, and the vias 226 are exposed. Top surfaces of the vias 226, the redistribution layer 138, the thermally conductive vias 141, the passivation layer 139, the thermally conductive features 507, and the encapsulant 228 are substantially coplanar after the planarization process within process variations. The planarization process may be, for example, a CMP, a grinding process, or the like. In some embodiments, the planarization may be omitted, for example, if the vias 226, the thermally conductive vias 141, the thermally conductive features 507, and/or the redistribution layer 138 are already exposed.

Figure 52:
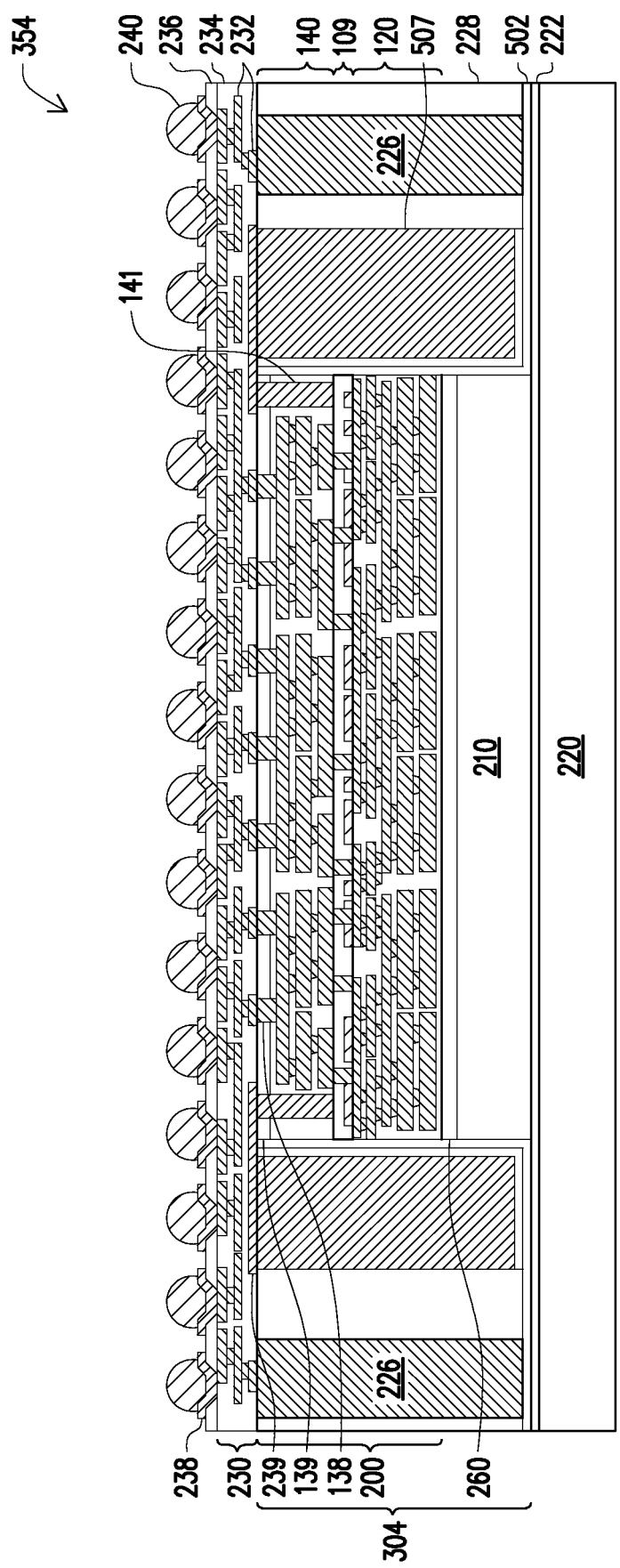

In FIG. 52, a redistribution structure 230 is formed over the encapsulant 228, the vias 226, and the die structure 304 and a passivation layer 236, UBMs 238, and conductive connectors 240 are formed over the redistribution structure 230. The redistribution structure 230 may be similar to the front-side interconnect structure 120 and the backside interconnect structure 140. For example, the redistribution structure 230 may be formed of materials and by processes the same as or similar to those of the front-side interconnect structure 120 and the backside interconnect structure 140. The redistribution structure 230 may include stacked layers of conductive features 232 formed in stacked dielectric layers 234. The redistribution structure 230 may further include thermally conductive features 239 formed in the stacked dielectric layers 234. The conductive features 232 may include conductive lines (e.g., for routing to and from subsequently formed contact pads and conductive connectors). The conductive features 232 may include conductive vias that extend in the dielectric layers 234 to provide vertical interconnection between stacked layers of the conductive lines. The conductive features 232 may include one or more embedded passive devices, such as resistors, capacitors, inductors, or the like. The embedded passive devices may be integrated with the die structure 304 to provide circuits.

The thermally conductive features 239 thermally couple the thermally conductive vias 141 with the thermally conductive features 507. The thermally conductive features 239 may include conductive lines (e.g., for routing between the thermally conductive vias 141 and the thermally conductive features 507). The thermally conductive features 239 may include conductive vias that extend in the dielectric layers 234 to provide vertical interconnection between stacked layers of the conductive lines. The thermally conductive features 507 may be thermally coupled to the device die 200 through the thermally conductive features 239 and the thermally conductive vias 141, and each of the thermally conductive features 507, the thermally conductive features 239, and the thermally conductive vias 141 may be electrically isolated from the device die 200. In some embodiments, the thermally conductive features 507, the thermally conductive features 239, and the thermally conductive vias 141 may be electrically floating. Providing the thermally conductive features 239 improves heat dissipation from the device layer 109 of the device die 200 through the thermally conductive vias 141 to the thermally conductive features 507, which improves heat dissipation. This improves device performance and reduces device defects caused by heat generated in the device die 200.

The passivation layer 236, the UBMs 238, and the conductive connectors 240 may be formed of materials and by methods the same as or similar to those discussed above with respect to FIG. 34. The die structure 304, the thermally conductive features 507, the passivation layer 502, the encapsulant 228, the vias 226, the redistribution structure 230, the passivation layer 236, the UBMs 238, and the conductive connectors 240 collectively form a first package component 354.

Figure 53:
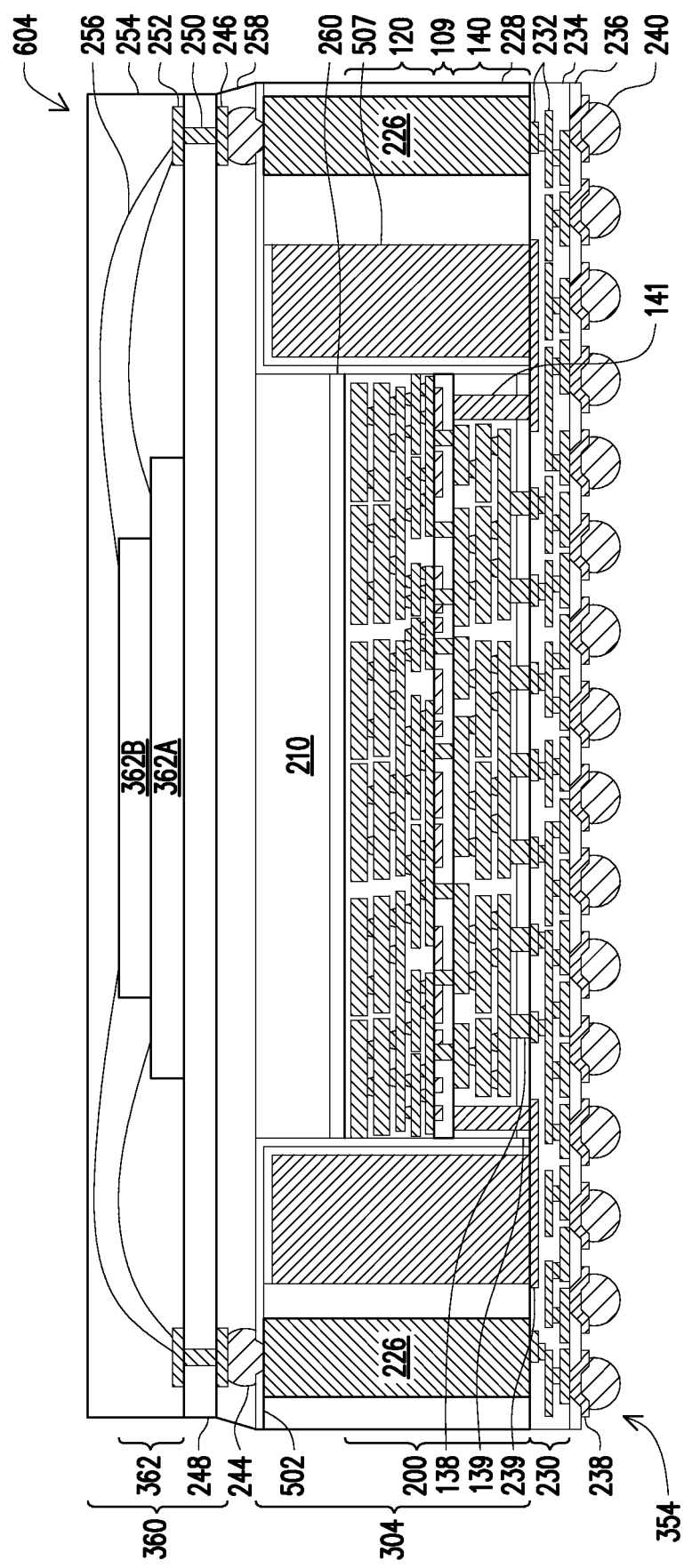

In FIG. 53, the first package component 354 is flipped; the carrier substrate 220 is removed; and the second package component 360 is coupled to the first package component 354. The processes performed in FIG. 53 are similar to or the same as those discussed above with respect to FIG. 35. The first package component 354, the second package component 360, and the intervening structures used to couple the second package component 360 to the first package component 354 (e.g., the passivation layer 242, the conductive connectors 244, the underfill 258) collectively form a packaged semiconductor device 604.

The thermally conductive features 507 are heat-dissipating structures formed on side surfaces of the die structure 304, which may be referred to as lateral heat spreaders. The thermally conductive vias 141 and the thermally conductive features 239 are heat-dissipating structures which provide a heat dissipation path from the device layer 109 of the device die 200 to the thermally conductive features 507, and which may be referred to as thermally conductive dummy features. The thermally conductive features 507, the thermally conductive vias 141, and the thermally conductive features 239 may be included in the packaged semiconductor device 604 of FIG. 53 to improve heat dissipation from active devices of the device die 200. This improves device performance and reduces device defects caused by heat generated in the device die 200.

Figure 54:
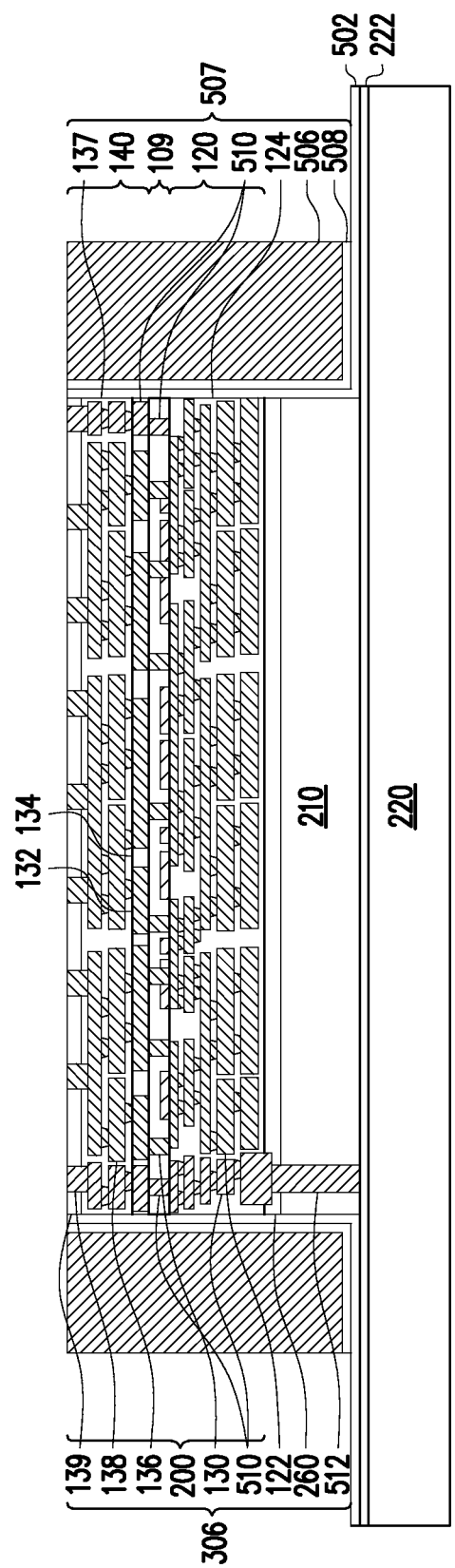

FIG. 54 illustrates an embodiment in which the seed layer 504 of the thermally conductive features 507 discussed above with respect to FIGS. 50A through 53 is replaced with a thermal interface material 508, and heat dissipation paths are provided in the support die 210 and the device die 200. The heat dissipation paths may be provided from the device layer 109 through the front-side interconnect structure 120 and the support die 210, and from the device layer 109 through the backside interconnect structure 140. The device die 200, the support die 210, and the thermally conductive cap 212 collectively form a die structure 306. As illustrated in FIG. 54, the front-side interconnect structure 120, the device layer 109, and the backside interconnect structure 140 include thermally conductive features 510, and the support die 210 includes a thermally conductive via 512. The thermally conductive features 510 in the front-side interconnect structure 120, the device layer 109, and the backside interconnect structure 140 may be the same as or similar to the conductive features 122, the backside vias 130, the conductive lines 132, the conductive features 136, and the redistribution layer 138, discussed above with respect to FIGS. 21A through 27C.

The support die 210 illustrated in FIG. 54 includes the thermally conductive via 512 (sometimes referred to as through silicon vias or through substrate vias (TSVs)), and may further include metallization layers (not separately illustrated). The metallization layers may be designed to provide heat dissipation paths through the support die 210. The metallization layers may be formed of alternating layers of dielectric materials (e.g., low-k dielectric materials) and conductive materials (e.g., copper), with vias interconnecting the layers of conductive materials. The thermally conductive via 512 and the metallization layers may be formed through any suitable processes (such as deposition, damascene, dual damascene, or the like).

The thermally conductive features 510 and the thermally conductive via 512 may be dummy features, which are thermally conductive and are not electrically coupled to active devices of the device die 200. In other words, the thermally conductive features 510 and the thermally conductive via 512 are thermally coupled with and electrically isolated from active devices of the device die 200. In some embodiments, the thermally conductive features 510 and the thermally conductive via 512 may be electrically floating. The thermally conductive features 510 and the thermally conductive via 512 provide heat dissipation paths through both the front-side interconnect structure 120 and the backside interconnect structure 140 towards an exterior of a packaged semiconductor device. Thus, the thermally conductive features 510 and the thermally conductive via 512 improve heat dissipation from the device die 200. This improves device performance and reduces device defects caused by heat generated in the device die 200.

The seed layer 504 of the thermally conductive features 507 discussed above with respect to FIGS. 50A through 53 is replaced with a thermal interface material 508 in FIG. 54. As such, the thermally conductive features 507 include the conductive material 506 and the thermal interface material 508. The passivation layer 502 may be formed of materials and by processes the same as or similar to those discussed above with respect to FIGS. 50A through 50C. The thermal interface material 508 is then applied on the passivation layer 502. The thermal interface material 508 may include, but is not limited to, thermal grease, phase change material, a metal filled polymer matrix, other polymeric materials, a solder paste, solder alloys of lead, tin, indium, silver, copper, bismuth, combinations thereof, or the like. The thermal interface material 508 may be used in order to adhere the conductive material 506 to the underlying structures. In such embodiments, the conductive material 506 may be formed separately and may be attached to the thermal interface material 508. The conductive material 506 may be formed of a high thermal conductivity material, such as a metal including as copper, steel, iron, nickel, silver, gold, tungsten, aluminum, cobalt, tungsten, ruthenium, combinations thereof, or the like.

The conductive material 506 may provide mechanical reinforcement for the die structure 306, may prevent warpage of the die structure 306, and may provide improved heat dissipation for the die structure 306. This improves device performance and reduces device defects caused by heat generated in the device die 200. Attaching the conductive material 506 through the thermal interface material 508 reduces stress caused by a CTE mismatch between the conductive material 506 and the die structure 306, which reduces package warpage, reduces device defects, and improves device performance.

Figure 55:
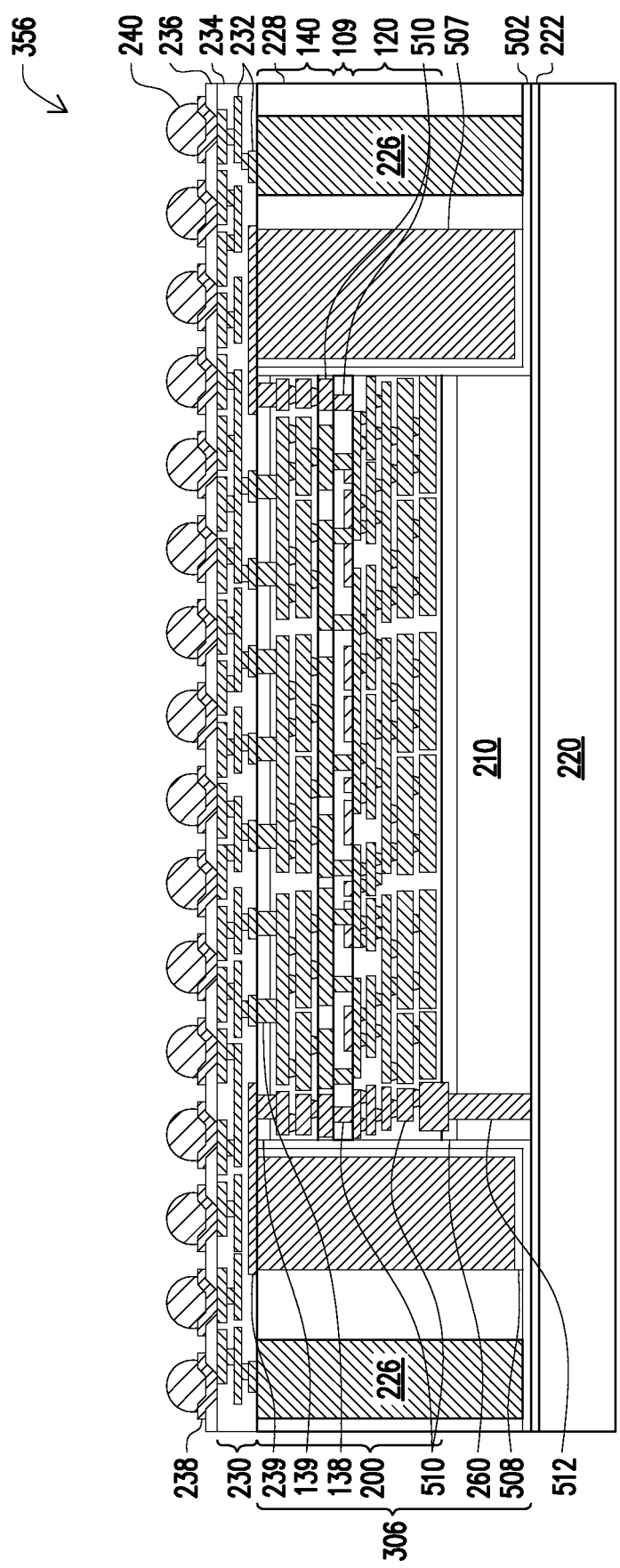

In FIG. 55, vias 226 are formed on the carrier substrate 220; an encapsulant 228 is formed on the carrier substrate 220, the vias 226, the thermally conductive features 507, and the die structure 306 and around the vias 226 and the thermally conductive features 507; a redistribution structure 230 is formed over the encapsulant 228, the vias 226, the thermally conductive features 507, and the die structure 300; and a passivation layer 236, UBMs 238, and conductive connectors 240 are formed over the redistribution structure 230. The vias 226 and the encapsulant 228 may be formed of materials and by processes the same as or similar to those discussed above with respect to FIGS. 31, 32, and 51. After the vias 226 and the encapsulant 228 are formed, a planarization process is performed on the encapsulant 228 to expose the vias 226, the thermally conductive features 507 and the die structure 300. The planarization process may also remove material of the vias 226, the thermally conductive features 507, the thermally conductive features 510, the redistribution layer 138, and/or the passivation layer 139 until the redistribution layer 138, the thermally conductive features 507, the thermally conductive features 510, and the vias 226 are exposed. Top surfaces of the vias 226, the redistribution layer 138, the thermally conductive features 510, the passivation layer 139, the thermally conductive features 507, and the encapsulant 228 are substantially coplanar after the planarization process within process variations. The planarization process may be, for example, a CMP, a grinding process, or the like. In some embodiments, the planarization may be omitted, for example, if the vias 226, the thermally conductive features 507, the thermally conductive features 510, and/or the redistribution layer 138 are already exposed.

The redistribution structure 230 may be similar to the front-side interconnect structure 120 and the backside interconnect structure 140. For example, the redistribution structure 230 may be formed of materials and by processes the same as or similar to those of the front-side interconnect structure 120 and the backside interconnect structure 140. The redistribution structure 230 may include stacked layers of conductive features 232 formed in stacked dielectric layers 234. The redistribution structure 230 may further include thermally conductive features 239 formed in the stacked dielectric layers 234. The conductive features 232 may include conductive lines (e.g., for routing to and from subsequently formed contact pads and conductive connectors). The conductive features 232 may include conductive vias that extend in the dielectric layers 234 to provide vertical interconnection between stacked layers of the conductive lines. The conductive features 232 may include one or more embedded passive devices, such as resistors, capacitors, inductors, or the like. The embedded passive devices may be integrated with the die structure 300 to provide circuits.

The thermally conductive features 239 thermally couple the thermally conductive features 510 with the thermally conductive features 507. The thermally conductive features 239 may include conductive lines (e.g., for routing between the thermally conductive features 510 and the thermally conductive features 507). The thermally conductive features 239 may include conductive vias that extend in the dielectric layers 234 to provide vertical interconnection between stacked layers of the conductive lines. The thermally conductive features 507 may be thermally coupled to the device die 200 through the thermally conductive features 239 and the thermally conductive features 510, and each of the thermally conductive features 507, the thermally conductive features 239, and the thermally conductive features 510 may be electrically isolated from the device die 200. In some embodiments, the thermally conductive features 507, the thermally conductive features 239, and the thermally conductive features 510 may be electrically floating. Providing the thermally conductive features 239 improves heat dissipation from the device layer 109 of the device die 200 through the thermally conductive features 510 to the thermally conductive features 507, which improves heat dissipation. This improves device performance and reduces device defects caused by heat generated in the device die 200.

The passivation layer 236, the UBMs 238, and the conductive connectors 240 may be formed of materials and by methods the same as or similar to those discussed above with respect to FIGS. 34 and 52. The die structure 300, the thermally conductive features 507, the passivation layer 502, the encapsulant 228, the vias 226, the redistribution structure 230, the passivation layer 236, the UBMs 238, and the conductive connectors 240 collectively form a first package component 356.

Figure 56:
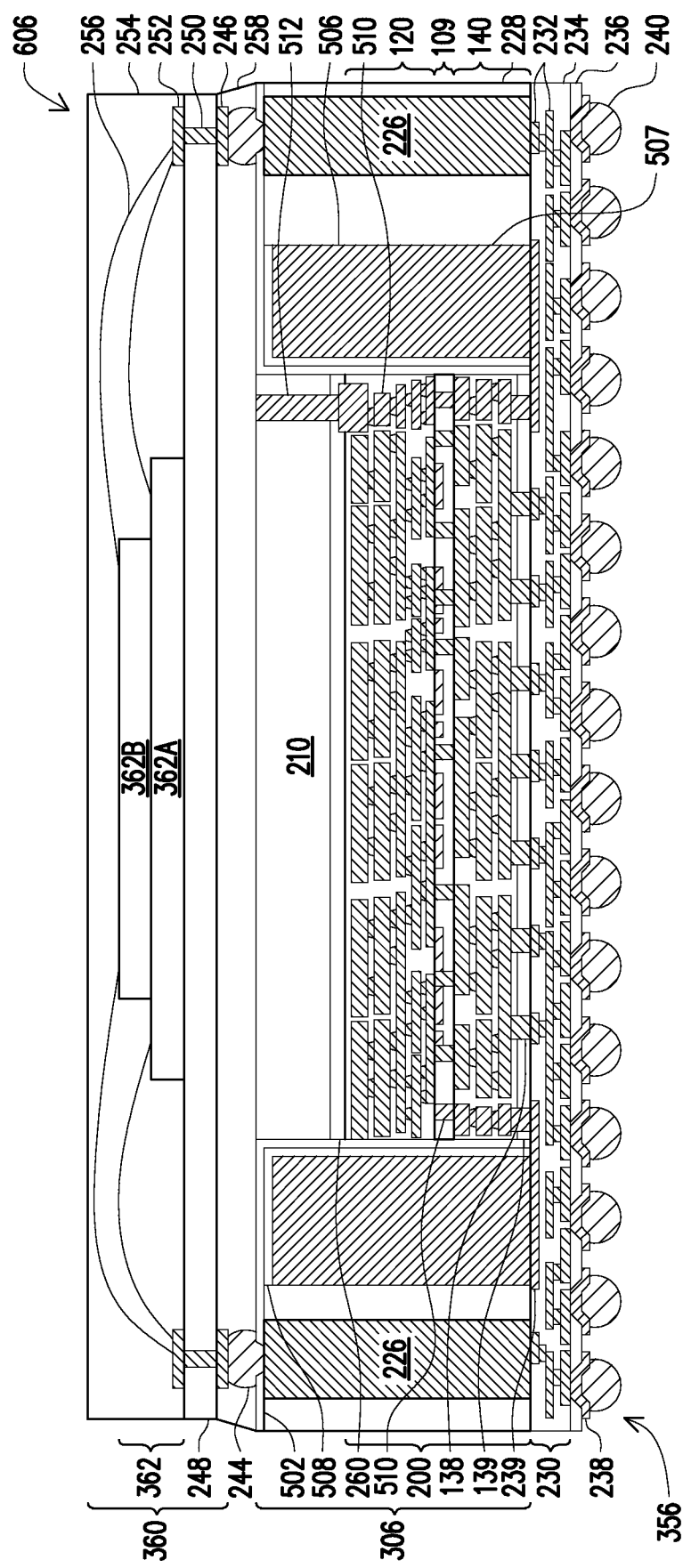

In FIG. 56, the first package component 356 is flipped; the carrier substrate 220 is removed; and a second package component 360 is coupled to the first package component 356. The processes performed in FIG. 53 are similar to or the same as those discussed above with respect to FIGS. 35 and 53. The first package component 356, the second package component 360, and the intervening structures used to couple the second package component 360 to the first package component 356 (e.g., the passivation layer 242, the conductive connectors 244, the underfill 258) collectively form a packaged semiconductor device 606.

The thermally conductive features 507 are heat-dissipating structures formed on side surfaces of the die structure 300, and may be referred to as lateral heat spreaders. The thermally conductive vias 512 and the thermally conductive features 510 are heat-dissipating structures, which provide a heat dissipation path from the device layer 109 of the device die 200 to the thermally conductive features 507 and through the support die 210, and may be referred to as thermally conductive dummy features. The support die 210 is a heat-dissipating structure formed on a front-side of the device die 200, which may be referred to as a front-side heat spreader. The thermally conductive features 507, the thermally conductive vias 512, the thermally conductive features 510, the support die 210, and the thermally conductive features 239 may be included in the packaged semiconductor device 606 of FIG. 56 to improve heat dissipation from active devices of the device die 200. This improves device performance and reduces device defects caused by heat generated in the device die 200. The support die 210 may also improve structural and mechanical stability of the first package component 356.

Figure 57:
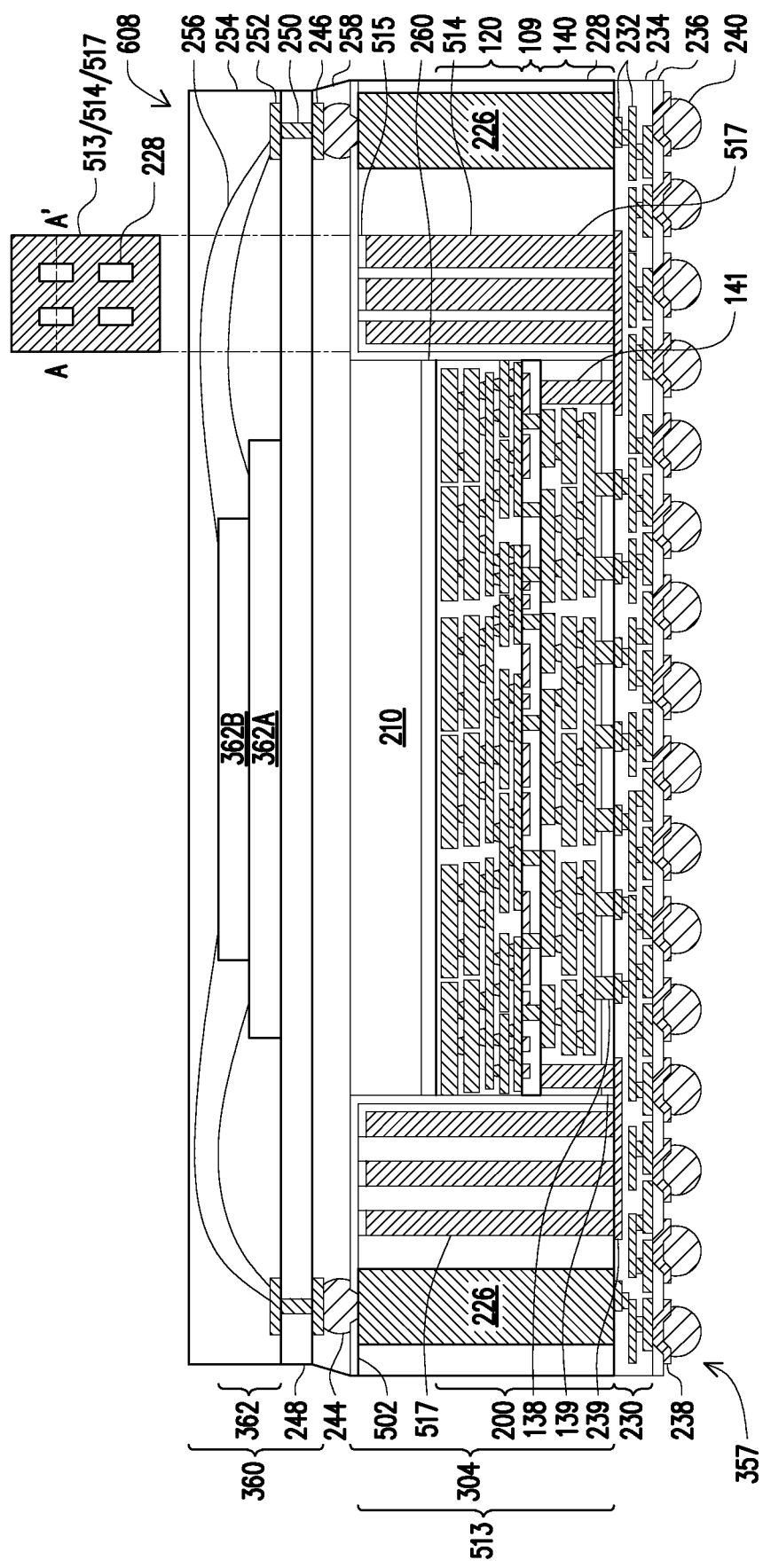
Figure 58:
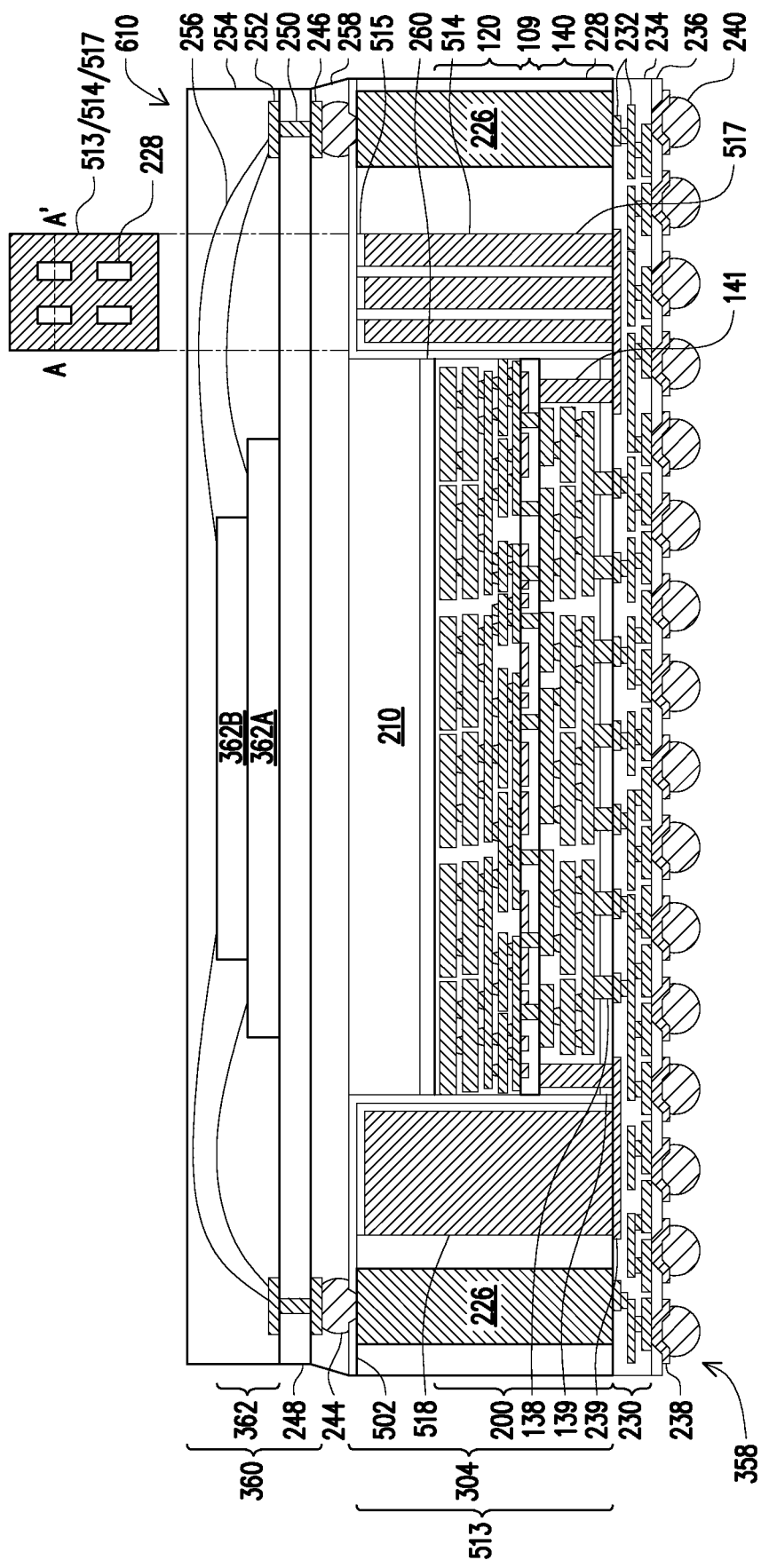

In FIGS. 57 and 58, the thermally conductive features 507 of FIG. 53 are replaced by thermally conductive features 513, which are formed to include mesh portions 517 and/or solid portions 518. FIGS. 57 and 58 illustrate top-down views of the mesh portions 517 of the thermally conductive features 513, with side views of the structure being taken along reference line A-A' illustrated in the top-down views. The thermally conductive features 513 include a seed layer 515 on the passivation layer 502 and a conductive material 514 on the seed layer 515. The seed layer 515 and the conductive material 514 may be formed of materials and by processes the same as or similar to those of the seed layer 504 and the conductive material 506, respectively, discussed above with respect to FIGS. 50A through 50C. The photoresist used to pattern the seed layer 515 and the conductive material 514 is patterned to form the mesh portions 517 and/or the solid portions 518 of the thermally conductive features 513.

As illustrated in FIG. 57, the thermally conductive features 513 may include mesh portions 517 formed on opposite sides of the die structure 304. The mesh portions 517 may be formed throughout the thermally conductive features 513 surrounding the die structure 304, such as in portions of the thermally conductive features 513 along all four sides of the die structure 304. The die structure 304, the thermally conductive features 513, the passivation layer 502, the encapsulant 228, the vias 226, the redistribution structure 230, the passivation layer 236, the UBMs 238, and the conductive connectors 240 collectively form a first package component 357. The first package component 357, the second package component 360, and the intervening structures used to couple the second package component 360 to the first package component 357 (e.g., the passivation layer 242, the conductive connectors 244, the underfill 258) collectively form a packaged semiconductor device 608.

As illustrated in FIG. 58, portions of the thermally conductive features 513 may include the mesh portions 517 (e.g., on the right side of the die structure 304), and portions of the thermally conductive features 513 may include solid portions 518 (e.g., on the left side of the die structure 304). The mesh portions 517 and the solid portions 518 may be formed in any desired portions of the thermally conductive features 513. The die structure 304, the thermally conductive features 513, the passivation layer 502, the encapsulant 228, the vias 226, the redistribution structure 230, the passivation layer 236, the UBMs 238, and the conductive connectors 240 collectively form a first package component 358. The first package component 358, the second package component 360, and the intervening structures used to couple the second package component 360 to the first package component 358 (e.g., the passivation layer 242, the conductive connectors 244, the underfill 258) collectively form a packaged semiconductor device 610.

In some embodiments, such as the embodiments illustrated in FIGS. 57 and 58, the thermally conductive features 513 may be segmented, as described above with respect to FIG. 50C, or the seed layer 515 of the thermally conductive features 513 may be replaced with a thermal interface material, as described above with respect to FIGS. 54 through 56. Gaps in the mesh portions 517 of the thermally conductive features 513 may be filled with the encapsulant 228. Forming the thermally conductive features 513 including the mesh portions 517 and filling the gaps in the mesh portions 517 with the encapsulant 228 reduces CTE mismatch stress between the thermally conductive features 513 and the encapsulant 228, which reduces package warpage, reduces device defects, and improves device performance. Moreover, including the thermally conductive features 513 improves heat dissipation from active devices of the device die 200. This improves device performance and reduces device defects caused by heat generated in the device die 200.

Figure 59A:
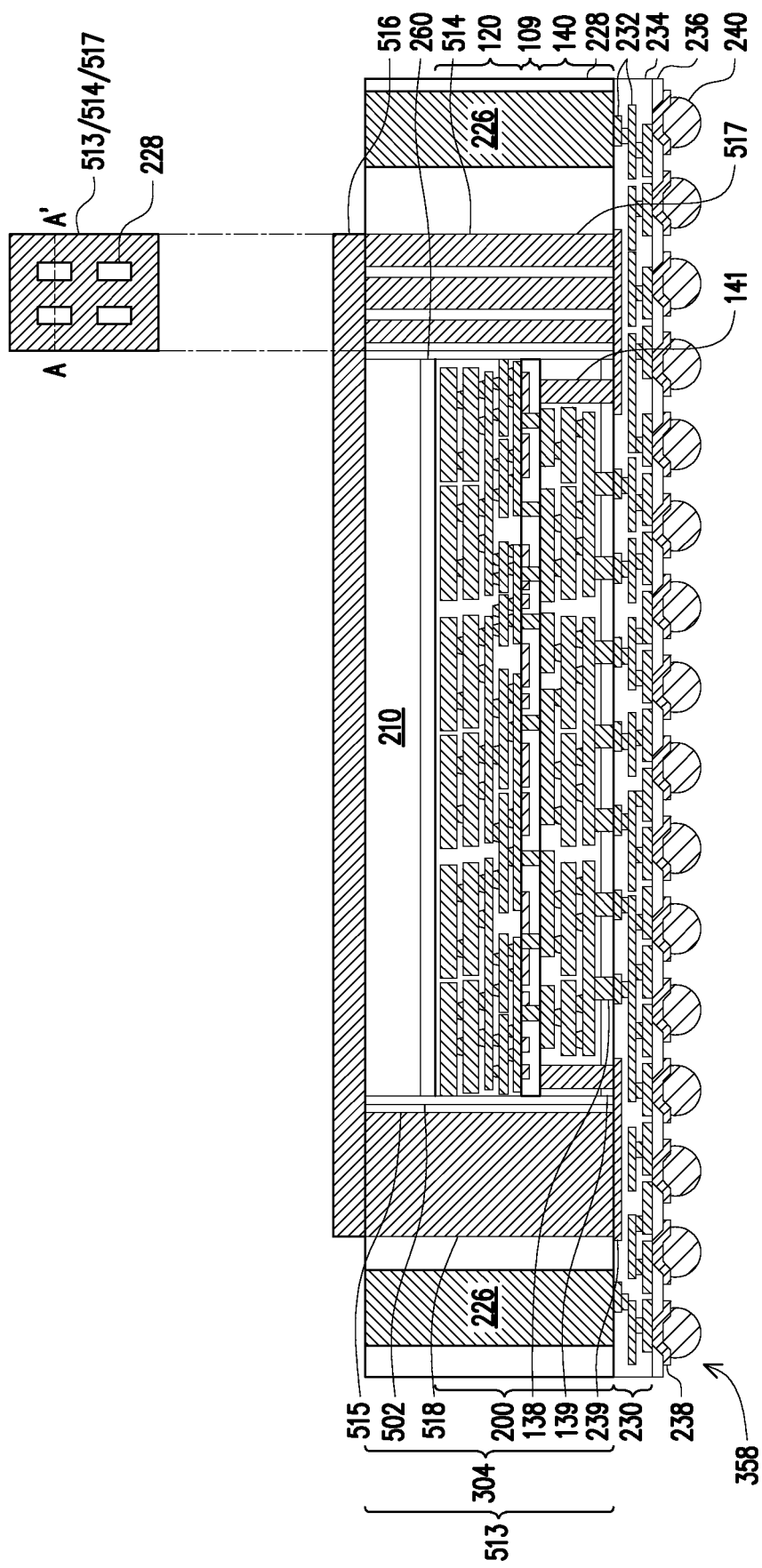
Figure 59C:
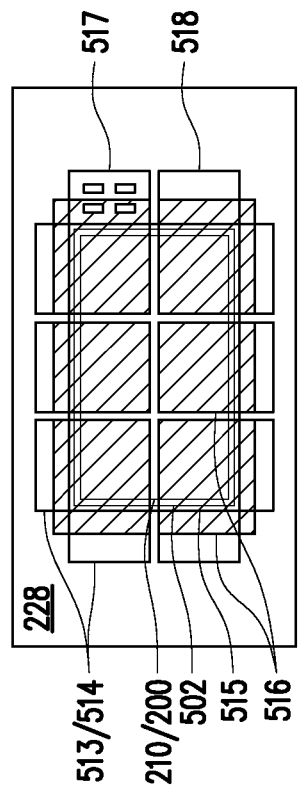
Figure 59B:
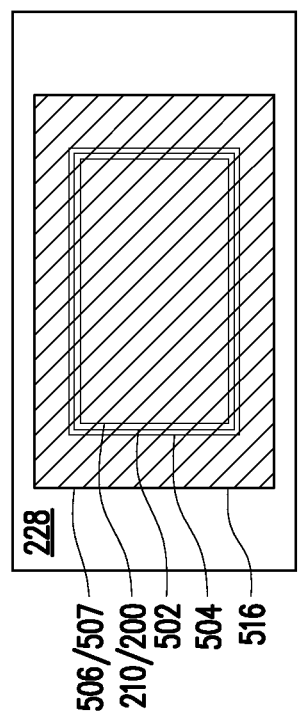
Figure 60:
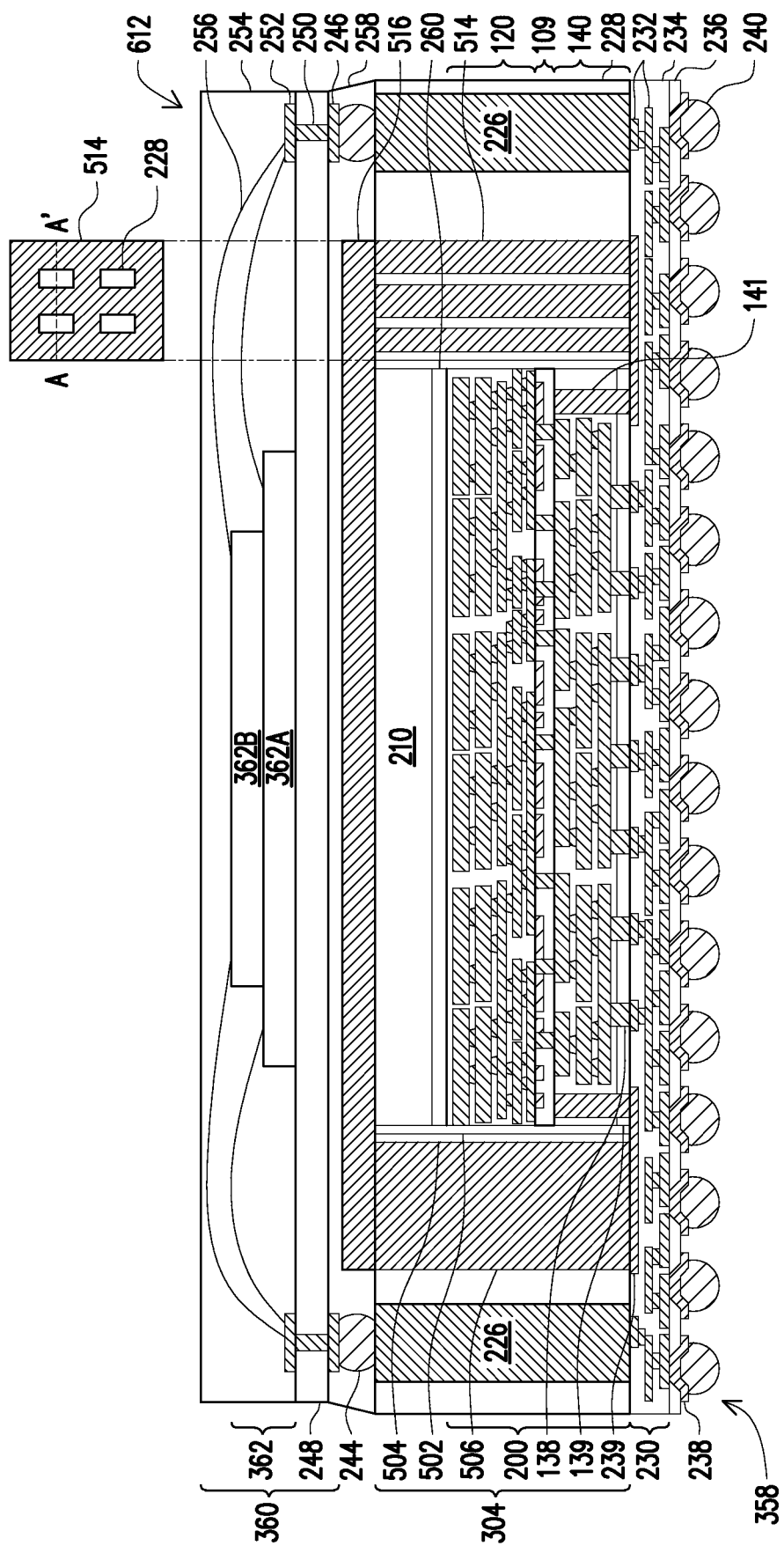

FIGS. 59A through 60 illustrate an embodiment in which heat-dissipating structures include a support die 210 attached to a front-side interconnect structure 120 of a device die 200, thermally conductive features 507 or thermally conductive features 513 attached to side surfaces of the device die 200, thermally conductive vias 141 formed in a backside interconnect structure 140 of the device die 200, and a thermally conductive cap is 516 is formed on the thermally conductive features 507/513 and the support die 210. The support die 210 is an example of a front-side heat spreader, which dissipates heat generated in the device die 200 (e.g., a device die including nano-FETs manufactured according to the processes of FIGS. 2 through 27C). The thermally conductive features 507/513 are examples of lateral heat spreaders, which dissipate heat generated in the device die 200. The thermally conductive vias 141 are examples of thermally conductive dummy features, which dissipate heat generated in the device die 200. The thermally conductive cap 516 is an example of a conductive cap heat spreader, which dissipate heat generated in the device die 200. Providing the support die 210, the thermally conductive features 507/513, the thermally conductive vias 141, and the thermally conductive cap 516 improves heat dissipation from the device die 200. This improves device performance and reduces device defects caused by heat generated in the device die 200.

FIG. 59A illustrates the structure of FIG. 58 after the redistribution structure 230, the passivation layer 236, the UBMs 238, and the conductive connectors 240 are formed; the first package component 358 is flipped; and the carrier substrate 220 is removed. In FIG. 59A a planarization process is performed and a thermally conductive cap 516 is formed over the thermally conductive features 513 and the support die 210. The planarization process may be performed on the vias 226, the encapsulant 228, the passivation layer 502, the thermally conductive features 513, and the support die 210. Top surfaces of the vias 226, the encapsulant 228, the passivation layer 502, the thermally conductive features 513, and the support die 210 are substantially coplanar after the planarization process, within process variations. The planarization process may be, for example, a CMP, a grinding process, or the like.

The thermally conductive cap 516 may be formed of materials and by processes similar to the thermally conductive cap 212, discussed above with respect to FIG. 30. For example, the thermally conductive cap 516 may be formed by depositing a seed layer (not separately illustrated) over the vias 226, the encapsulant 228, the conductive features 513, the passivation layer 502, and the support die 210. A photoresist is formed and patterned on the seed layer. A conductive material is formed in openings of the photoresist on exposed portions of the seed layer. The photoresist and portions of the seed layer on which the conductive material is not formed are removed. The remaining portions of the conductive material and the seed layer form the thermally conductive cap 516. The thermally conductive cap 516 may be thermally coupled to the thermally conductive features 513 and the support die 210. In some embodiments, the thermally conductive cap 516 may be electrically floating. Providing the thermally conductive cap 516 improves heat dissipation from the device die 200. This improves device performance and reduces device defects caused by heat generated in the device die 200.

FIGS. 59B and 59C illustrate top-down views of the structure of FIG. 59A, in accordance with some embodiments. Specifically, FIGS. 59B and 59C illustrate top-down views of the encapsulant 228, the thermally conductive cap 516, the thermally conductive features 507/513, the passivation layer 502, the device die 200, and the support die 210. Certain features, such as the vias 226, have been omitted in FIGS. 59B and 59C for clarity and ease of illustration. In FIG. 59B, thermally conductive features 507 the same as or similar to those discussed above with respect to FIG. 51 are formed in the encapsulant 228 and the thermally conductive cap 516 comprises a single continuous feature. As illustrated in FIG. 59B, side surfaces of the thermally conductive cap 516 may be aligned with side surfaces of the thermally conductive features 507. The thermally conductive cap 516 may cover an area including the thermally conductive features 507, the passivation layer 502, the device die 200, and the support die 210. Providing the thermally conductive features 507 surrounding the support die 210 and the device die 200 and the thermally conductive cap 516 as a single continuous feature improves the heat dissipation through the thermally conductive features 507 and the thermally conductive cap 516. This improves device performance and reduces device defects caused by heat generated in the device die 200.

In FIG. 59C, the thermally conductive features 513 discussed with respect to FIG. 59A are provided, and the thermally conductive cap 516 comprises segments separated from one another by gaps. The thermally conductive features 513 also comprise segments separated from one another by gaps. Although the thermally conductive features 513 are illustrated as including 9 solid portions 518 and a single mesh portion 517, any combination of solid portions 518 and mesh portions 517 may be included. Moreover, the thermally conductive features 513 may be continuous and may not be segmented with adjacent segments being separated by the gaps. The thermally conductive cap 516 may extend partially over the thermally conductive features 513, the encapsulant 228, the passivation layer 502, the device die 200, and the support die 210.

Forming the thermally conductive features 513 in segments reduces CTE mismatch stress between the thermally conductive features 513 and the encapsulant 228, which reduces package warpage, reduces device defects, and improves device performance. Similarly, forming the thermally conductive cap 516 in segments reduces CTE mismatch stress between the thermally conductive cap 516 and a subsequently deposited underfill material (such as the underfill 258, discussed below with respect to FIG. 60), which reduces package warpage, reduces device defects, and improves device performance. Providing the thermally conductive features 513 and the thermally conductive cap 516 improves the heat dissipation from the device die 200. This improves device performance and reduces device defects caused by heat generated in the device die 200.

In FIG. 60, a second package component 360 is coupled to the first package component 358. The processes performed in FIG. 53 are similar to or the same as those discussed above with respect to FIGS. 35, 53, and 56. As illustrated in FIG. 60, the underfill 258 may be formed to surround the thermally conductive cap 516. Although the thermally conductive cap 516 is illustrated as being separated from the substrate 248 by the underfill 258, in some embodiments, the substrate 248 may be attached to the first package component 358 in contact with the thermally conductive cap 516. The first package component 358, the second package component 360, and the intervening structures used to couple the second package component 360 to the first package component 358 (e.g., the passivation layer 242, the conductive connectors 244, the underfill 258) collectively form a packaged semiconductor device 612.

The thermally conductive features 507/513 are heat-dissipating structures formed on side surfaces of the die structure 304, and may be referred to as lateral heat spreaders. The thermally conductive vias 141 are heat-dissipating structures, which provide a heat dissipation path from the device layer 109 of the device die 200 through the backside interconnect structure 140 to the thermally conductive features 507, and may be referred to as thermally conductive dummy features. The support die 210 and the thermally conductive cap 516 are heat-dissipating structures formed on a front-side of the device die 200. The support die 210 may be referred to as a front-side heat spreader. The thermally conductive cap 516 may be referred to as a conductive cap heat spreader. The thermally conductive features 507/513, the thermally conductive vias 141, the support die 210, and the thermally conductive cap 516 may be included in the packaged semiconductor device 612 of FIG. 60 to improve heat dissipation from active devices of the device die 200. This improves device performance and reduces device defects caused by heat generated in the device die 200. The support die 210 may also improve structural and mechanical stability of the first package component 358.

Embodiments may achieve advantages. For example, including the various heat-dissipating structures discussed above helps to improve heat dissipation of the packaged semiconductor devices. The heat-dissipating structures may include front-side heat spreaders, backside heat spreaders, thermally conductive dummy features, conductive cap heat spreaders, lateral heat spreaders, or any combinations thereof. Improving the heat dissipation of packaged semiconductor devices improves device performance and reduces device defects caused by heat generated in active devices included in the packaged semiconductor devices.

In accordance with an embodiment, a semiconductor package includes a semiconductor die including a substrate, a front-side interconnect structure on a front-side of the substrate, and a backside interconnect structure on a backside of the substrate opposite the front-side interconnect structure; a support die disposed on the front-side interconnect structure; a heat-dissipating structure on the support die, the heat-dissipating structure being thermally coupled to the semiconductor die and the support die; a redistribution structure on the backside interconnect structure opposite the substrate, the redistribution structure being electrically coupled to the semiconductor die; and an encapsulant on the redistribution structure and adjacent to side surfaces of the semiconductor die, the support die, and the heat-dissipating structure. In an embodiment, the semiconductor package further includes a passivation material extending between the heat-dissipating structure and the encapsulant, the heat-dissipating structure including a metallic layer. In an embodiment, the heat-dissipating structure includes an interposer between the backside interconnect structure of the semiconductor die and the redistribution structure, the interposer including a thermally conductive via, and the thermally conductive via being electrically floating. In an embodiment, the heat-dissipating structure surrounds side surfaces of the semiconductor die and the support die in a direction perpendicular to a major surface of the support die. In an embodiment, the encapsulant physically contacts the side surfaces of the heat-dissipating structure. In an embodiment, the support die has a first thickness in a first direction perpendicular to a major surface of the support die, the heat-dissipating structure has a second thickness in the first direction, and a ratio of the second thickness to the first thickness is from 40% to 60%. In an embodiment, the heat-dissipating structure includes a plurality of segments, the encapsulant extending between adjacent segments of the plurality of segments.

In accordance with another embodiment, a packaged device includes a device die including a gate structure over a semiconductor channel; a first source/drain adjacent the gate structure and the semiconductor channel; a gate contact coupled to a surface of the gate structure facing a first direction; a front-side interconnect structure on the gate contact in the first direction, the front-side interconnect structure being coupled to the gate contact; a first source/drain contact coupled to a surface of the first source/drain facing a second direction opposite the first direction; and a backside interconnect structure on the first source/drain contact in the second direction, the backside interconnect structure being coupled to the first source/drain contact; a support die thermally coupled to the device die; and a first heat dissipation structure thermally coupled to the device die. In an embodiment, the support die includes aluminum nitride. In an embodiment, the support die is disposed on the front-side interconnect structure in the first direction, and the first heat dissipation structure is disposed on the support die in the first direction. In an embodiment, the packaged device further includes an isolation layer between the support die and the first heat dissipation structure, the isolation layer including silicon nitride. In an embodiment, the support die is disposed on the front-side interconnect structure in the first direction, the first heat dissipation structure is disposed on the backside interconnect structure in the second direction, and the first heat dissipation structure includes an interposer die. In an embodiment, the support die is disposed on side surfaces of the device die in a third direction perpendicular to the first direction and the second direction.

In an embodiment, the support die is coupled to the device die through a thermal interface material.

In accordance with yet another embodiment a method includes providing a device die, the device die including a device layer; a front-side interconnect structure on a front-side of the device layer; and a backside interconnect structure on a backside of the device layer; attaching a support die to the device die, the support die being thermally coupled to the device die; attaching a heat-dissipating structure to the device die, the heat-dissipating structure being thermally coupled to the device die; and encapsulating the device die, the support die, and the heat-dissipating structure with an encapsulant. In an embodiment, attaching the support die to the device die includes fusion bonding the support die to the front-side interconnect structure. In an embodiment, attaching the heat-dissipating structure to the device die includes hybrid bonding the heat-dissipating structure to the backside interconnect structure. In an embodiment, attaching the heat-dissipating structure to the device die includes plating the heat-dissipating structure on the support die opposite the device die. In an embodiment, attaching the heat-dissipating structure to the device die includes plating the heat-dissipating structure on side surfaces of the device die and the support die. In an embodiment, attaching the heat-dissipating structure to the device die includes plating the heat-dissipating structure on the device die, and encapsulating the heat-dissipating structure includes forming the encapsulant between adjacent portions of the heat-dissipating structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
a semiconductor die comprising a substrate, a front-side interconnect structure on a front-side of the substrate, and a backside interconnect structure on a backside of the substrate opposite the front-side interconnect structure, wherein the front-side interconnect structure and the backside interconnect structure have a same width;
a support die disposed on the front-side interconnect structure;
a heat-dissipating structure on the support die, wherein the heat-dissipating structure is thermally coupled to the semiconductor die and the support die, wherein the heat-dissipating structure is not electrically coupled to active devices, wherein the heat-dissipating structure comprises a conductive structure;
a redistribution structure on the backside interconnect structure opposite the substrate, wherein the redistribution structure is electrically coupled to the semiconductor die; and
an encapsulant on the redistribution structure and adjacent to side surfaces of the front-side interconnect structure, the substrate, the backside interconnect structure, the support die, and the heat-dissipating structure.

2. The semiconductor package of claim 1, further comprising a passivation material extending between the heat-dissipating structure and the encapsulant, wherein the heat-dissipating structure comprises a metallic layer.

3. The semiconductor package of claim 1, wherein the heat-dissipating structure comprises an interposer between the backside interconnect structure of the semiconductor die and the redistribution structure, wherein the interposer comprises a thermally conductive via, and wherein the thermally conductive via is electrically floating.

4. The semiconductor package of claim 1, wherein the heat-dissipating structure surrounds side surfaces of the semiconductor die and the support die in a direction perpendicular to a major surface of the support die.

5. The semiconductor package of claim 1, wherein the encapsulant physically contacts the side surfaces of the heat-dissipating structure.

6. The semiconductor package of claim 1, wherein the support die has a first thickness in a first direction perpendicular to a major surface of the support die, wherein the heat-dissipating structure has a second thickness in the first direction, and wherein a ratio of the second thickness to the first thickness is from 40% to 60%.

7. The semiconductor package of claim 1, wherein the heat-dissipating structure comprises a plurality of segments, wherein the encapsulant extends between adjacent segments of the plurality of segments.

8. A packaged device comprising:
a device die comprising:
a gate structure over a semiconductor channel;
a first source/drain adjacent the gate structure and the semiconductor channel;
a gate contact coupled to a surface of the gate structure facing a first direction;
a front-side interconnect structure on the gate contact in the first direction, wherein the front-side interconnect structure is coupled to the gate contact;
a first source/drain contact coupled to a surface of the first source/drain facing a second direction opposite the first direction; and
a backside interconnect structure on the first source/drain contact in the second direction, wherein the backside interconnect structure is coupled to the first source/drain contact;
a support die thermally coupled to the device die along a first line perpendicular to a major surface of the support die; and
a first heat dissipation structure thermally coupled to the device die along the first line, the first heat dissipation structure being electrically isolated from active devices of the device die.

9. The packaged device of claim 8, wherein the support die comprises aluminum nitride.

10. The packaged device of claim 8, wherein the support die is disposed on the front-side interconnect structure in the first direction, and wherein the first heat dissipation structure is disposed on the support die in the first direction.

11. The packaged device of claim 8, further comprising an isolation layer between the support die and the first heat dissipation structure, the isolation layer comprising silicon nitride.

12. The packaged device of claim 8, wherein the support die is disposed on the front-side interconnect structure in the first direction, wherein the first heat dissipation structure is disposed on the backside interconnect structure in the second direction, and wherein the first heat dissipation structure comprises an interposer die.

13. A method comprising:
providing a device die, the device die comprising:
- a device layer;
- a front-side interconnect structure on a front-side of the device layer; and
- a backside interconnect structure on a backside of the device layer;

attaching a support die to the device die, wherein the support die is thermally coupled to the device die;

attaching a heat-dissipating structure to the device die, wherein the heat-dissipating structure is thermally coupled to the device die, the heat-dissipating structure comprising a conductive element; and encapsulating the device die, the support die, and the heat-dissipating structure with an encapsulant, wherein the encapsulant comprises a single encapsulant layer extending along sidewalls of the device layer, the front-side interconnect structure, and the backside interconnect structure.

14. The method of claim 13, wherein attaching the support die to the device die comprises fusion bonding the support die to the front-side interconnect structure.

15. The method of claim 13, wherein attaching the heat-dissipating structure to the device die comprises hybrid bonding the heat-dissipating structure to the backside interconnect structure.

16. The method of claim 13, wherein attaching the heat-dissipating structure to the device die comprises plating the heat-dissipating structure on the support die opposite the device die.

17. The method of claim 13, wherein attaching the heat-dissipating structure to the device die comprises plating the heat-dissipating structure on side surfaces of the device die and the support die.

18. The method of claim 13, wherein attaching the heat-dissipating structure to the device die comprises plating the heat-dissipating structure on the device die, and wherein encapsulating the heat-dissipating structure comprises forming the encapsulant between adjacent portions of the heat-dissipating structure.

19. The packaged device of claim 12, wherein the interposer die comprises a first conductive via and a second conductive via, wherein the first conductive via is electrically coupled to active devices of the device die, wherein the second conductive via is electrically isolated from active circuitry.

20. The packaged device of claim 8, wherein the first heat dissipation structure is no wider than the device die.

* * * * *